(12) United States Patent
Seshadri et al.

(10) Patent No.: US 9,978,473 B2
(45) Date of Patent: May 22, 2018

(54) DOPING METHODS FOR HOLE INJECTION AND TRANSPORT LAYERS

(71) Applicant: NISSAN CHEMICAL INDUSTRIES, LTD., Tokyo (JP)

(72) Inventors: Venkataramanan Seshadri, Pittsburgh, PA (US); Neetu Chopra, Pittsburgh, PA (US)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 789 days.

(21) Appl. No.: 13/573,676

(22) Filed: Oct. 3, 2012

(65) Prior Publication Data

US 2013/0092887 A1    Apr. 18, 2013

Related U.S. Application Data

(60) Provisional application No. 61/542,868, filed on Oct. 4, 2011, provisional application No. 61/655,419, filed on Jun. 4, 2012.

(51) Int. Cl.

| | |
|---|---|
| *H01B 1/12* | (2006.01) |
| *H05B 33/18* | (2006.01) |
| *H01L 51/00* | (2006.01) |
| *C09K 11/06* | (2006.01) |
| *C08F 12/22* | (2006.01) |
| *C08F 12/24* | (2006.01) |
| *C08F 12/26* | (2006.01) |
| *C08F 226/06* | (2006.01) |
| *C09D 125/18* | (2006.01) |
| *H01L 51/50* | (2006.01) |

(52) U.S. Cl.
CPC .............. *H01B 1/12* (2013.01); *C08F 12/22* (2013.01); *C08F 12/24* (2013.01); *C08F 12/26* (2013.01); *C08F 226/06* (2013.01); *C09D 125/18* (2013.01); *C09K 11/06* (2013.01); *H01B 1/122* (2013.01); *H01B 1/127* (2013.01); *H01L 51/002* (2013.01); *H01L 51/008* (2013.01); *H01L 51/0059* (2013.01); *H01L 51/0082* (2013.01); *H05B 33/18* (2013.01); *C09K 2211/1416* (2013.01); *C09K 2211/1433* (2013.01); *C09K 2211/1458* (2013.01); *C09K 2211/1466* (2013.01); *C09K 2211/1483* (2013.01); *H01L 51/0081* (2013.01); *H01L 51/506* (2013.01); *Y02E 10/549* (2013.01)

(58) Field of Classification Search
CPC .......... H01B 1/12; H01B 1/122; H01B 1/127; H05B 33/18; H01L 51/002; H01L 51/0059; H01L 51/008; H01L 51/0082; H01L 31/12; H01L 31/122; H01L 31/127; C09K 11/06; C09K 2211/1416; C09K 2211/1433; C09K 2211/1458; C09K 2211/1466; C09K 2211/1483; C08F 12/22; C08F 12/24; C08F 12/26; C08F 226/06; C09D 125/18; Y02E 10/549
See application file for complete search history.

(56) References Cited

U.S. PATENT DOCUMENTS

| | | | |
|---|---|---|---|
| 2006/0175582 A1 | 8/2006 | Hammond et al. | |
| 2009/0256117 A1* | 10/2009 | Seshadri | C08G 61/126 252/500 |
| 2011/0278559 A1* | 11/2011 | Brown | C08G 61/126 257/40 |

FOREIGN PATENT DOCUMENTS

| | | |
|---|---|---|
| EP | 1 725 079 A1 | 11/2006 |
| WO | WO 2008/073440 A2 | 6/2008 |
| WO | WO 2009/158069 A1 | 12/2009 |

OTHER PUBLICATIONS

International Search Report and Written Opinion for Application No. PCT/US2012/000443, dated Jan. 31, 2013, 23 pages.

* cited by examiner

*Primary Examiner* — Amina S Khan
(74) *Attorney, Agent, or Firm* — The Marbury Law Group, PLLC

(57) ABSTRACT

A method including combining at least one first compound in a neutral form with at least one ionic dopant in a first solvent system to provide a first doped reaction product, isolating the first doped reaction product in solid form, and combining the isolated first doped reaction product with at least one conjugated polymer in neutral form in a second solvent system to form a second doped reaction product including an oxidized form of the conjugated polymer a neutral form of the first compound is described. Advantages include better stability, ease of use, and lower metal content. Applications include organic electronic devices including OLEDs.

35 Claims, 9 Drawing Sheets

Orange
Phosphorescent
OLED

DOPING METHODS FOR HOLE INJECTION AND TRANSPORT LAYERS

RELATED APPLICATIONS

This application claims priority to U.S. provisional application 61/542,868 filed Oct. 4, 2011 and U.S. provisional application 61/655,419 filed Jun. 4, 2012, each of which is hereby incorporated by reference in its entirety.

BACKGROUND

Although useful advances are being made in energy saving devices such as, for example, organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better processing and performance for commercialization. For example, promising materials are the conducting or conjugated polymers including, for example, polythiophenes. However, problems can arise with doping, purity, solubility, processing, and/or instability. Also, it is important to have very good control over the solubility of alternating layers of polymer (e.g., orthogonal or alternating solubility properties among adjacent layers). In particular, for example, hole injection layers and hole transport layers can present difficult problems in view of competing demands and the need for very thin, but high quality, films. Doping of these materials also can introduce problems. For example, polymers may become insoluble or aggregate upon doping. In addition, particles and nanoparticles of metal may form upon doping which are difficult to remove and can cause unwanted leakage current.

A need exists for a good platform system to control properties of hole injection and transport layers such as solubility, thermal stability, and electronic energy levels such as HOMO and LUMO, so that the materials can be adapted for different applications and to function with different materials such as light emitting layers, photoactive layers, and electrodes. In particular, good solubility, intractability, and thermal stability properties are important. The ability to formulate the system for a particular application and provide the required balance of properties are also important. Also important is the ability to purify materials from undesired side products.

U.S. Pat. No. 7,879,461 describes a charge transport film for electroluminescent applications. Compositions are prepared by mixing an electron-accepting ionic compound and a hole-transporting compound.

SUMMARY

Embodiments described herein include, for example, compositions, methods of making the compositions, and methods of using the compositions, including uses in devices and articles. Compositions include, for example, polymers, monomers, blends, films, dispersions, solutions, powders, and ink formulations. Other embodiments include methods of making and methods of using devices.

For example, one embodiment provides a method, including: providing at least one first compound which has a neutral form and an oxidized form, wherein the molecular weight of the first compound is less than 1,000 g/mole; providing at least one ionic dopant comprising a cation and an anion, combining the at least one first compound in a neutral form with the at least one ionic dopant comprising at least one cation and at least one anion in a first solvent system to provide a first doped reaction product, wherein the combination produces a neutral form of the cation, and wherein the first doped reaction product comprises an oxidized form of the first compound and the anion; isolating the first doped reaction product in solid form, including removing the neutral form of the cation from the first doped reaction product; providing at least one conjugated polymer which has a neutral form and an oxidized form, combining the isolated first doped reaction product with the at least one conjugated polymer in neutral form in a second solvent system to form a second doped reaction product comprising an oxidized form of the conjugated polymer and the anion; wherein doping produces a neutral form of the first compound.

Another embodiment provides a method, comprising: providing a first doped reaction product comprising an oxidized form of a first compound and an anion; providing at least one conjugated polymer which has a neutral form and an oxidized form, combining the first doped reaction product with the at least one conjugated polymer in neutral form in a second solvent system to form a second doped reaction product comprising an oxidized form of the conjugated polymer and the anion; wherein doping produces a neutral form of the first compound.

Another embodiment provides a method, comprising: providing at least one first compound which has a neutral form and an oxidized form, providing at least one ionic dopant comprising a cation and an anion, combining the at least one first compound in a neutral form with the at least one ionic dopant comprising at least one cation and at least one anion in a first solvent system to provide a first doped reaction product, wherein the combination produces a neutral form of the cation, and wherein the first doped reaction product comprises an oxidized form of the first compound and the anion; isolating the first doped reaction product in solid form, including removing the neutral form of the cation from the first doped reaction product; providing at least one conjugated polymer comprising a poly(alkoxythiophene) which has a neutral form and an oxidized form, combining the isolated first doped reaction product with the at least one conjugated polymer in neutral form in a second solvent system to form a second doped reaction product comprising an oxidized form of the conjugated polymer and the anion; wherein doping produces a neutral form of the first compound, and wherein a work function of the first compound is more negative than the work function of the conjugated polymer.

Another embodiment provides a kit comprising: at least one powder prepared by providing at least one first compound which has a neutral form and an oxidized form, wherein the molecular weight of the first compound is less than 1,000 g/mole; providing at least one ionic dopant comprising a cation and an anion, and combining the at least one first compound in a neutral form with the at least one ionic dopant comprising at least one cation and at least one anion in a first solvent system to provide a first doped reaction product, wherein the combination produces a neutral form of the cation, and wherein the first doped reaction product comprises an oxidized form of the first compound and the anion; and isolating the first doped reaction product in solid form, including removing the neutral form of the cation from the first doped reaction product; and at least one composition comprising at least one conjugated polymer, wherein the powder is adapted to dope the conjugated polymer.

Another embodiment provides a composition comprising an HIL or HTL ink comprising at least one solvent, at least one conjugated polymer which is optionally doped, and at least one copolymer which is different from the conjugated polymer and comprises:

(A) (i) at least one arylamine side group, or (ii) at least one fused aromatic side group, and
(B) at least one aromatic side group comprising at least one hydroxyl substituent.

Another embodiment provides for a composition prepared by a method, comprising: providing at least one first compound which has a neutral form and an oxidized form, wherein the molecular weight of the first compound is less than 1,000 g/mole; providing at least one ionic dopant comprising a cation and an anion, combining the at least one first compound in a neutral form with the at least one ionic dopant comprising at least one cation and at least one anion in a first solvent system to provide a first doped reaction product, wherein the combination produces a neutral form of the cation, and wherein the first doped reaction product comprises an oxidized form of the first compound and the anion; isolating the first doped reaction product in solid form, including removing the neutral form of the cation from the first doped reaction product.

Another embodiment provides an OLED device comprising at least one hole injection layer comprising at least one doped conjugated polymer prepared by the methods described herein, wherein the hole injection layer has a thickness of about 20 nm to about 100 nm, or about 60 nm to about 200 nm, or about 100 nm to about 200 nm.

In another embodiment, an OLED device is provided comprising at least one hole injection layer comprising at least one doped conjugated polymer prepared by the methods described herein, wherein the hole injection layer has a transmission of at least 95% from 400 nm to 750 nm for thicknesses of 25 nm to 100 nm.

At least one advantage from at least one embodiment described herein includes improvement in operational stability including, for example, long term stability and overall increased lifetime of an organic electronic device such as for example an OLED, PHOLED, or OPV device. In particular, improvements can be realized compared to use of PEDOT/PSS controls. In particular, properties such as current density and luminescence can be improved.

At least one additional advantage for at least one embodiment includes more flexibility in the formulation and building of an organic electronic device, such as for example an LED, OLED, PHOLED, OPV, electrocromic device, metal-metal oxide capacitors, supercapacitor, an actuator or transistor, seed-layer for printed circuit boards. In particular, films made from the compositions described herein, upon casting and annealing, can be intractable to toluene. In particular, the compositions described herein can be used when it is desirable to cast subsequent layers of emissive layers.

At least one additional advantage for at least one embodiment includes doping of soluble conjugated polymers in a solvent system while maintaining the ability to process them from the same solution.

At least one additional advantage for at least one embodiment includes the doping of polythiophenes in solution which has been previously precluded, in some embodiments, because of its limited solubility in its doped form.

Another benefit of at least some embodiments described herein is the ability to form thick layers that allow for planarizing underlying transparent metal nanostructures and/or conducting oxides while maintaining overall transparency.

Another benefit of at least some embodiments described herein include improved thermal stability properties, such as improved thermochromism behavior, or more particularly improved lack of thermochromism.

Another benefit of at least some embodiments described herein include the minimization or elimination of free radical generation during doping, which would otherwise lead to undesirable side-reactions that cause degradation.

Another benefit of at least some embodiments described herein include production of pure, doped conjugated polymers devoid of non-volatile residues.

Another benefit of at least some embodiments described herein include easier separation of precipitates, for example, free metal precipitates that form as a by-product of an oxidation reaction.

Still further, another benefit for at least some embodiments can be that better dopant preparations, and more stable dopants, can be achieved.

Still further, another benefit for at least some embodiments can be better results with use of transparent oxides that are sensitive to low pH or aqueous media.

DETAILED DESCRIPTION

Introduction

Figure 1:
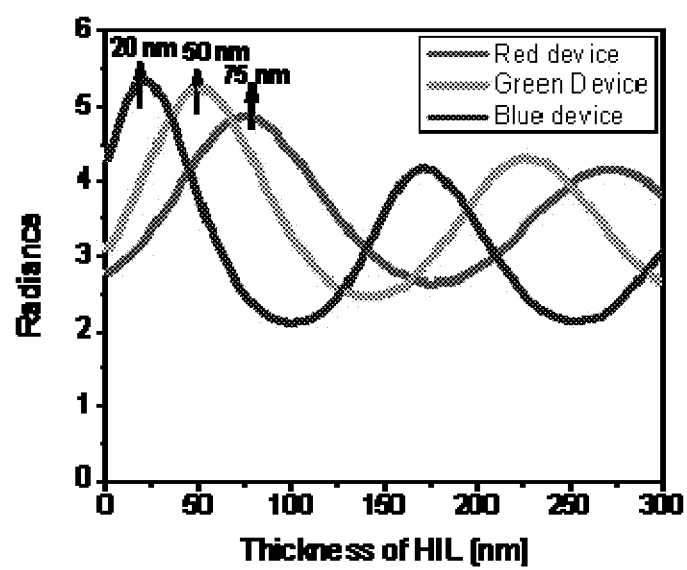
FIG. 1 illustrates that for optimum peak radiance, simulations show that HIL thickness can vary between 20 nm and 75 nm. The flexibility of the design is an advantage. For the simulation, the peak wavelength was 610 nm for red (75 nm peak shown), 550 nm for green (50 nm peak shown), and 460 nm for blue (20 nm peak shown). The simulation was carried out with use of actual optical constants.

All references cited herein are incorporated by reference in their entireties.

Priority U.S. provisional application 61/542,868 filed Oct. 4, 2011 and U.S. provisional application 61/655,419 filed Jun. 4, 2012 are each hereby incorporated by reference in its entirety.

Technical literature which can be used in the practice of embodiments described herein include, for example:

US Patent Publication 2009/0256117, filed Apr. 10, 2009 (assignee: Plextronics, Inc.) describes a series of polymers, doping systems, and devices, and is hereby incorporated by reference including its working examples, figures, conjugated polymers, dopants, and claims. U.S. Pat. No. 7,569,159 describes hole injection layer and hole transport layers and associated devices. US Patent Publication 2008/0248313 (filed Jul. 13, 2007) described sulfonated materials used in hole injection layer and hole transport layers and associated devices. Also, US Patent Publications 2006/0078761 and 2006/0076050 (filed Sep. 26, 2005) describe conjugated polymers used in electroluminescent and photovoltaic devices.

Conjugated polymers are also generally known in the art. Examples include polythiophenes (including regioregular polythiophene derivatives), polypyrroles, poly(phenylene vinylenes), polyanilines, and the like. Conjugated polymers used in organic electronic devices are also described in, for example, WO 2009/152,165 (published Dec. 17, 2009); WO 2009/111,675 (published Sep. 11, 2009); WO 2009/111,339 (published Sep. 11, 2009);

Copolymers and copolymer architecture are generally known in the art. See, for example, Billmeyer, *Textbook of Polymer Science,* 3rd Ed, 1984 (e.g., Chapter 5); *Concise Encyclopedia of Polymer Science and Engineering,* (Kroschwitz, Ed.), 1990 "Copolymerization" and "Alternating Copolymers." As an example, copolymers include block copolymers, segmented copolymers, graft, alternating copolymers, random copolymers, and the like. Copolymers include polymers with two or more different types of repeat groups, including terpolymers.

Organic electronic devices are known in the art. For example, OLED displays and materials are described in, for example, *Organic Light-Emitting Materials and Devices,* Li and Meng (Eds.), 2006. In addition, organic field-effect transistors and hole transport materials are described in, for example, *Organic Field-Effect Transistors, Bao and Lockline* (Eds.), 2007.

Other examples of organic materials and/or dopants include: EP 1725079; US 2007/0207341; WO 2009/102027; WO 2009/158069; U.S. Pat. No. 5,853,906; U.S. Pat. No. 5,999,780; and Nielsen et al., *J. Am. Chem. Soc.,* 2008, 130, 9734-9746.

"Optionally substituted" groups refers to, for example, functional groups that may be substituted or unsubstituted by additional functional groups. For example, when a group is unsubstituted by an additional group it may be referred to as a group name, for example alkyl or aryl. When a group is substituted with additional functional groups it may more generically be referred to as substituted alkyl or substituted aryl, respectively.

"Substituted" groups refer to, for example, a group having from 1 to 3, and preferably 1 to 2, substituents selected from the group consisting of alkyl, alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Aryl" refers to, for example, an aromatic carbocyclic group of from 6 to 20 carbon atoms having a single ring (e.g., phenyl) or multiple condensed rings (e.g., naphthyl or anthryl) which condensed rings may or may not be aromatic provided that the point of attachment is at an aromatic carbon atom. Preferred aryls include, for example, phenyl, naphthyl, and the like.

"Alkyl" refers to, for example, straight chain and branched alkyl groups having from 1 to 20 carbon atoms, or from 1 to 15 carbon atoms, or from 1 to 10, or from 1 to 5, or from 1 to 3 carbon atoms. This term is exemplified by groups such as, for example, methyl, ethyl, n-propyl, isopropyl, n-butyl, t-butyl, n-pentyl, ethylhexyl, dodecyl, isopentyl, and the like.

"Alkoxy" refers to, for example, the group "alkyl-O—" which includes, by way of example, methoxy, ethoxy, n-propyloxy, iso-propyloxy, n-butyloxy, t-butyloxy, n-pentyloxy, 1-ethylhex-1-yloxy, dodecyloxy, isopentyloxy, and the like. Another example of alkoxy is alkoxyalkoxy or alkoxyalkoxyalkoxy, and the like.

"Substituted alkoxy" refers to, for example, the group "substituted alkyl-O—" including, for example, fluorinated groups and perflourinated groups.

"Alkenyl" refers to, for example, alkenyl group preferably having from 2 to 6 carbon atoms and more preferably 2 to 4 carbon atoms and having at least 1 and preferably from 1-2 sites of alkenyl unsaturation. Such groups are exemplified by vinyl, allyl, but-3-en-1-yl, and the like.

"Substituted alkenyl" refers to, for example, alkenyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic with the proviso that any hydroxyl substitution is not attached to a vinyl (unsaturated) carbon atom.

"Aryloxy" refers to, for example, the group aryl-O— that includes, by way of example, phenoxy, naphthoxy, and the like.

"Alkynyl" refers to, for example, an alkynyl group preferably having from 2 to 6 carbon atoms and more preferably 2 to 3 carbon atoms and having at least 1 and preferably from 1-2 sites of alkynyl unsaturation.

"Substituted alkynyl" refers to, for example, an alkynyl group having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Aryloxy" can be for example the group aryl-O— that includes, by way of example, phenoxy, naphthoxy, and the like.

"Substituted aryloxy" can be, for example, substituted aryl-O— groups.

"Alkylene oxide" or "alkyleneoxy" or "polyether" can be, for example, the group $-O(R_a-O)_n-R_b$ where $R_a$ is alkylene and $R_b$ is alkyl or optionally substituted aryl and n is, for example, an integer from 1 to 6, or from 1 to 3. Alkylene oxide can be, for example, based on such groups as ethylene oxides or propylene oxides. Alkylene oxide can, for example, include a variety of alkylene segments in the same chain, for example:

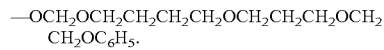

"Conjugated polymer" refers to, for example, polymers comprising at least some conjugated unsaturation in the backbone.

"A polythiophene" or "polythiophene" refers to, for example, polymers comprising a thiophene in the backbone including polythiophene, derivatives thereof, and copolymers and terpolymers thereof.

"Regioregular polythiophene" refers to, for example, polythiophene having high levels of regioregularity including, for example, at least 80%, or at least 90%, or at least 95%, or at least 98%, or at least 99%.

"Alkylene" can be, for example, groups represented by —[CH$_2$]$_x$ such as, for example, ethylene or propylene, including both substituted and unsubstituted forms. Alkylene can be, for example, a $C_1$-$C_6$ group such as, for example, a $C_2$, $C_3$, $C_4$, $C_5$, or $C_6$ group.

Fluorinated groups, moieties, or substituents can comprise at least one fluorine and can include perfluorinated groups, moieties, or substituents.

It is understood that in all substituted groups defined above, polymers arrived at by defining substituents with further substituents to themselves (e.g., substituted aryl having a substituted aryl group as a substituent which is itself substituted with a substituted aryl group, etc.) are not intended for inclusion herein. In such cases, the maximum number of such substituents is three. That is to say that each of the above definitions is constrained by a limitation that, for example, substituted aryl groups are limited to—substituted aryl-(substituted aryl)-substituted aryl.

Similarly, it is understood that the above definitions are not intended to include impermissible substitution patterns (e.g., methyl substituted with 5 fluoro groups or a hydroxyl group alpha to ethenylic or acetylenic unsaturation). Such impermissible substitution patterns are well known to the skilled artisan.

First Compound which has a Neutral Form and an Oxidized Form

In one embodiment, a first compound can be provided which has at least a neutral form and an oxidized form. As described herein, the first compound can be cycled between its neutral form and its oxidized form. It can, for example, be initially oxidized, and then in its oxidized state, be used as a dopant for a conjugated polymer. Upon doping, it can convert back to the neutral state.

The first compound can be a relatively low molecular weight compound or "small molecule." For example, the molecular weight can be less than 1,000 g/mole, or less than 750 g/mole, or less than 600 g/mole, or less than 500 g/mole. The first compound is not a longer chain polymer which has many repeat units. The first compound is not a conjugated polymer of high molecular weight.

As described below, the first compound can have a work function which allows it to dope a conjugated polymer. The work function can be larger than the work function of the conjugated polymer. For example, the work function can be higher than that of a polythiophene, including a poly(3-alkoxythiophene), including one of the poly(alkoxythiophenes) described herein. For example, the work function can be at least −4.7 eV, or at least −5.0 eV, or at least −5.3 eV. Work function can be measured by the AC-2 photoelectron spectroscopy method as known in the art.

The first compound can be a hole transporting material or compound.

In one embodiment, the first compound can be, for example, a hole transporting material. Hole transporting materials are described hereinbelow. For example, the first compound can be an arylamine or an aromatic amine compound. In another embodiment, the hole transport material is not an arylamine compound.

The first compound can be adapted to not have substitutents which would complex with metallic particles and nanoparticles. For example, if the first compound is doped with a silver compound, and silver particles and nanoparticles form, the first compound should not bind to the particles and nanoparticles. Binding makes purification difficult so it is difficult to remove the particles and nanoparticles.

Hole Transporting Materials or Compounds as First Compound

The first compound can be a hole transporting compound or material. Hole transporting materials are known in the art and are commercially available. They can be, for example, low molecular weight materials. They can be monomeric. Optionally, they can contain cross-linkable functional groups such as vinyl, benzocyclobutane, trifluorovinyloxy, or acrylate, for example.

One type of hole transport material is the arylamine class of compounds including compounds having tertiary amine components. For example, hole transport materials can include:

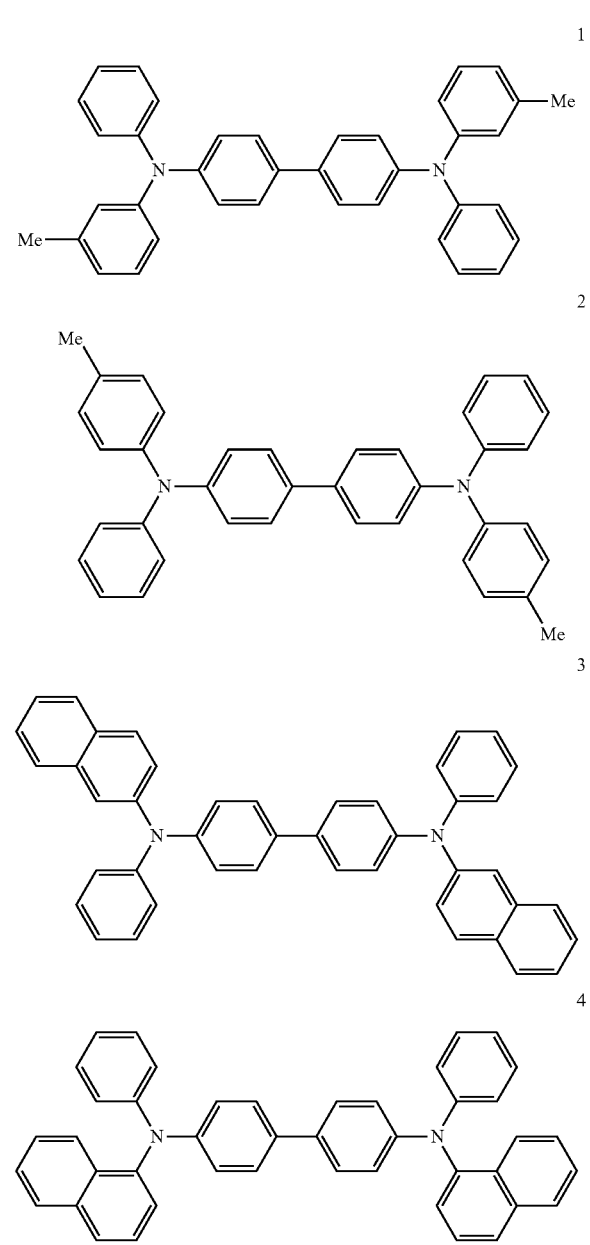

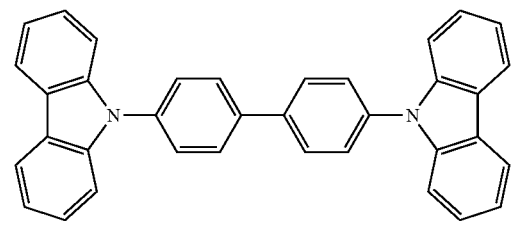
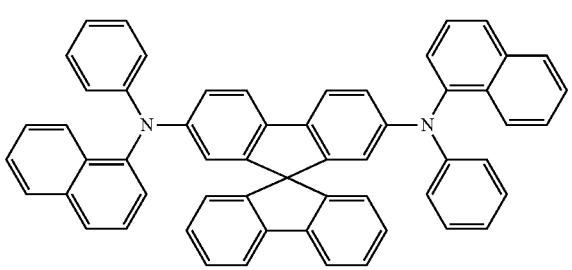
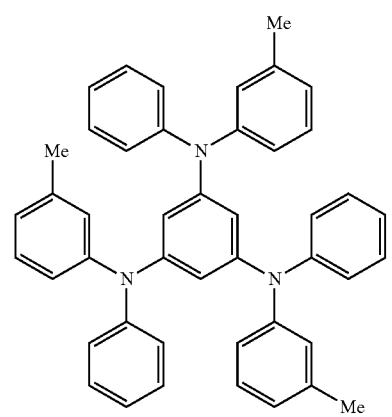
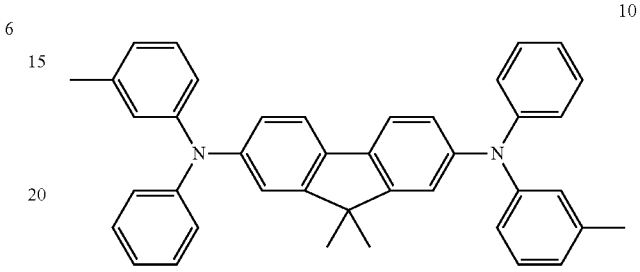
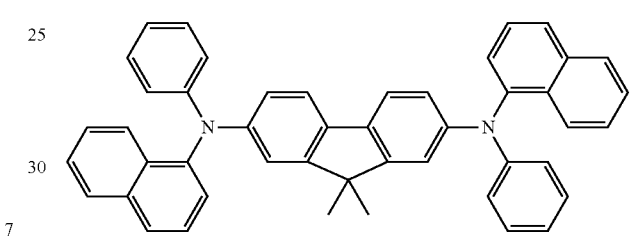
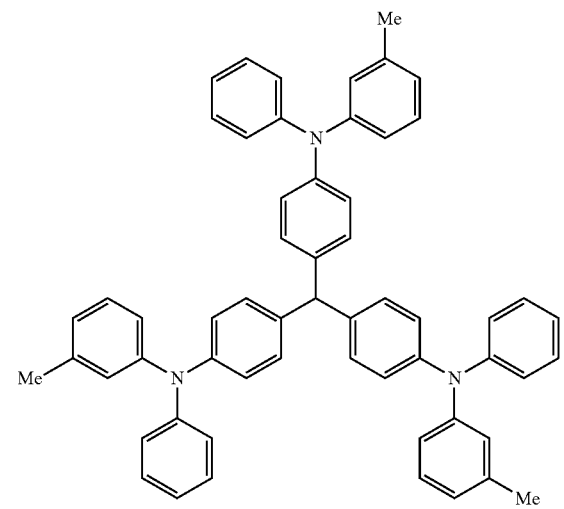
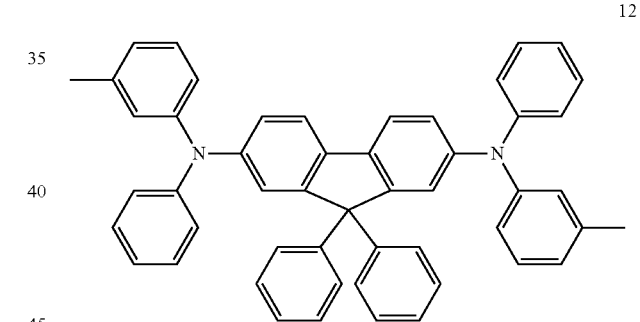
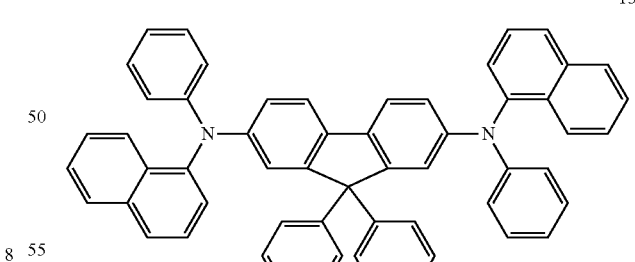
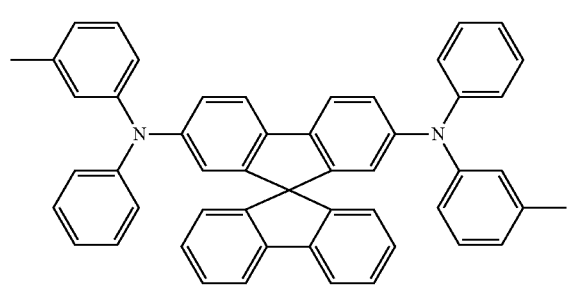
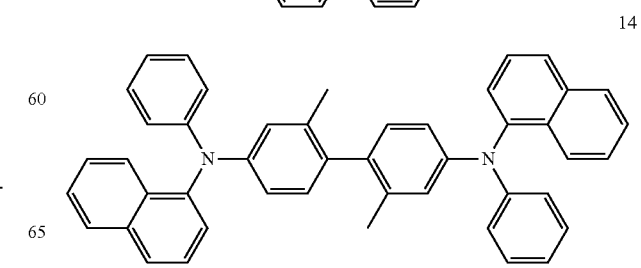

15
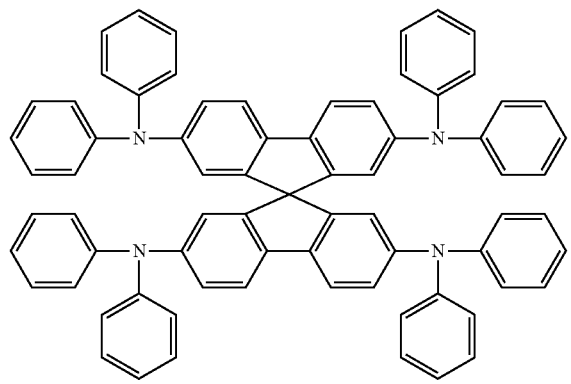
16
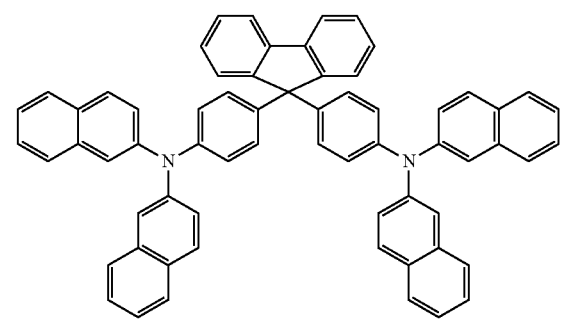
17
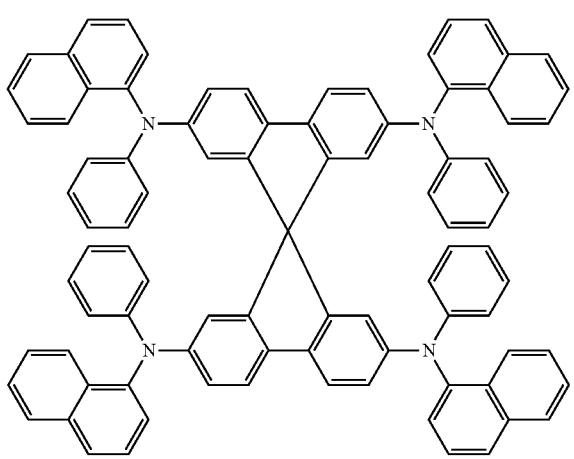
18
19
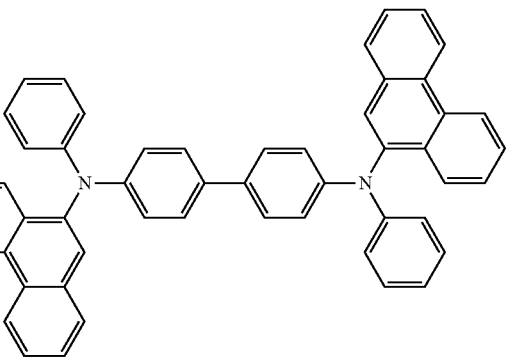
20
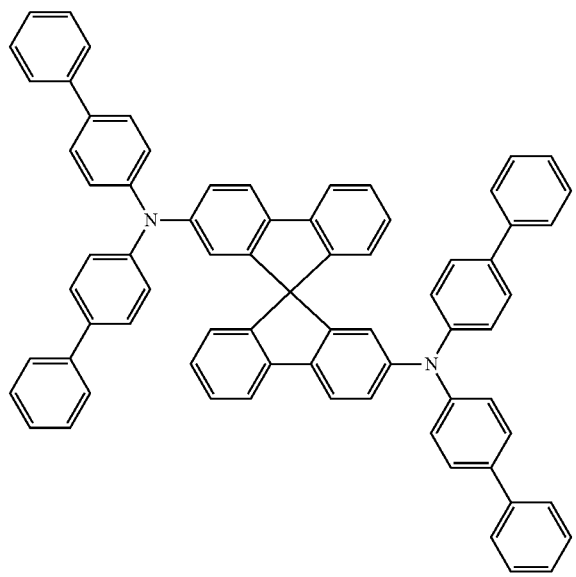
21
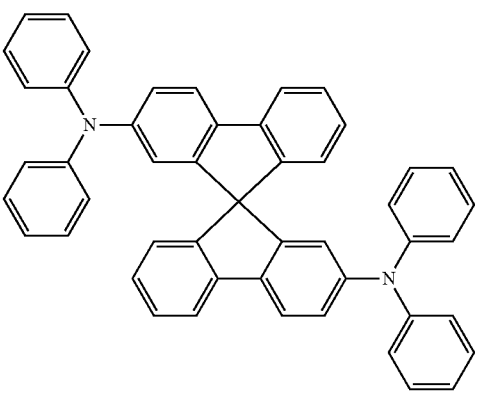

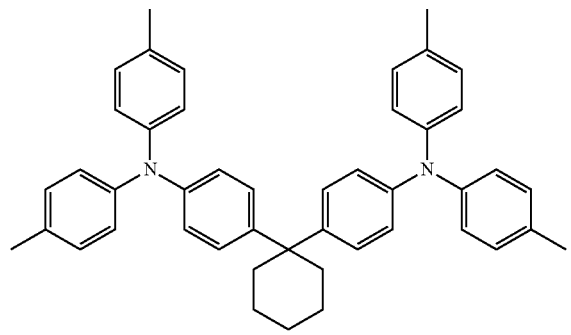
22
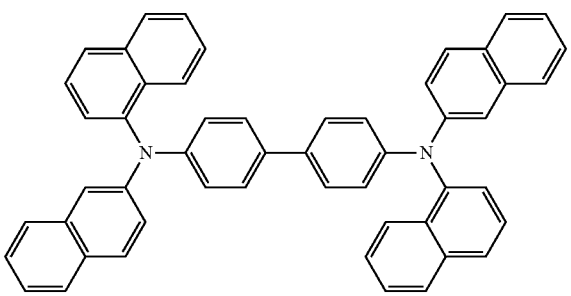
26
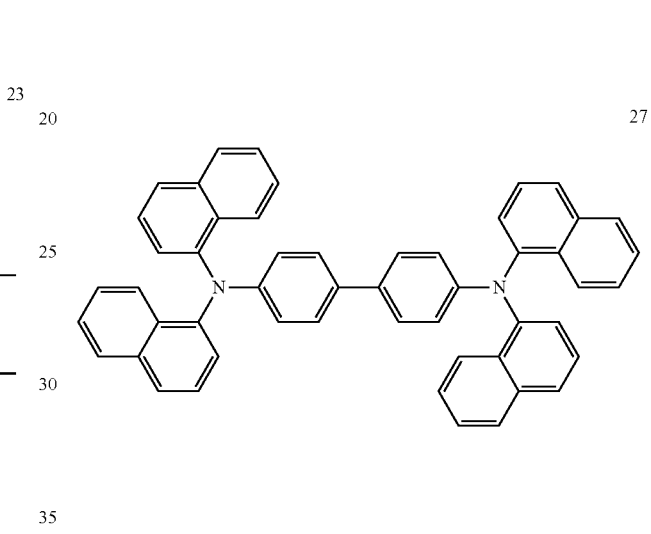
23
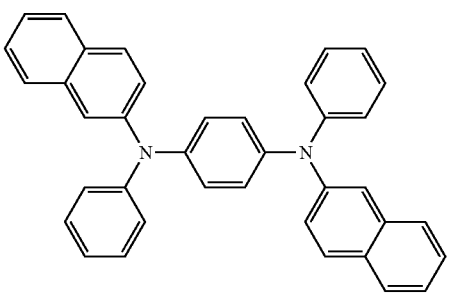
27
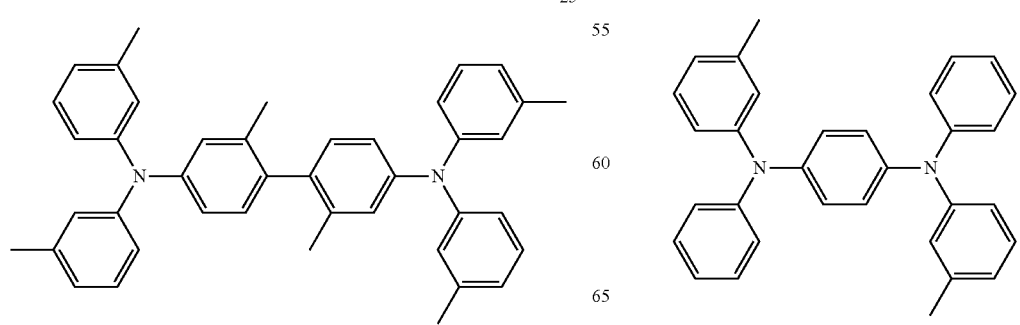

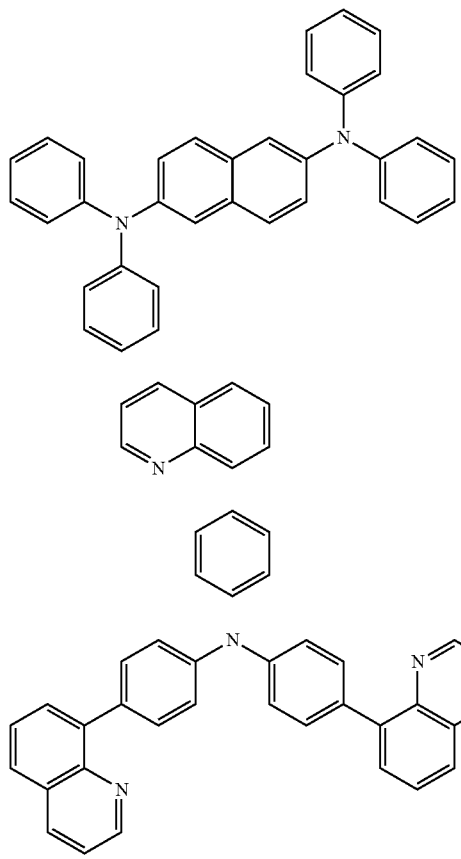
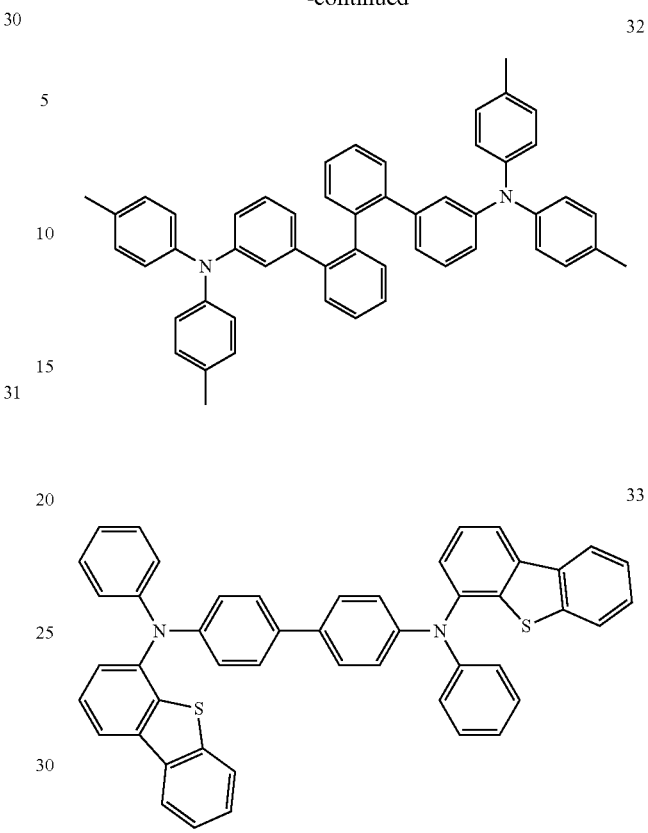
Other examples include:
| | | |
|---|---|---|
| 1 | 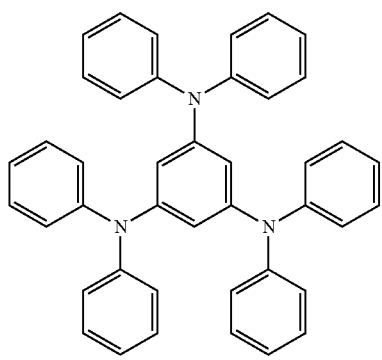 [SMILES: c1ccc(N(c2ccccc2)c2cc(N(c3ccccc3)c3ccccc3)cc(N(c3ccccc3)c3ccccc3)c2)cc1] | 1,3,5-Tris(diphenylamino)benzene |
| 2 | 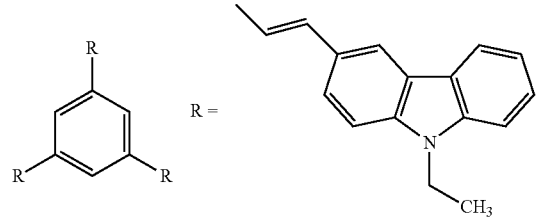 | 1,3,5-Tris(2-(9-ethylcabazyl-3)ethylene)benzene |

-continued
| | | |
|---|---|---|
| 3 | 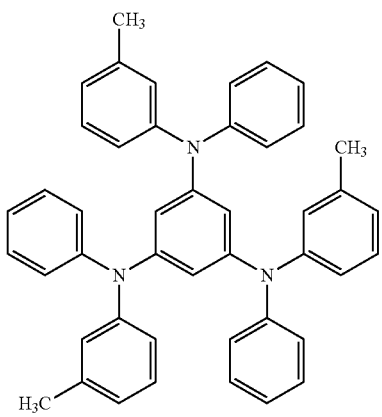 [SMILES: Cc1cccc(N(c2ccccc2)c2cc(N(c3ccccc3)c3cccc(C)c3)cc(N(c3ccccc3)c3cccc(C)c3)c2)c1] | 1,3,5-Tris[(3-methylphenyl)phenylamino]benzene |
| 4 | 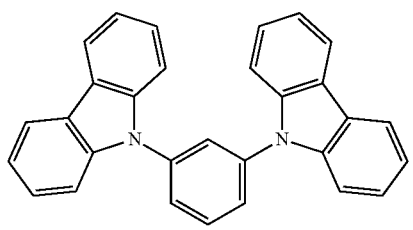 [SMILES: c1cc(-n2c3ccccc3c3ccccc32)cc(-n2c3ccccc3c3ccccc32)c1] | 1,3-Bis(N-carbazolyl)benzene |
| 5 | 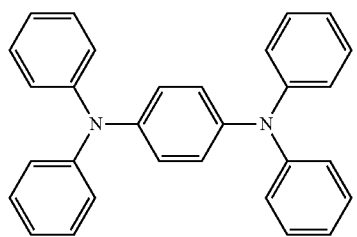 [SMILES: c1ccc(N(c2ccccc2)c2ccc(N(c3ccccc3)c3ccccc3)cc2)cc1] | 1,4-Bis(diphenylamino)benzene |
| 6 | 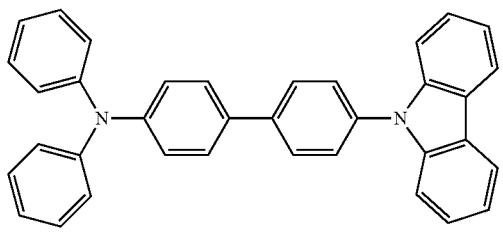 [SMILES: c1ccc(N(c2ccccc2)c2ccc(-c3ccc(-n4c5ccccc5c5ccccc54)cc3)cc2)cc1] | 4,4'-Bis(N-carbazolyl)-1,1'-biphenyl |
| 7 | 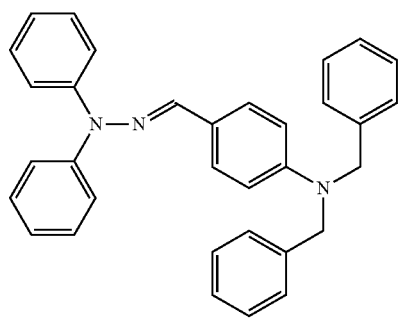 [SMILES: C(=N\N(c1ccccc1)c1ccccc1)/c1ccc(N(Cc2ccccc2)Cc2ccccc2)cc1] | 4-(Dibenzylamino)benzaldehyde-N,N-diphenylhydrazone |

| | | -continued |
|---|---|---|
| 8 | 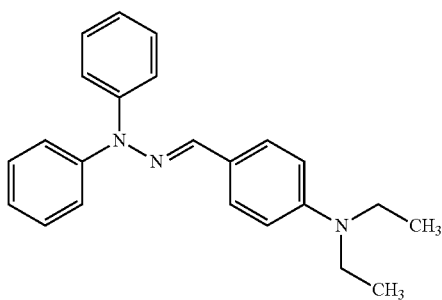 [SMILES: CCN(CC)c1ccc(/C=N/N(c2ccccc2)c2ccccc2)cc1] | 4-(Diethylamino)benzaldehyde diphenylhydrazone |
| 9 | 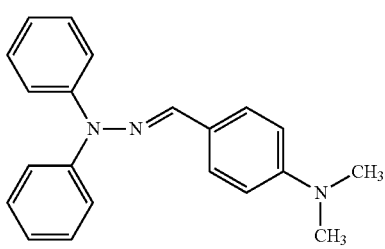 [SMILES: CN(C)c1ccc(/C=N/N(c2ccccc2)c2ccccc2)cc1] | 4-(Dimethylamino)benzaldehyde diphenylhydrazone |
| 10 | 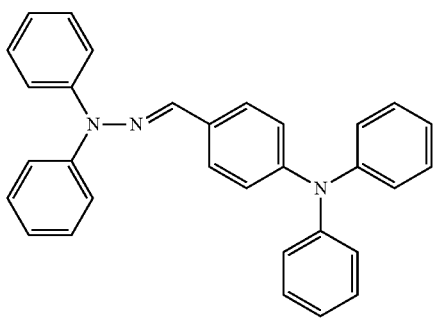 [SMILES: C(=N\N(c1ccccc1)c1ccccc1)/c1ccc(N(c2ccccc2)c2ccccc2)cc1] | 4-(Diphenylamino)benzaldehyde diphenylhydrazone |
| 11 | 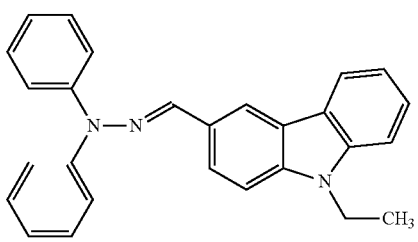 [SMILES: C=C/C=C\C=C\N(/N=C/c1ccc2c(c1)c1ccccc1n2CC)c1ccccc1] | 9-Ethyl-3-carbazolecarboxaldehyde diphenylhydrazone |
| 12 | 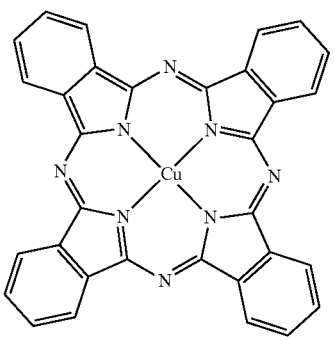 | Copper(II) phthalocyanine |

-continued
| | | |
|---|---|---|
| 13 | 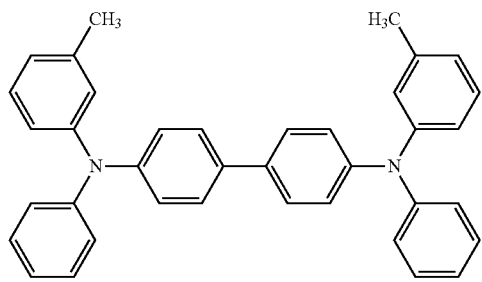 [SMILES: Cc1cccc(N(c2ccccc2)c2ccc(-c3ccc(N(c4ccccc4)c4cccc(C)c4)cc3)cc2)c1] | N,N'-Bis(3-methylphenyl)-N,N'-diphenylbenzidine |
| 14 | 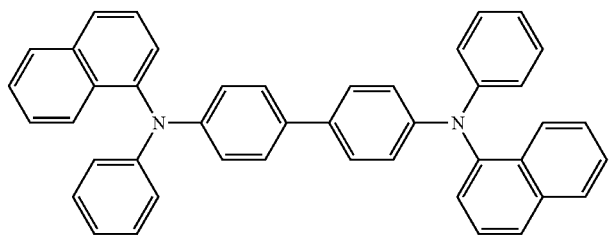 [SMILES: c1ccc(N(c2ccc(-c3ccc(N(c4ccccc4)c4cccc5ccccc45)cc3)cc2)c2cccc3ccccc23)cc1] | N,N'-Di-[(1-naphthyl)-N,N'-diphenyl]-1,1'-biphenyl)-4,4'-diamine |
| 15 | 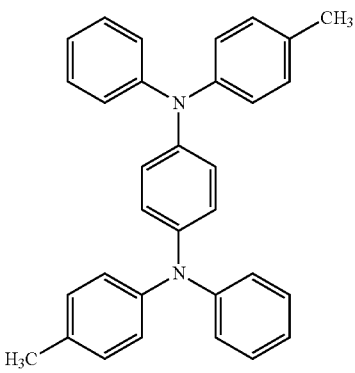 | N,N'-Diphenyl-N,N'-di-p-tolylbenzene-1,4-diamine |
| 16 | 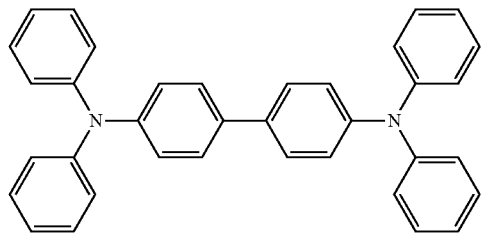 [SMILES: c1ccc(N(c2ccccc2)c2ccc(-c3ccc(N(c4ccccc4)c4ccccc4)cc3)cc2)cc1] | Tetra-N-phenylbenzidine |
| 17 | 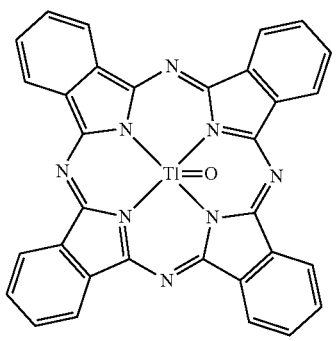 | Titanyl phthalocyanine Dye content |

| 18 | 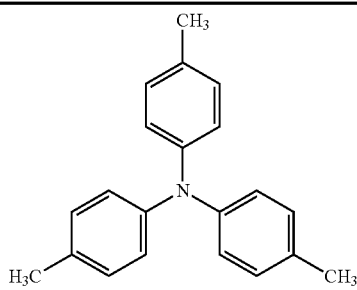 | Tri-p-tolylamine |
| 19 | 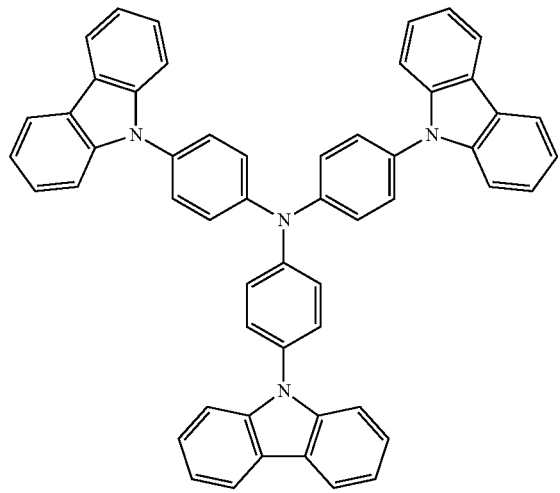 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Tris(4-carbazoyl-9-ylphenyl)amine |
| 20 | 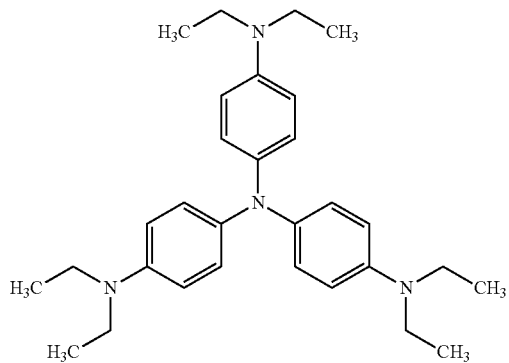 [SMILES: CCN(CC)c1ccc(N(c2ccc(N(CC)CC)cc2)c2ccc(N(CC)CC)cc2)cc1] | Tris[4-(diethylamino)phenyl]amine |
Another example of a hole transport material can be described by the structure:
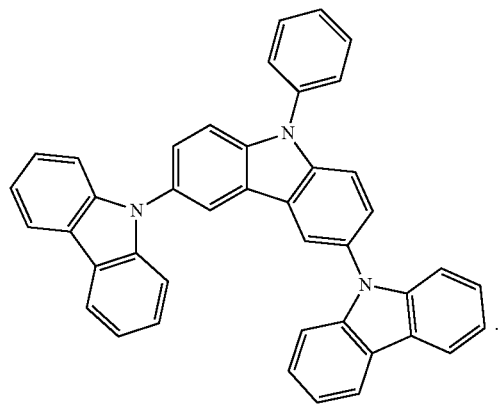 [SMILES: c1ccc(-n2c3ccc(-n4c5ccccc5c5ccccc54)cc3c3cc(-n4c5ccccc5c5ccccc54)ccc32)cc1]
Another example of a hole transport material can be described by the structure (DMFL-TPD):
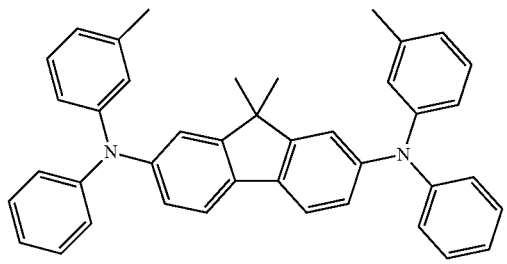 [SMILES: Cc1cccc(N(c2ccccc2)c2ccc3c(c2)C(C)(C)c2cc(N(c4ccccc4)c4cccc(C)c4)ccc2-3)c1]
Another example of a hole transport material can be described by the structure (DMFL-TPD):

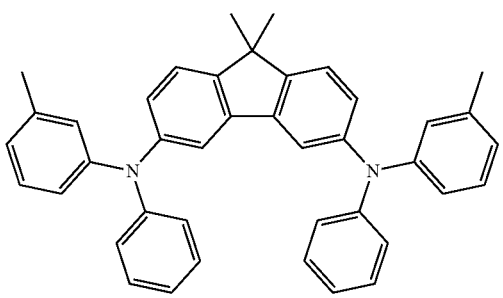 [SMILES: Cc1cccc(N(c2ccccc2)c2ccc3c(c2)-c2cc(N(c4ccccc4)c4cccc(C)c4)ccc2C3(C)C)c1]

Another example of a hole transport material can be described by the structure (DMFL-NPB)

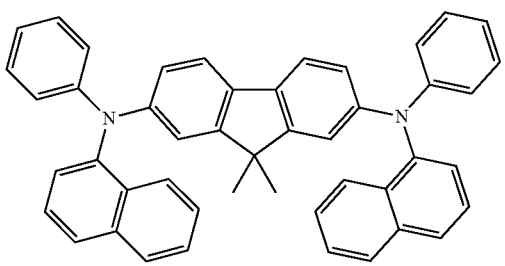 [SMILES: CC1(C)c2cc(N(c3ccccc3)c3cccc4ccccc34)ccc2-c2ccc(N(c3ccccc3)c3cccc4ccccc34)cc21]

Another example of a hole transport material can be described by the structure (AMB-OMe$_2$):

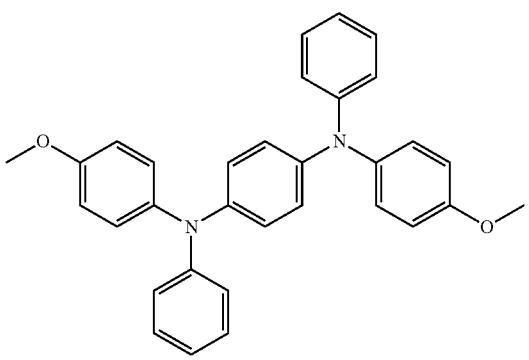

An additional example of a hole transporting material is poly(9,9-dioctylfluorene-co-N-(4-butylphenyl)diphenylamine) (TFB). Additional examples include:

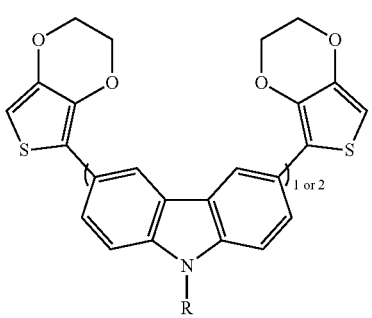

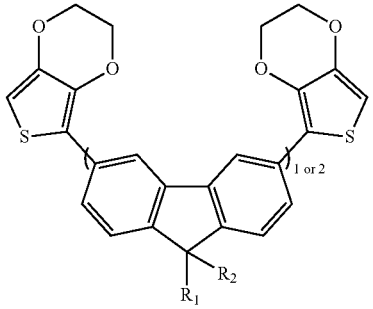

where R, R$_1$ and R$_2$ are, for example, optionally substituted alkyl, alkoxy, aryl, heteroaryl;

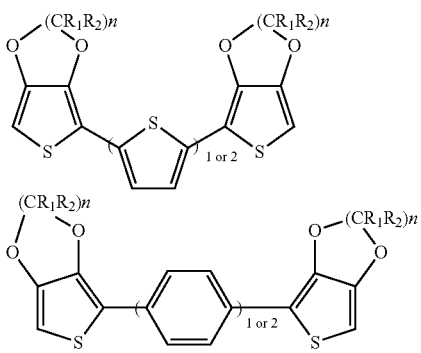

n = 1-4
R1 and R2 = alkyl or aryl where R$_1$ and R$_2$ are optionally substituted alkyl, alkoxy, aryl, heteroaryl;

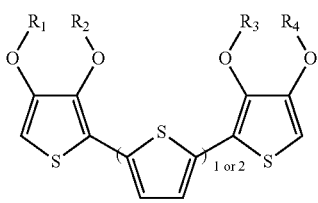

where R$_1$, R$_2$, R$_3$ and R$_4$ are independently selected from H, optionally substituted alkyl, alkoxy, aryl, heteroaryl.

In another embodiment, the hole transporting material is:

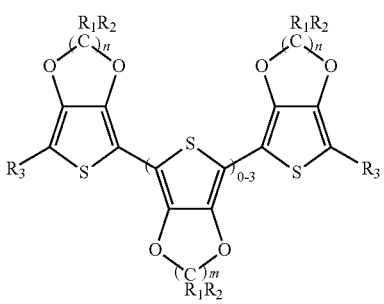

where R$_1$, R$_2$ and R$_3$ are optionally substituted alkyl, alkoxy, aryl, heteroaryl.
n, m and o is ≥1.

In another embodiment, the hole transporting material is:

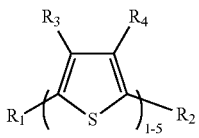

wherein $R_1$, $R_2$, $R_3$ and $R_4$ are independently H, optionally substituted alkyl, alkoxy, aryl, heteroaryl.

In another embodiment, the hole transporting material is:

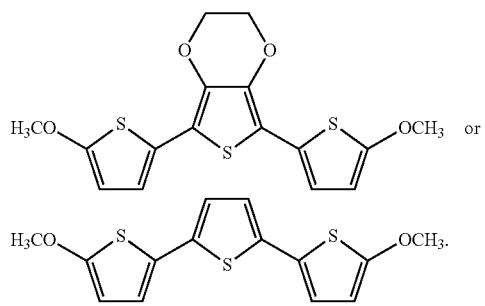

In another embodiment, the first compound is a wide band-gap polymer/co-polymer wherein the molecular weight of the first compound is less than 1,000 g/mole.

In another embodiment, the hole transporting material is

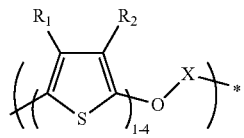

where $R_1$ and $R_2$ is H, optionally substituted alkyl, alkoxy, aryl, aryloxy, heteroaryl, heteroaryloxy and X is an aliphatic or aromatic bivalent group, including a C1-C20 group, wherein the molecular weight of the first compound is less than 1,000 g/mole.

In another embodiment, the hole transporting material is

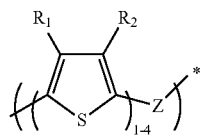

where $R_1$ and $R_2$ is H, optionally substituted alkyl, alkoxy, aryl, aryloxy, heteroaryl, heteroaryloxy and Z is a bivalent group such as alkyl, alkoxy, or aryloxy, including a $C_1$-$C_{20}$ group, wherein the molecular weight of the first compound is less than 1,000 g/mole.

In another embodiment, the first compound is an oligiothiophene.

Ionic Dopants

Dopants are known in the art and can react with the first compound in doping reactions. The dopant can be an ionic compound. The dopant can comprise a cation and an anion. A variety of dopants are described in, for example, U.S. Ser. No. 13/104,598 (published as 2011/0278559, assignee: Plextronics, Inc.) which is incorporated herein by reference in its entirety.

The cation of the ionic compound can be, for example, V, Cr, Mn, Fe, Co, Ni, Cu, Nb, Mo, Tc, Ru, Rh, Pd, Ag, Ta, W, Re, Os, Ir, Pt, or Au. In addition, the cation of the ionic compound can be, for example, gold, molybdenum, rhenium, iron, and silver cation. Silver cation is a particularly preferred example.

The anion of the ionic compound can be, for example, a whole aromatic or heteroaromatic anion. It can comprise a main group element such as boron. It can be, for example, an arylborate anion. It can be, for example, an optionally substituted tetraarylborate, or a halogenatedtetraarylborate, or tetrakispentafluorophenylborate (TPFB).

Examples of an anion include structures represented by:

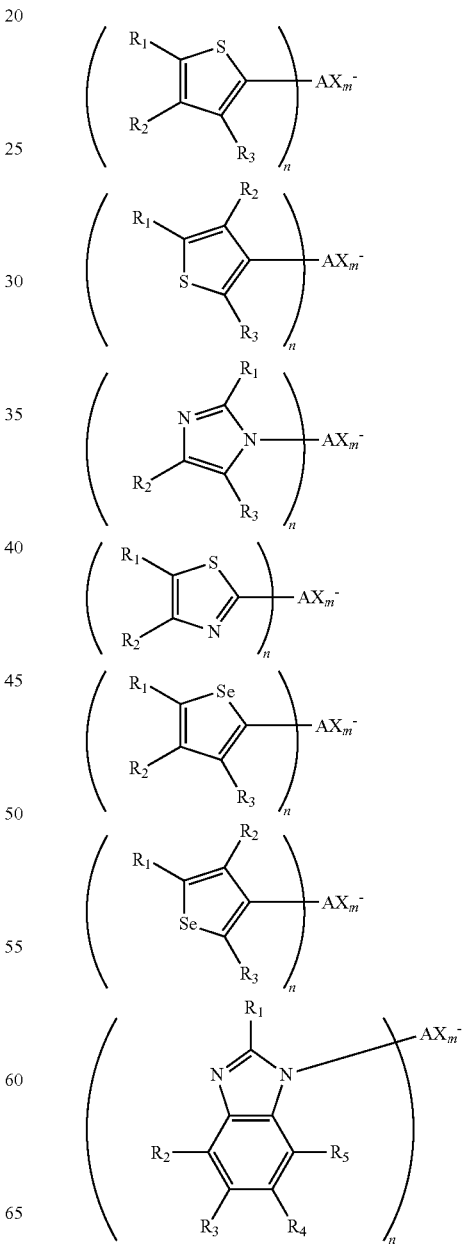

-continued
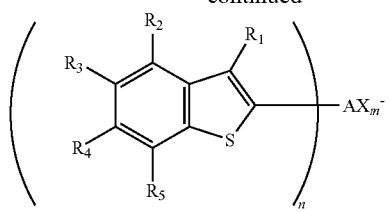
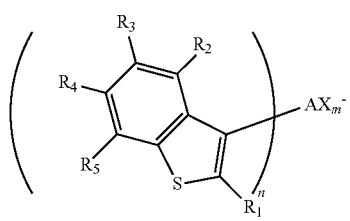
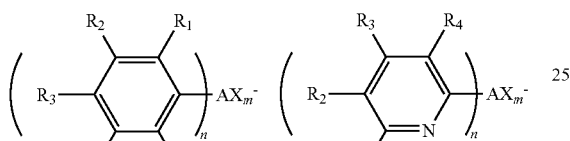
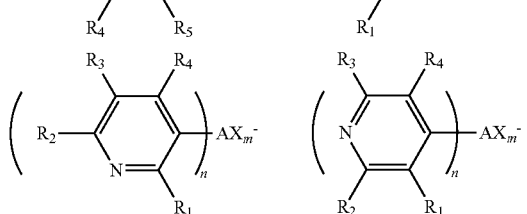
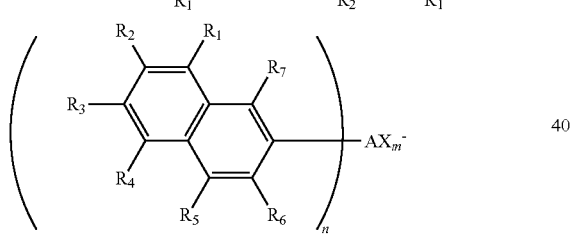
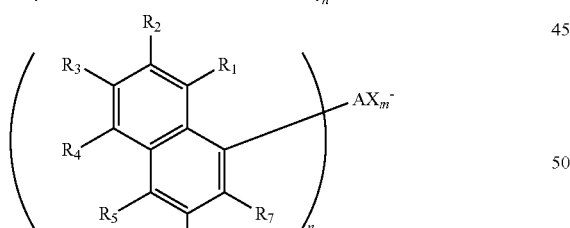
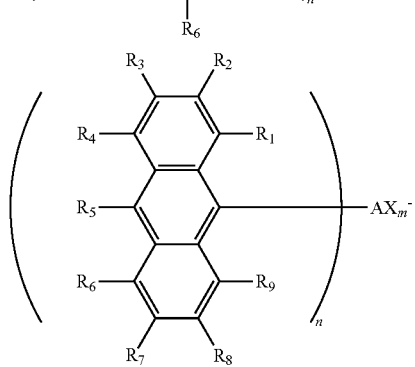
-continued
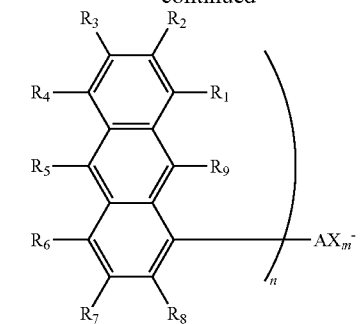
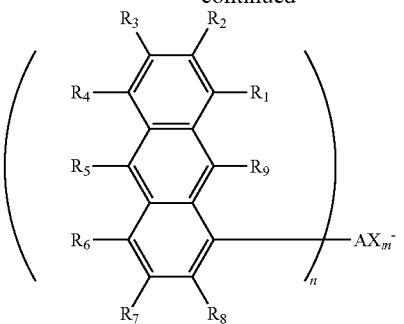
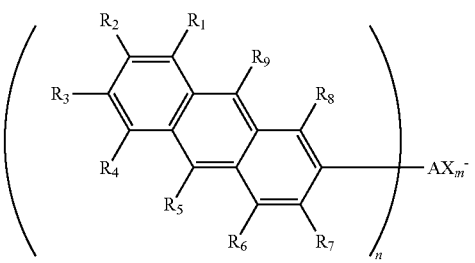
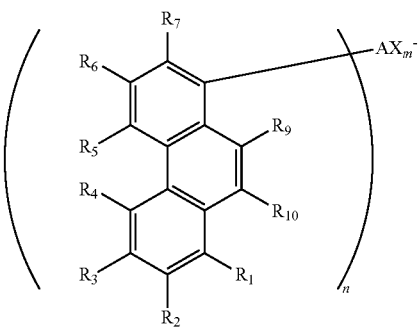
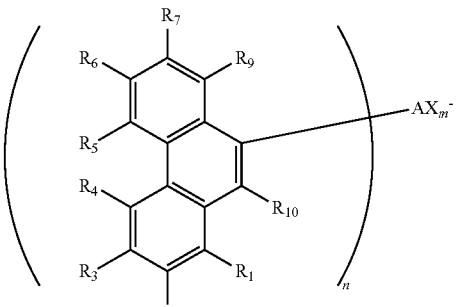
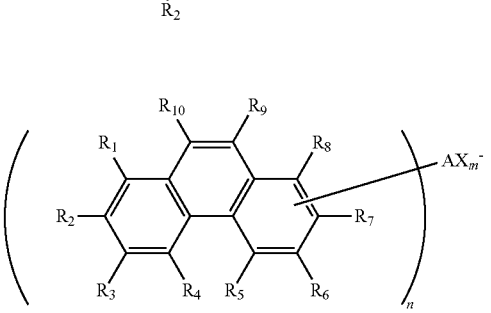

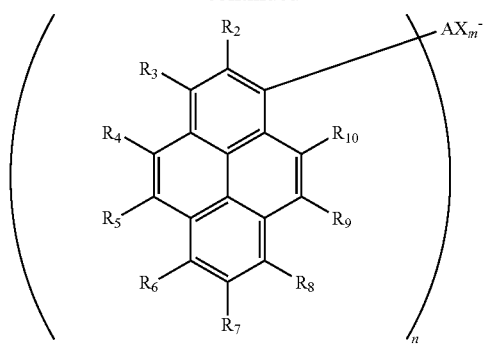

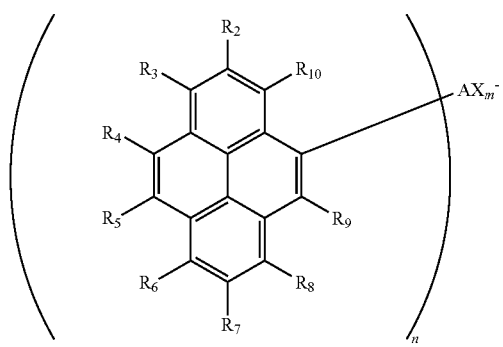

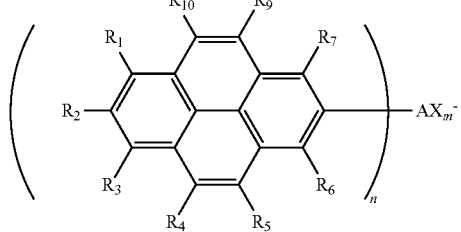

wherein independently, each of $R_1$ to $R_{10}$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, antimony, $SO_3$ or $CO_2$; X is F, Cl, Br, I or CN; n is 0 to 6; and m is ≤6−n. In one embodiment, n can be 1 to 6.

In other embodiments, the anion can be at least one of the structures represented by:

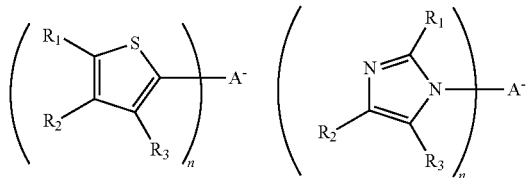

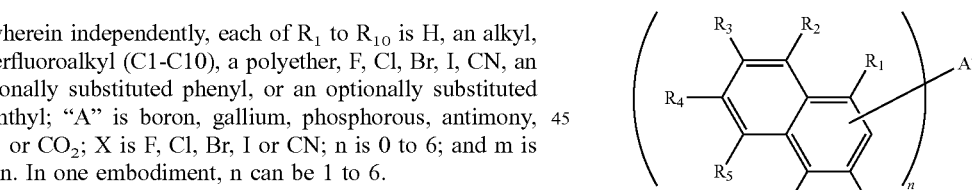

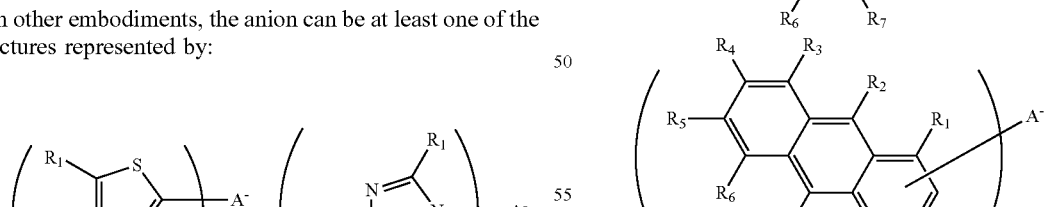

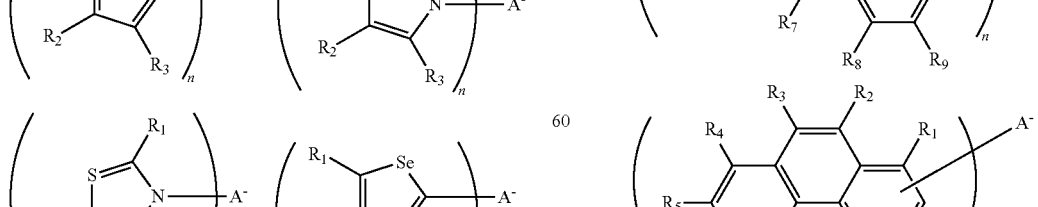

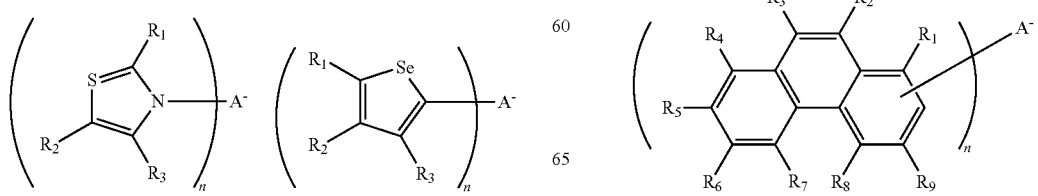

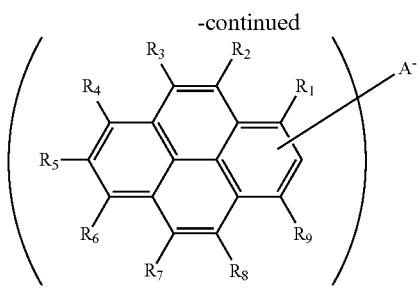

wherein independently, $R_1$ to $R_9$ can be, for example, H, an alkyl, a perfluoroalkyl (C1-C10), a polyether, F, Cl, Br, I, CN, an optionally substituted phenyl, or an optionally substituted naphthyl; "A" can be boron, gallium, phosphorous, or antimony; and n can be n=1 to 6. For example: if A is boron or gallium, then n is 4; if A is phosphorous or antimony, then n is 6.

In additional embodiments, the dopant can be a sulfonate or a carboxylate including alkyl, aryl, and heteroaryl sulfonates and carboxylates. For example, the A in the above twelve structures can be, in addition, to boron, gallium, phosphorous, or antimony, a sulfonate or carboxylate group. For the sulfonate and carboxylate embodiments of these twelve structures, the value of n can be 1.

Examples of sulfonate and carboxylate dopants include benzoate compounds, methanesulfonate, trifluoromethanesulfonate, p-toluenesulfonate, pentafluoropropionate, tetrafluoroborate, and/or trifluoroborates. Examples include (2-nitrophenyl)trifluoroborate, benzofurazan-5-trifluoroborate, pyrimidine-5-trifluoroborate, pyridine-3-trifluoroborate, and 2,5-dimethylthiophene-3-trifluoroborate. Other examples include anions such as bis(trifluoromethanesulfonyl)imide, heptafluorobutyrate, hexafluoroantimonate, hexafluoroarsenate, hexafluorophosphate, and tetrafluoroborate.

In one preferred embodiment, the dopant comprises silver tetrakis(pentafluorophenyl)-borate, and is represented by:

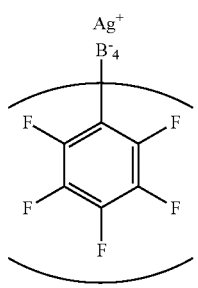

The anion TPFB is known in the art. See, for example, Hijazi et al., *European J. Inorganic Chemistry*, 2008, 18, 2892-2898; Ogawa et al., *Organometallics*, 2005, 24(20), 4842-4844; Kuprat et al., *Organometallics*, 2010, 29(6), 1421-1427 (suggesting AgTPFB is less stable than LiTPFB). TPFB can complex with a variety of cations, including monovalent and divalent cations, and can also be coordinated or complexed with polar and nonpolar ligands such as acetonitrile, methylene chloride, diethyl ether, pentane, benzene, or toluene. In particular, two acetonitrile ligands can be part of the TPFB complex.

In one embodiment, the dopant may be a silver salt, such as silver tetrakis(pentafluorophenyl)borate. Silver ions may undergo electron transfer to or from silver metal and the conducting polymer. See, for example, Lebedev et al., *Chem. Mater.*, 1998, 10, 156-163.

In the final formulation, the composition can be distinctly different from the combination of original components.

Some embodiments allow for removal of reaction byproducts from the doping process. For example, the metals such as silver can be removed by filtrations.

In one embodiment, cations such as iodonium salts and other dopant cations described in EP 1725079 and/or US 2007/0207341 can be excluded from the compositions. In one embodiment, anions can be excluded such as, for example, anions which are not wholly aromatic anions such as, for example, $[BE_4]$, $[PF_6]$, and bis(trifluoromethanesulfonimide). These anions, however, can be used in some embodiments in smaller quantities to reduce resistivity while maintaining a good hole injection.

An additional embodiment for dopant comprises the compounds and salts, including anions, found in U.S. Pat. No. 7,785,740 ("Overcharge Protection for Electrochemical Salts"), which is incorporated by reference herein in its entirety. $M_aQ$ overcharge protection salts are described comprising (as Q) borate and heteroborate clusters, wherein M are cations and a can be an integer like 1 or 2. In additional embodiments, anions of salts can be represented as $(B_{10}F_xZ_{10-x})^{2-}$ and $(B_{12}F_xZ_{12-x})^{2-}$ wherein Z can represent H, Cl, Br, or OR, where R can be, for example, H, $C_{1-8}$ alkyl or fluoroalkyl, or $C_{1-3}$ alkyl or fluoroalkyl. The value for x can be, for example, 4-12, or 7-12, or 7-11. Mixtures of salts can be used.

Combining the First Compound with the Ionic Dopant

In one embodiment, the first compound, while in its neutral form, can be combined with the ionic dopant in a first solvent system to provide a first doped reaction product. The ionic dopant comprises a cation and an anion. This combination can produce a neutral form of the cation. For example, a metal cation can be converted to a metal zero state. As a result of combination, particles and/or nanoparticles can be formed. The first doped reaction product can comprise an oxidized form of the first compound and the anion.

The combining step can be carried out in conditions for which temperature and pressure and solvent are controlled as known in the art. For example, the temperature can be, for example, 0° C. to 50° C. Ambient temperatures can be used, e.g., 20° C. to 30° C. Atmospheric pressure can be used. If desired, light or UV light can be excluded.

First Solvent System

The first solvent system can be adapted to solubilize the first compound, and the first ionic dopant, and allow for reaction between these reactants. The first solvent system can be partially or totally removed after the doping reaction is complete.

Aqueous and non-aqueous solvent systems can be used. In one embodiment, the first solvent system comprises at least 90 wt. % organic solvent, or at least 95 wt. % organic solvent, or at least 99 wt. % organic solvent. In one embodiment, water is present at less than 1 wt. %, or less than 0.1 wt. %, or less than 0.01 wt. %. More than one solvent can be present in the first solvent system if desired.

Typically, the solvents used are organic non-aqueous solvents. More typically, the solvents used are aprotic non-aqueous solvents. Use of aprotic non-aqueous solvents can provide, in at least some examples, the additional benefit of increased life-times of devices with emitter technologies which are sensitive to protons. Examples of such devices include PHOLEDs.

In one embodiment, the solvent is free of oxygen. In one embodiment, the solvent is free of protons as found in, for example, an ROH compound (alcohol).

Halogenated solvent can be used including dichloromethane. Common solvents used in the present solvent system include, for example, aromatic. Solvents such as tetrahydrofuran, chloroform, dichloromethane, or aromatic hydrocarbons forms are used. Additional solvents include tetrahydropyran (THP), chloroform, alkylated benzenes, halogenated benzenes, NMP, DMF, DMAc, DMSO, methyl ethyl ketone, cyclohexanone, chloroform, dichloromethane, acetonitrile, acetone, THF, dioxane, dioxanes, ethyl acetate, ethyl benzoate, dimethyl carbonate, ethylene carbonate, propylene carbonate, 3-methoxypropionitrile, 3-ethoxypropionitrile or combinations thereof. The conjugated polymer is typically highly soluble and highly processable in these solvents.

For environmental compliance, one or more nonhalogenated solvents may be selected. Halogenated solvents can be substantially or totally excluded (e.g., used in less than 10%, or less than 5%, or less than 1%, or less than 0.1% by volume of total solvent carrier. In weighing such additional factors, it may be helpful to consult references such as, for example, Chereinisnoff, N. P, *Industrial Solvents Handbook, 2nd* Ed. (Marcel Dekker, New York, 2003); Ash, M, *Handbook of Solvents, 2nd* Ed. (Syapse Information Resources, 2003); Wypych, G., *Handbook of Solvents* (Chemical) (Noyes Publications, 2000); Hansen, C. M., Durkee, J. and Kontogeorgis, G, *Hansen Solubility Parameters: A User's Handbook* (Taylor and Francis, 2007); all of which are incorporated by reference in their entireties. For a more detailed discussion regarding selection of solvent systems comprising two or more solvents, see U.S. 61/090,464, filed Aug. 20, 2008, (see also US Patent Publication 2010/0043876) which is incorporated by reference in its entirety.

Alternatively, it may be useful to select more than one solvent to use in the solvent system.

Solvents to be considered may include ethers (optionally substituted with $C_1$-$C_{10}$ alkyl chains) such as anisole, ethoxybenzene, dimethoxy benzenes and glycol ethers, such as: ethylene glycol diethers such as 1,2-dimethoxy ethane, 1,2-diethoxy ethane, 1,2-dibutoxy ethane; diethylene glycol diethers such as diethylene glycol dimethyl ether, diethylene glycol diethyl ether; propylene glycol diethers such as propylene glycol dimethyl ether, propylene glycol diethyl ether, propylene glycol dibutyl ether; dipropylene glycol diethers such as dipropylene glycol dimethyl ether, dipropylene glycol diethyl ether, dipropylene glycol dibutyl ether; also, higher analogs (tri- and tetra-) of the ethylene glycol and propylene glycol ethers mentioned above.

Still other solvents can be considered, such as ethylene glycol monoether acetates and propylene glycol monoether acetates, wherein the ether can be selected, for example, from: methyl, ethyl, n-propyl, iso-propyl, n-butyl, sec-butyl, tert-butyl, cyclohexyl. Also, higher glycol ether analogs of above list such as di-, tri- and tetra-. Examples include, but are not limited to, propylene glycol methyl ether acetate, 2-ethoxyethyl acetate, 2-butoxyethyl acetate.

Yet other possible solvents include aliphatic and aromatic ketones such as acetonyl acetone, methyl isobutyl ketone, methyl isobutenyl ketone, 2-hexanone, 2-pentanone, acetophenone, ethyl phenyl ketone, cyclohexanone, cyclopentanone, methylethyl ketone. In some embodiments, these solvents are avoided. In some embodiments, ketones with protons on the carbon located alpha to the ketone are avoided such as cyclohexanone, methylethylketone, and acetone.

Additional possible solvents include polar solvents such as N,N-dimethyl formamide, N,N-dimethyl acetamide, N-methylpyrrolidone, dimethyl sulfoxide, tetramethylene sulfoxide, and the like. Other examples include cyclic ethers such as, for example, tetrahydropyran (THP). Solvent can be used such that polymerization of the solvent can be avoided such as 1,3-dioxolane, THF. Other examples are nitrile solvents such as 3-methoxyproprionitrile, 3-ethoxypropionitrile, 3-proplyoxypropionitrile, 3-butoxypropionitrile, benzonitrile, acetonitrile. Yet other solvents are carbonates such as ethylene carbonate, dimethylcarbonate, diethylcarbonate, propylene carbonate.

A preferred group of solvents is toluene, xylene(s), tetralene, mesitylene, phenetole, 4-methylanisole, anisole, tetrahydropyran, 3-methoxypropionitrile, 3-ethoxypropionitrile, methyl benzoate, ethyl benzoate, butyl benzoate, propyleneglycolmethyl ether acetate, 1,2-dimethoxyethane, and diethyleneglycoldiethylether, and combinations thereof. Other preferred solvent combinations are shown in the working examples section including dichloromethane.

Isolating the First Doped Reaction Product

The first doped reaction product can be subjected to purification processes including isolated in solid form. For example, solvent can be partially or totally removed. The neutral form of the cation, for example, can be removed from the first doped reaction product. This might mean removal of particles and nanoparticles of metal. Methods for removal include, for example, filtration. In addition, one can add larger particles and collect the particles.

In particular, metal may be scavenged from the first reaction product, for example, by passing through a bed of celite or at least one glass fiber filter (stacked or unstacked; 0.5 micron). For example, about 50 mL of the dopant in solution may be passed through a celite bed (packed dry; 26 mm diameter, 15 mm thick) in a glass syringe. Slight pressure may be applied to increase the solution flow rate. In another embodiment, metal powder can be used to precipitate the product free metal onto the powder to make the purification process more effective. The oxidized hole transport material can be isolated and provided in the form of a solid, such as a powder.

The neutral form of the cation (e.g., zero valent metal or silver metal) can be removed so that it is present in very low amounts such as, for example, less than 1 wt. %, or less than 0.1 wt. %, or less than 0.01 wt. %.

The work function for the first reaction product can be larger, more negative than the work function for the conjugated polymer. For example, it can be from −4.7 eV to −6 eV. Particular values include, for example, −5.1 eV, −5.2 eV, −5.3 eV, −5.4 eV, −5.5 eV, −5.6 eV, −5.7 eV, −5.8 eV, and larger, more negative values.

Work function can be measured by methods such as AC-2 instrumentation (Riken-Keiki).

Conjugated Polymers

In addition, a conjugated polymer can be provided which has a neutral form and an oxidized form. This conjugated polymer can be combined with the isolated first doped reaction product in a second solvent system to form a second doped reaction product. The conjugated polymer and the first compound are different.

The conjugated polymer can have a number average molecular weight of, for example, at least 5,000 g/mol, or at least 10,000 g/mol, or at least 20,000 g/mol.

The work function for the conjugated polymer can be, for example, −4.2 eV to −6.0 eV, or −4.9 eV to −5.6 eV.

The work function for the conjugated polymer can be, for example, at least 0.3 eV, 0.5 eV, 0.8 eV, or at least 0.9 eV, or at least 1.0 eV, or at least 1.1 eV, or at least 1.2 eV, or at least 1.3 eV, less negative than the work function of the first doped reaction product (e.g., −4.3 eV being 1.3 eV less negative than −5.6 eV for the first doped reaction product.

Conjugated polymers are known in the art including their use in organic electronic devices. See for example Friend, "Polymer LEDs," *Physics World*, November 1992, 5, 11, 42-46; see for example Kraft et al., "Electroluminescent Conjugated Polymers-Seeing Polymers in a New Light," *Angew. Chem. Int. Ed.* 1998, 37, 402-428. In addition, electrically conductive or conjugated polymers are described in *The Encyclopedia of Polymer Science and Engineering*, Wiley, 1990, pages 298-300, including polyacetylene, poly(p-phenylene), poly(p-phenylene sulfide), polypyrrole, and polythiophene, including families of these polymers and derivatives in these polymer systems, which is hereby incorporated by reference in its entirety. This reference also describes blending and copolymerization of polymers, including block copolymer formation.

Conjugated polymers are described in, for example, U.S. Pat. No. 8,017,241 and US Patent Publications 2006/0078761; 2006/0175582; and 2009/0256117 (assignee: Plextronics).

The conjugated polymer can be any conjugated polymer, including polythiophenes, and can be homopolymers, copolymers, or block copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, 2$^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are further described, for example, in Roncali, J., *Chem. Rev.* 1992, 92, 711; Schopf et al., *Polythiophenes: Electrically Conductive Polymers*, Springer: Berlin, 1997. See also for example U.S. Pat. Nos. 4,737,557 and 4,909,959.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Conjugated polymers can be, for example, copolymers including block copolymers. Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -(AB)$_n$-multiblock copolymers (chapter 7), which can form the basis of block copolymer types in the present invention.

Additional block copolymers, including polythiophenes, are described in, for example, Francois et al., *Synth. Met.* 1995, 69, 463-466, which is incorporated by reference in its entirety; Yang et al., *Macromolecules* 1993, 26, 1188-1190; Widawski et al., *Nature* (London), vol. 369, Jun. 2, 1994, 387-389; Jenekhe et al., *Science*, 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804.

Substituents which can be used to solubilize conducting polymers with side chains include alkoxy and alkyl including for example $C_1$ to $C_{25}$ groups, as well as heteroatom systems which include for example oxygen and nitrogen. In particular, substituents having at least three carbon atoms, or it least five carbon atoms can be used. Mixed substituents can be used. The substituents can be nonpolar, polar or functional organic substituents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Conjugated polymers can comprise heterocyclic monomer repeat units, and heterocyclic polymers are particularly preferred. A particularly preferred system is the polythiophene system, regioregular polythiophene system, the 3-substituted polythiophene system, and the 3,4-disubstituted polythiophene system. In some embodiments, the conjugated polymer comprises at least one polythiophene comprising an alkoxy substituent at either the 3-position or the 4 position or both. Alkoxy groups can comprise an oxygen atom linking the group to the polythiophene backbone, as well as optionally comprise additional heteroatoms like oxygen in the group (e.g., polyether side groups). Polymers can be obtained from Plextronics, Inc., Pittsburgh, Pa. including for example polythiophene-based polymers such as for example PLEXCORE, Plexcoat, and similar materials.

3-Substituted Polythiophenes

One important example of a conjugated polymer, and formulations and devices using the polymer, is a 3-substituted polythiophene, including homopolymers and copolymers. Preferable, the 3-substituted polythiophene may be a poly(3-alkoxythiophene). In a poly(3-alkoxythiophene), as used herein, the alkoxy side group is bonded to the thiophene via the oxygen atom and additional atoms can be present in the substituent such that the alkoxy group can be, for example, a polyether. For example, as used herein, an alkoxy group can be, for example, a methoxyethoxyethoxy group.

The conjugated polymer can be a regiorandom or a regioregular material. The degree of regioregularity can be, for example, about 0 to 100%, or about 25 to 99.9%, or about 50 to 98%.

In particular, another important example of a conjugated polymer, and formulations and devices using the polymer, is a regioregular polythiophene. Preferably, regioregularity of the polythiophene may be, for example, at least about 85%, or at least about 95%, or at least about 98%. In some embodiments, the degree of regioregularity can be at least about 70%, or at least about 80%. In yet other embodiments, the regioregular polythiophene has a degree of regioregularity of at least about 90%, or a degree of regioregularity of at least about 98%.

One example of a poly(3-alkoxythiophene) can be represented by:

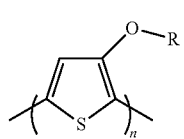

where R can be, for example, $(CH_2CH_2O)_2C_4H_9$-n ("rr-PBEETh"), or $(CH_2CH_2CH_2O)_2C_4H_9$-n ("rr-PDBEPTh"), or $(CH_2CH_2O)_2CH_3$ (rr-PMEET), or $(CH_2CH_2O)_3C_2H_5$.

The degree of polymerization, 'n' is not particularly limited but can be for example 2 to 500,000 or 5 to 100,000 or 10 to 10,000, or 10 to 1,000, 10 to 500, or 10 to 100. In many cases, and polymer has a number average molecular weight between approximately 5,000 and 100,000 g/mol. As known in the art, n can be an average number representing a statistical distribution of chain lengths. Minor amounts of other monomers can be also present in the chain so that copolymers are used.

3,4-Disubstituted Polythiophenes

One important example of a conjugated polymer, and formulations and devices using the polymer, is a 3,4-disubstituted polythiophene, including homopolymers and copolymers. Preferably, the 3,4-disubstituted polythiophene may be a poly(3,4-dialkoxythiophene) wherein as described above the alkoxy side group can comprise a plurality of heteroatoms, and the poly(3,4-dialkoxythiophene) can be, for example, a poly(3,4-di-polyether)-thiophene. A polyether is a molecule with more than one ether group. The alkoxy and polyether side groups can donate electrons to the polymer backbone chain.

The 3,4-disubstituted polythiophene may have a symmetrical monomer repeating unit. Often times, the 3,4-disubstituted polythiophene comprises a 3,4-substituted thiophene as the repeating unit, with an oxygen atom directly attached to the 3- and 4-positions of the disubstituted thiophene and polymerized through the 2- and 5-positions. Substituents can be used to solubilize the 3,4-substituted thiophene with side chains that can include alkoxy and polyether, including for example, straight or branched carbon chains, for example, $C_1$ to $C_{25}$ groups, wherein one, two, three, four, five, or six of the carbon atoms in the chains may be replaced by heteroatoms, such as, oxygen and/or nitrogen.

The conjugated polymer may be prepared by polymerization of a monomer unit, such as 2,5-dibromo-3,4-bis(2-(2-butoxyethoxy)ethoxy)thiophene, or 2,5-dibromo-3,4-bis(2-(2-ethoxyethoxy)ethoxy)thiophene; 2,5-dibromo-3,4-bis(2-(2-methoxyethoxy)ethoxy)thiophene; 2,5-dibromo-3,4-bis(2-(2-butoxyethoxy)ethoxy)thiophene; 2,5-dibromo-3,4-bis(2-(2-butoxybutoxy)butoxy)thiophene; and 2,5-dibromo-3,4-bis(2-(2-methoxymethoxy)methoxy)thiophene.

Any known methods of polymerization may be used to obtain the 3,4-disubstituted polythiophene. Typically, the polymer itself can be obtained by GRIM polymerization of the 2,5-dibromo derivative of the dialkoxythiophene or dipolyetherthiophene using a Nickel catalyst.

GRIM polymerization of a symmetrical monomer is described in, for example, Campos et al., *Photovoltaic Activity of a PolyProDOT Derivative in a Bulk Heterojunction Solar Cell*, Solar Energy Materials & Solar Cells, August 2006.

The conjugated polymer can be a 3,4-disubstituted polythiophene, such as poly(3,4-bis(2-(2-butoxyethoxy)ethoxy)thiophene)-2,5-diyl, poly(3,4-bis(2-(2-ethoxyethoxy)ethoxy)thiophene)-2,5-diyl; poly(3,4-bis(2-(2-methoxyethoxy)ethoxy)thiophene)-2,5-diyl; poly(3,4-bis(2-(2-butoxyethoxy)ethoxy)thiophene)-2,5-diyl; poly(3,4-bis(2-(2-butoxybutoxy)butoxy)thiophene)-2,5-diyl; and poly(3,4-bis(2-(2-methoxymethoxy)methoxy)thiophene)-2,5-diyl.

Typically, the conjugated polymer can be a 3,4-disubstituted polythiophene represented by:

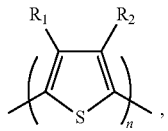

wherein independently $R_1$ can be an optionally substituted alkoxy group or an alkoxy heteroatom group, such as, for example, an alkoxyalkoxyalkoxy moiety, and independently $R_2$ can be an optionally substituted alkoxy group alkoxy heteroatom group, such as, for example, an alkoxyalkoxyalkoxy moiety; or wherein independently $R_1$ can be optionally substituted alkyl, and optionally substituted aryloxy, and independently $R_2$ can be optionally substituted alkyl, and optionally substituted aryloxy. Examples of substituents for the optional substitution include hydroxyl, phenyl, and additional optionally substituted alkoxy groups. The alkoxy groups can be in turn optionally substituted with hydroxyl, phenyl, or alkoxy groups; or wherein independently $R_1$ can be an optionally substituted alkylene oxide, and independently $R_2$ can be an optionally substituted alkylene oxide. Substituents can be for example hydroxyl, phenyl, or alkoxy groups; or wherein independently $R_1$ can be optionally substituted ethylene oxide or optionally substituted propylene oxide or other lower alkyleneoxy units, and independently $R_2$ can be optionally substituted ethylene oxide or optionally substituted propylene oxide or other lower alkyleneoxy units. Substituents can be for example hydroxyl, phenyl, or alkoxy groups; or wherein independently $R_1$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy, and independently $R_2$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy.

In addition, the substituent groups $R_1$ and $R_2$ can be linked to the thiophene by an oxygen atom such as alkoxy or phenoxy, wherein the substituent can be characterized by the corresponding alcohol or phenol, respectively. The alcohol, for example, can be linear or branched, and can have C2-C20, or C4-C18, or C6 to C14 carbon atoms. The alcohol can be for example an alkyl alcohol, or an ethylene glycol, or a propylene glycol, or a diethylene glycol, or a dipropylene glycol, or a tripropylene glycol. Additional examples can be monoethylene glycol ethers and acetates, diethylene glycol ethers and acetates, triethylene glycol ethers and acetates, and the like. Examples of alcohols which can be linked to the thiophene ring through the oxygen atom include hexyl cellosolve, Dowanol PnB, ethyl carbitol, Dowanol DPnB, phenyl carbitol, butyl cellosolve, butyl carbitol, Dowanol DPM, diisobutyl carbinol, 2-ethylhexyl alcohol, methyl isobutyl carbinol, Dowanol Eph, Dowanol PnP, Dowanol PPh, propyl carbitol, hexyl carbitol, 2-ethylhexyl carbitol, Dowanol DPnP, Dowanol TPM, methyl carbitol, Dowanol TPnB. The trade names are well known in this art. Polythiophene substituents, including various alkoxy and polyether substituents, and formulations are described in for example U.S. patent application Ser. No. 11/826,394 filed Jul. 13, 2007 (US publication 2008/0248313).

One example of the 3,4 disubstituted polythiophene can be represented by:

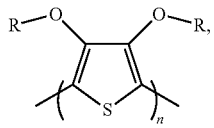

where R can be represented by —(CH$_2$CH$_2$O)$_2$Bu-n.

The degree of polymerization, 'n' for the structures shown above is not particularly limited but can be for example 2 to 500,000 or 5 to 100,000 or 10 to 10,000, or 10 to 1,000, to 500, or 10 to 100. As known in the art, n can be a statistical average. In many cases, and polymer has a number average molecular weight between approximately 5,000 and 100,000 g/mol. In some embodiments, R can be a monoalkoxy, dialkoxy, trialkoxy, or tetraalkoxy group and the conjugated polymer is a poly(3,4-dialkoxythiophene) or poly(3,4-dipolyetherthiophene).

An example of side groups is the butoxyethoxy(ethoxy) group and the polymer can be poly(3,4-bis(2-(2-butoxyethoxy)ethoxy)thiophene-2,5-diyl).

In one embodiment, R$_1$ and R$_2$ can be (CH$_2$CH$_2$O)$_2$Bu-n ("PDBEETh").

In one embodiment, R$_1$ and R$_2$ can form a bridging unit (e.g., can form a ring) as found for PEDOT used in PEDOT/PSS. The bridging unit can be, for example, —O—BG-O— wherein BG is an optionally substituted bridging group such as, for example, —[CH$_2$]$_2$— or —[CH$_2$]$_3$—.

In one embodiment, R$_1$ and R$_2$ do not form a bridging group. They do not form a ring.

In another embodiment, the conjugated polymer can be a copolymers comprising repeat units comprising 3,4-disubstituted thiophenes, with oxygen atoms at the 3- and 4-positions linking substituents to the thiophene ring, and with carbon-carbon linkages at the 2- and 5-positions to adjoining repeat units. Substituents can be used to solubilize the 3,4-substituted thiophene with side chains that can include alkoxy and polyether, including for example, straight or branched carbon chains, for example, C$_1$ to C$_{25}$ groups, wherein one, two, three, four, five, or six of the carbon atoms in the chains may be replaced by heteroatoms, such as oxygen and/or nitrogen and/or sulfur. The 3,4-disubstituted polythiophene may have a symmetrical monomer repeating unit. Note that that the substituents at the 3- and 4-positions of the ring may be connected to each other via covalent bonds, as would be the case in the example of a 3,4-ethylenedioxy substitution. Examples of substituents are provided in, for example, U.S. patent application Ser. No. 12/422,159, filed Apr. 10, 2009 to Brown et al. (PCT/US09/040,257), and US Provisional Application Ser. No. 61/119,239, filed Dec. 2, 2008 to Brown et al., both of which are incorporated herein by reference in their entirety.

An example of such a copolymer is the alternating copolymer represented by:

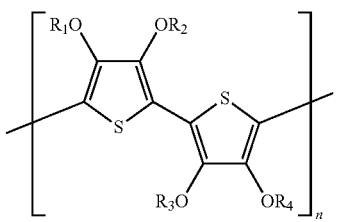

where n represents the number of times the bracketed moiety is repeated in the chain; independently R$_1$ comprises alkyl, optionally substituted alkyl, alkenyl, optionally substituted alkenyl, alkynyl, optionally substituted alkynyl, aryl, optionally substituted aryl; independently R$_2$ comprises alkyl, optionally substituted alkyl, alkenyl, optionally substituted alkenyl, alkynyl, optionally substituted alkynyl, aryl, optionally substituted aryl; independently R$_3$ comprises alkyl, optionally substituted alkyl, alkenyl, optionally substituted alkenyl, alkynyl, optionally substituted alkynyl, aryl, optionally substituted aryl; and independently R$_4$ comprises alkyl, optionally substituted alkyl, alkenyl, optionally substituted alkenyl, alkynyl, optionally substituted alkynyl, aryl, optionally substituted aryl. R$_1$ and R$_2$ may be connected by covalent bonds. R$_3$ and R$_4$ may be connected by covalent bonds.

Another example of such a copolymer is the alternating copolymer represented by:

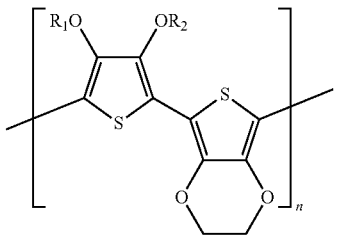

where n represents the number of times the bracketed moiety is repeated in the chain; independently R$_1$ comprises alkyl, optionally substituted alkyl, alkenyl, optionally substituted alkenyl, alkynyl, optionally substituted alkynyl, aryl, optionally substituted aryl; and independently R$_2$ comprises alkyl, optionally substituted alkyl, alkenyl, optionally substituted alkenyl, alkynyl, optionally substituted alkynyl, aryl, optionally substituted aryl. R$_1$ and R$_2$ may be connected by covalent bonds.

Yet another example of such a copolymer is the random copolymer represented by:

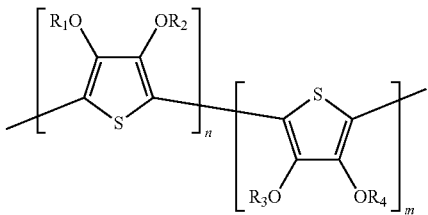

where n represents the number of times the first bracketed moiety appears in the chain and m represents the number of times the second bracketed moiety appears in the chain; independently R$_1$ comprises alkyl, optionally substituted alkyl, alkenyl, optionally substituted alkenyl, alkynyl, optionally substituted alkynyl, aryl, optionally substituted aryl; independently R$_2$ comprises alkyl, optionally substituted alkyl, alkenyl, optionally substituted alkenyl, alkynyl, optionally substituted alkynyl, aryl, optionally substituted aryl; independently R$_3$ comprises alkyl, optionally substituted alkyl, alkenyl, optionally substituted alkenyl, alkynyl, optionally substituted alkynyl, aryl, optionally substituted aryl; and independently R$_4$ comprises alkyl, optionally substituted alkyl, alkenyl, optionally substituted alkenyl, alkynyl, optionally substituted alkynyl, aryl, optionally substituted aryl. R$_1$ and R$_2$ may be connected by covalent bonds. R$_3$ and R$_4$ may be connected by covalent bonds.

Still another example of such a copolymer is the random copolymer represented by:

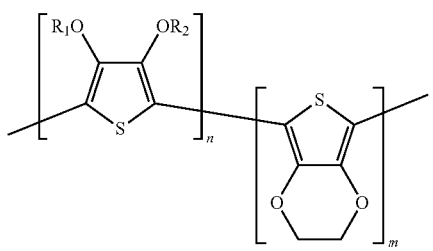

where n represents the number of times the first bracketed moiety appears in the chain and m represents the number of times the second bracketed moiety appears in the chain; independently R$_1$ comprises alkyl, optionally substituted alkyl, alkenyl, optionally substituted alkenyl, alkynyl, optionally substituted alkynyl, aryl, optionally substituted aryl; and independently R$_2$ comprises alkyl, optionally substituted alkyl, alkenyl, optionally substituted alkenyl, alkynyl, optionally substituted alkynyl, aryl, optionally substituted aryl. R$_1$ and R$_2$ may be connected by covalent bonds.

In some embodiments, copolymers comprise at least one first thiophene monomer and at least one second thiophene monomer, each with oxygen atoms at the 3- and 4-positions linking substituents to the thiophene ring, where the substituents on the first thiophene monomer comprise chains of at least five carbons or heteroatoms and where the substituents on the second thiophene monomer comprise chains of fewer than five carbons or heteroatoms.

In another embodiment, the conjugated polymer can be a co-polymer of mono- and/or di-alkoxythiophenes. In one embodiment, the co-polymer is constituted of alkoxythiophene units described herein. For example, the alkoxythiophenes can be one or more of those described in PCT/US2010/061024 to V. Seshadri et al., which is hereby incorporated by reference. In another embodiment, the co-polymer is constituted of alkoxythiophene units described herein and/or known in the art. In another embodiment, the homo and/or co-polymer comprises or consists of one or more monomeric subunit represented by the following:

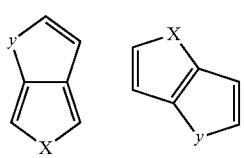

-continued

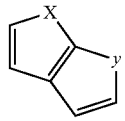

wherein X and Y are independently selected from S, O, N, Se and Te. R1 and R2 are H, optionally substituted.

Combining Conjugated Polymer and Isolated First Doped Reaction Product

The isolated first doped reaction product can be combined with the conjugated polymer in neutral form in a second solvent system to form a second doped reaction product comprising an oxidized form of the conjugated polymer and the anion. Reaction conditions such as temperature and pressure can be controlled as known in the art, and ambient temperatures and atmospheric pressure can be used.

In addition, this doping produces a neutral form of the first compound. The first compound, formed with doping of the conjugated polymer, can be removed if desired.

The work function of the oxidized form of the conjugated polymer, after doping, can be larger, more negative than the conjugated polymer. The increase to become a larger, more negative number can be, for example, at least about 0.5 eV, or at least about 0.6 eV, or at least about 0.7 eV change, or at least about 0.8 eV change, or at least about 1.1 eV change.

Second Solvent System

The second solvent system can be adapted to solubilize the conjugated polymer and the isolated first doped reaction product, and allow for a doping reaction to occur. In addition, the second solvent system can be adapted for subsequent ink formation and use in forming films from the ink.

The second solvent system can be different from the first solvent system. For example, it can be a lighter boiling solvent system (e.g., lower boiling points, and easier to boil) for a spin coatable formulation. Or, it could a low volatility solvent to suit ink jet application or slot-die coating, for example.

Aqueous and non-aqueous solvent systems can be used as the second solvent system. In one embodiment, the second solvent system comprises at least 90 wt. % organic solvent, or at least 95 wt. % organic solvent, or at least 99 wt. % organic solvent. In one embodiment, water is present in the second solvent system at less than 1 wt. %, or less than 0.1 wt. %, or less than 0.01 wt. %.

In one embodiment, the second solvent system comprises at least two solvents, wherein a first solvent is present in more than 50 wt. %, and the second solvent is present in less than 50 wt. %. If only two solvents are used, the total amount is 100 wt. %. For example, the amount of the first solvent can be about 50 wt. % to about 90 wt. %, or about 60 wt. % to about 70 wt. %. For example, the amount of the second solvent can be about 10 wt. % to about 50 wt. %, or about 30 wt. % to about 40 wt. %.

In one embodiment, an aromatic solvent such as o-xylene or anisole (first solvent) is mixed with a polar solvent like 3-methoxypropionitrile (second solvent).

Different, multiple solvents can be used in the second solvent system. Typically, the solvents used are organic non-polar solvents. More typically, the solvents used are aprotic non-polar solvents. Use of aprotic non-polar solvents can provide, in at least some examples, the additional benefit of increased life-times of devices with emitter technologies which are sensitive to protons. Examples of such devices include PHOLEDs.

Common solvents used in the present solvent system include, for example, aromatic. Solvents such as tetrahydropyran, chloroform, or aromatic hydrocarbons forms are used. Additional solvents include tetrahydropyran (THP), chloroform, alkylated benzenes, halogenated benzenes, NMP, DMF, DMAc, DMSO, methyl ethyl ketone, cyclohexanone, chloroform, dichloromethane, acetonitrile, acetone, THF, dioxane, dioxanes, ethyl acetate, ethyl benzoate, dimethyl carbonate, ethylene carbonate, propylene carbonate, 3-methoxypropionitrile, 3-ethoxypropionitrile or combinations thereof. The conjugated polymer is typically highly soluble and highly processable in these solvents.

For environmental compliance, one or more nonhalogenated solvents may be selected. Halogenated solvents can be substantially or totally excluded (e.g., used in less than 10%, or less than 5%, or less than 1%, or less than 0.1% by volume of total solvent carrier. In weighing such additional factors, it may be helpful to consult references such as, for example, Chereinisnoff, N. P, *Industrial Solvents Handbook*, $2^{nd}$ Ed. (Marcel Dekker, New York, 2003); Ash, M, *Handbook of Solvents*, $2^{nd}$ Ed. (Syapse Information Resources, 2003); Wypych, G., *Handbook of Solvents* (Chemical) (Noyes Publications, 2000); Hansen, C. M., Durkee, J. and Kontogeorgis, G, *Hansen Solubility Parameters: A User's Handbook* (Taylor and Francis, 2007); all of which are incorporated by reference in their entireties. For a more detailed discussion regarding selection of solvent systems comprising two or more solvents, see U.S. 61/090,464, filed Aug. 20, 2008, (043419-0256) which is incorporated by reference it its entirety.

Solvents to be considered may include ethers (optionally substituted with C1-C10 alkyl chains) such as anisole, ethoxybenzene, dimethoxy benzenes and glycol ethers, such as: ethylene glycol diethers such as 1,2-dimethoxy ethane, 1,2-diethoxy ethane, 1,2-dibutoxy ethane; diethylene glycol diethers such as diethylene glycol dimethyl ether, diethylene glycol diethyl ether; propylene glycol diethers such as propylene glycol dimethyl ether, propylene glycol diethyl ether, propylene glycol dibutyl ether; dipropylene glycol diethers such as dipropylene glycol dimethyl ether, dipropylene glycol diethyl ether, dipropylene glycol dibutyl ether; also, higher analogs (tri- and tetra-) of the ethylene glycol and propylene glycol ethers mentioned above.

Still other solvents can be considered, such as ethylene glycol monoether acetates and propylene glycol monoether acetates, wherein the ether can be selected, for example, from: methyl, ethyl, n-propyl, iso-propyl, n-butyl, sec-butyl, tert-butyl, cyclohexyl. Also, higher glycol ether analogs of above list such as di-, tri- and tetra-. Examples include, but are not limited to, propylene glycol methyl ether acetate, 2-ethoxyethyl acetate, 2-butoxyethyl acetate.

Yet other possible solvents include aliphatic and aromatic ketones such as acetonyl acetone, methyl isobutyl ketone, methyl isobutenyl ketone, 2-hexanone, 2-pentanone, acetophenone, ethyl phenyl ketone, cyclohexanone, cyclopentanone, methylethyl ketone. In some embodiments, these solvents are avoided. In some embodiments, ketones with protons on the carbon located alpha to the ketone are avoided such as cyclohexanone, methylethylketone, and acetone.

Additional possible solvents include polar solvents such as N,N-dimethyl formamide, N,N-dimethyl acetamide, N-methylpyrrolidone, dimethyl sulfoxide, tetramethylene sulfoxide, and the like.

Other examples include cyclic ethers such as, for example, tetrahydropyran (THP). Solvent can be used such that polymerization of the solvent can be avoided such as can happen for 1,3-dioxolane, THF.

Other examples are nitrile solvents such as 3-methoxyproprionitrile, 3-ethoxypropionitrile, 3-proplyoxypropionitrile, 3-butoxypropionitrile, benzonitrile, acetonitrile.

Yet other solvents are carbonates such as ethylene carbonate, dimethylcarbonate, diethylcarbonate, propylene carbonate.

A preferred group of solvents is toluene, xylene(s), tetralene, mesitylene, phenetole, 4-methylanisole, anisole, tetrahydropyran, 3-methoxypropionitrile, 3-ethoxypropionitrile, methyl benzoate ethyl benzoate, butyl benzoate, propyleneglycolmethyl ether acetate, 1,2-dimethoxyethane, and diethyleneglycoldiethylether, and combinations thereof. Other preferred solvent combinations are shown in the working examples section including dichloromethane.

Formulation of Inks and Optional Matrix Materials

The second doped reaction product can be used for hole transport and injection applications. Inks can be formulated to make HIL and HTL films. For example, as desired, one or more optional matrix materials can be also used with or mixed into the second doped reaction product. The optional matrix material can be soluble in the second solvent system. The solvent system can be adapted, and additional additives can be used. Matrix materials are described in, for example, US Patent Publications 2010/0072462; 2010/0108954; 2010/0109000; 2009/0230361; and 2010/0292399 (assignee: Plextronics).

In at least one embodiment, a matrix material may be incorporated into a composition for forming a transparent hole injection layer (HIL) or hole transport layer (HTL). Transmission of light is important, and good transmission at higher film thicknesses is particularly important. For example, an HIL or HTL can be prepared that can transmit about 85% to about 90% or greater (i.e., % T>85-90%) of light having a wavelength of about 400-800 nm.

In one embodiment, the HIL layer has a thickness of, for example, about 5 nm to about 500 nm, or about 5 nm to about 150 nm, or about 20 nm to about 100 nm, or about 20 nm to about 60 nm. Another range for thickness is, for example, about 60 nm to about 200 nm, or about 100 nm to about 200 nm.

Thus, an additional advantage of the present embodiments can be the formation of substantially transparent HILs or HTLs having moderately high thicknesses. Thick HILs or HTLs can also be used to eliminate shorts in semiconductor devices without adversely impacting operating voltage.

In some embodiments, the composition comprises at least one matrix material. The matrix material can be a lower or higher molecular weight material. The matrix material can be, for example, a synthetic polymer that is different from the conjugated polymer. See, for example, US Patent Publication No. 2006/0175582 published Aug. 10, 2006. The synthetic polymer can comprise, for example, a carbon backbone. In some embodiments, the synthetic polymer has at least one polymer side group comprising an oxygen atom or a nitrogen atom. The synthetic polymer may be a Lewis base. Typically, the synthetic polymer comprises a carbon backbone and has a glass transition temperature of greater than 25° C. The synthetic polymer may also be a semi-crystalline or crystalline polymer that has a glass transition temperature equal to or lower than 25° C. and a melting point greater than 25° C. The synthetic polymer may comprise acidic groups. Additionally, the conjugated polymer may comprise acidic groups. In some embodiments, both the conjugated polymer and the second polymer comprise acidic groups.

The matrix material, which can be the second polymer can be a planarizing agent. A matrix material or a planarizing agent may be comprised of, for example, a polymer or oligomer such as an organic polymer such as poly(styrene) or poly(styrene) derivatives, poly(vinyl acetate) or derivatives thereof, poly(ethylene glycol) or derivatives thereof, poly(ethylene-co-vinyl acetate), poly(pyrrolidone) or derivatives thereof (e.g., poly(1-vinylpyrrolidone-co-vinyl acetate)), poly(vinyl pyridine) or derivatives thereof, poly (methyl methacrylate) or derivatives thereof, poly(butyl acrylate), poly(aryl ether ketones), poly(aryl sulfones), poly (aryl ether sulfones), poly(esters) or derivatives thereof, or combinations thereof.

More generally, a matrix material or a planarizing agent can be comprised of polymers or oligomers built from monomers such as $CH_2CH$ Ar, where Ar=any aryl or functionalized aryl group, isocyanates, ethylene oxides, conjugated dienes, $CH_2CHR_1R$ (where $R_1$=alkyl, aryl, or alkyl/aryl functionalities and R=H, alkyl, Cl, Br, F, OH, ester, acid, or ether), lactam, lactone, siloxanes, and ATRP macroinitiators. A planarizing agent can also be a polymer comprising optionally substituted fused aromatic rings or optionally substituted polycyclic aromatic hydrocarbon side groups. Additionally, the hole-transporting compounds described below can also be planarizing agents.

In other embodiments, the matrix material or a planarizing agent may be comprised of, for example, at least one semiconducting matrix component. The semiconducting matrix component is different from the conjugated polymer described above. The semiconducting matrix component can be a semiconducting small molecule, such as a hole transporting compound, or a semiconducting polymer that is typically comprised of repeat units comprising hole transporting units in the main-chain and/or in a side-chain. The semiconducting matrix component may be in the neutral form or may be doped, and is typically soluble in organic solvents, such as toluene, chloroform, THF, acetonitrile, cyclohexanone, anisole, chlorobenzene, o-dichlorobenzene, ethyl benzoate and mixtures thereof.

Examples of semiconducting small molecules, hole transport materials, and polymers suitable for use as matrix components are described by Marks et al., in U.S. Patent Application Pub. No. 2005/0147846 A1, entitled "Hole Transport Layer Compositions and Related Diode Devices;" and by Mathai et al., in U.S. patent application Ser. No. 12/605,768 filed on Oct. 26, 2009, which are hereby incorporated by reference in their entireties.

Amounts

First Doping Reaction (Reaction of the First Compound with the Ionic Dopant)

In the first doping reaction, a full doping or a partial doping reaction can be carried out. For example, the molar ratio of dopant to the first molecule can be in excess, can be 3:1 or less, or 2:1 or less, or 1.5:1 or less. It can be at least 1:1.

Second Doping Reaction (Reaction of Conjugated Polymer with Isolated First Doped Reaction Product)

In one embodiment, the weight ratio of dopant to conjugated polymer is about 4:1 to about 0.5:1, or about 3:1 to about 1:1, or about 2.5:1 to about 1.5:1.

In one embodiment, the conjugated polymer can be doped in an amount of about 0.3 moles per repeat unit to about 0.4 moles per repeat unit.

In one embodiment, the conjugated polymer can be doped in an amount of about 0.2 moles per repeat unit to about 0.5 moles per aromatic ring, or about 0.3 moles per repeat unit to about 0.4 moles per aromatic ring.

In one embodiment, the weight amount of the conjugated polymer with respect to the solid content in the ink formulation is about 1 wt. % to about 20 wt. %, or about 3 wt. % to about 15 wt. %, or about 5 wt. % to about 12 wt. %.

In one embodiment, the weight amount of the dopant in the ink formulation with respect to the solid content is about 5 wt. % to about 50 wt. %, or about 10 wt. % to about 25 wt. %, or about 12 wt. % to about 20 wt. %.

In one embodiment, the weight amount of the matrix in the ink formulation with respect to the solid content is about 50 wt. % to about 99 wt. %, or about 60 wt. % to about 90 wt. %, or about 70 wt. % to about 80 wt %.

In one embodiment, the amount of solids content is about 0.1 wt. % to 100 wt. %, wherein 100 wt % represents a dry material such as a dry powder. In one embodiment, the solids content is about 0.3 wt. % to about 10 wt. %. In another embodiment, the solids content is about 0.5 wt. % to about 5 wt. %. In another embodiment, the solids content is about 1.0 wt. % to about 3.0 wt. %.

In one embodiment, a dry powder is prepared by removal of solvent. The result can be a dry or substantially dry material such as a powder. The amount of residual solvent can be, for example, 10 wt. % or less, or 5 wt. % or less, or 1 wt. % or less. The dry or substantially powder can be redispersed or redissolved in a new solvent system.

Materials can be purified to remove, for example, halogens and metals. Halogens include, for example, bromine and iodine. Metals include, for example, the cation of the dopant, including the reduced form of the cation of the dopant, or metals left from catalyst or initiator residues. Metals include, for example, silver, nickel, and magnesium. The amounts can be less than, for example, 500 ppm, or less than 250 ppm, or less than 100 ppm, or less than 10 ppm, or less than 1 ppm.

In particular, metal including silver can be removed. In one embodiment, the amount of metal (for example, silver) content can be, for example, 0-10% in dry powder, and/or 0-0.5% in solution. In another embodiment, the amount of metal (for example, silver) content can be, for example, 0-1% in dry powder, and/or 0-0.05% in solution. In another embodiment, the amount of metal (for example, silver) content can be, for example, 0-0.5% in dry powder, and/or 0-50 ppm in solution Metal content, including silver content, can be measured by ICP-MS or neutron activation analysis, particularly for concentrations greater than 50 ppm.

Unreacted dopant can be also present or removed, including unreacted cation, including unreacted silver ion.

In one embodiment, the amount of solids content is about 0.1 wt. % to 100 wt. %, wherein 100 wt. % represents a dry material such as a dry powder. In one embodiment, the solids content is about 0.3 wt. % to about 10 wt. %. In another embodiment, the solids content is about 0.5 wt. % to about 5 wt. %.

In one embodiment, a dry powder is prepared by removal of solvent. The result can be a dry or substantially dry material such as a powder. The amount of residual solvent can be, for example, 10 wt. % or less, or 5 wt. % or less, or 1 wt. % or less. The dry or substantially powder can be redispersed or redissolved in a new solvent system.

The amount of the optional matrix material can be controlled and measured as a weight percentage relative to the amount of the hole transport material and dopant combined. For example, the amount can be 0 to 99.5 wt. %, or about 10 wt. to about 98 wt. %, or about 20 wt. % to about 95 wt. %. In the embodiment with 0 wt. %, the matrix material is not used.

Embodiments for Method of Making Steps

In one exemplary embodiment, the reaction for the first compound and the ionic dopant in one embodiment can be represented by:

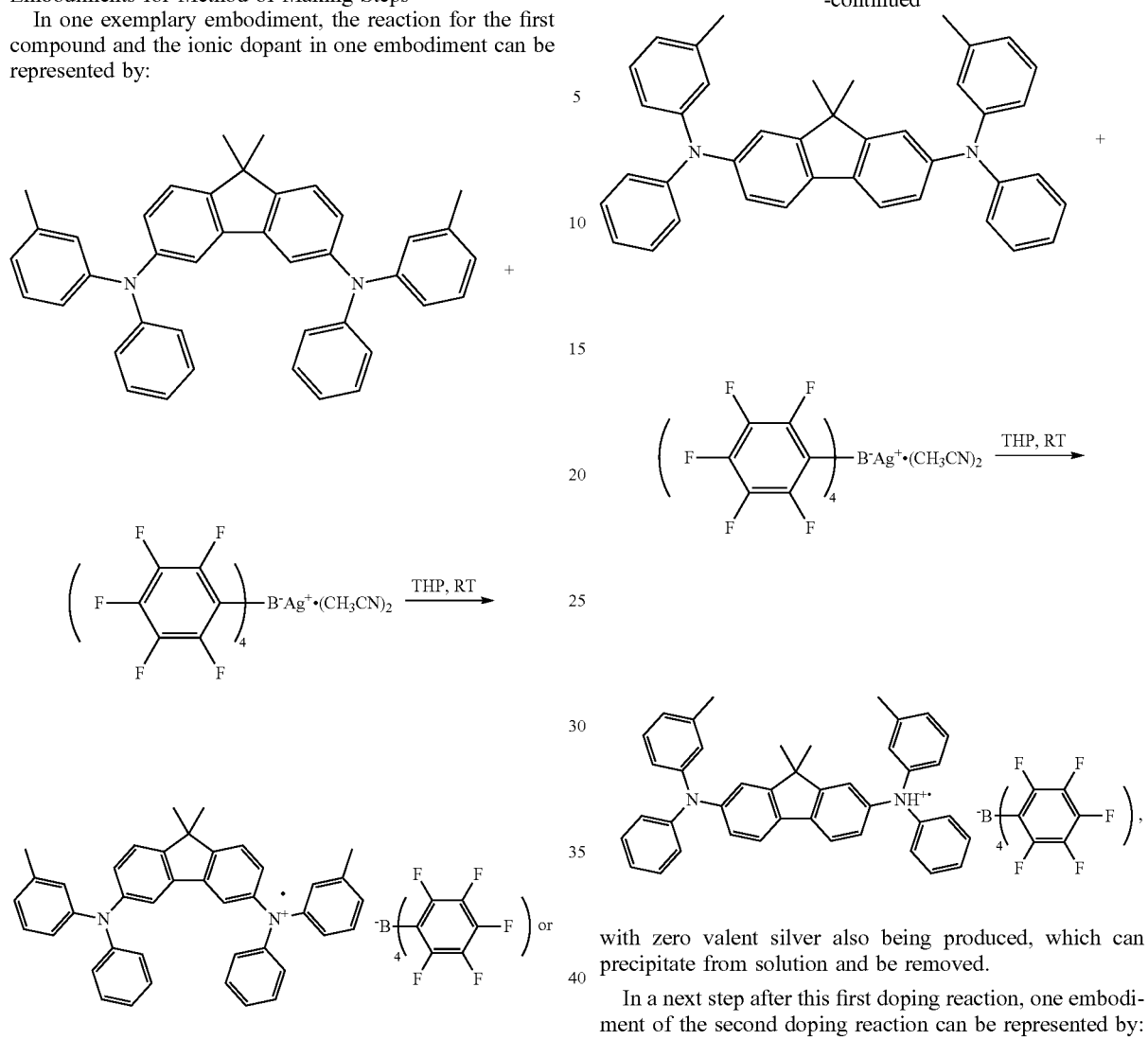

with zero valent silver also being produced, which can precipitate from solution and be removed.

In a next step after this first doping reaction, one embodiment of the second doping reaction can be represented by:

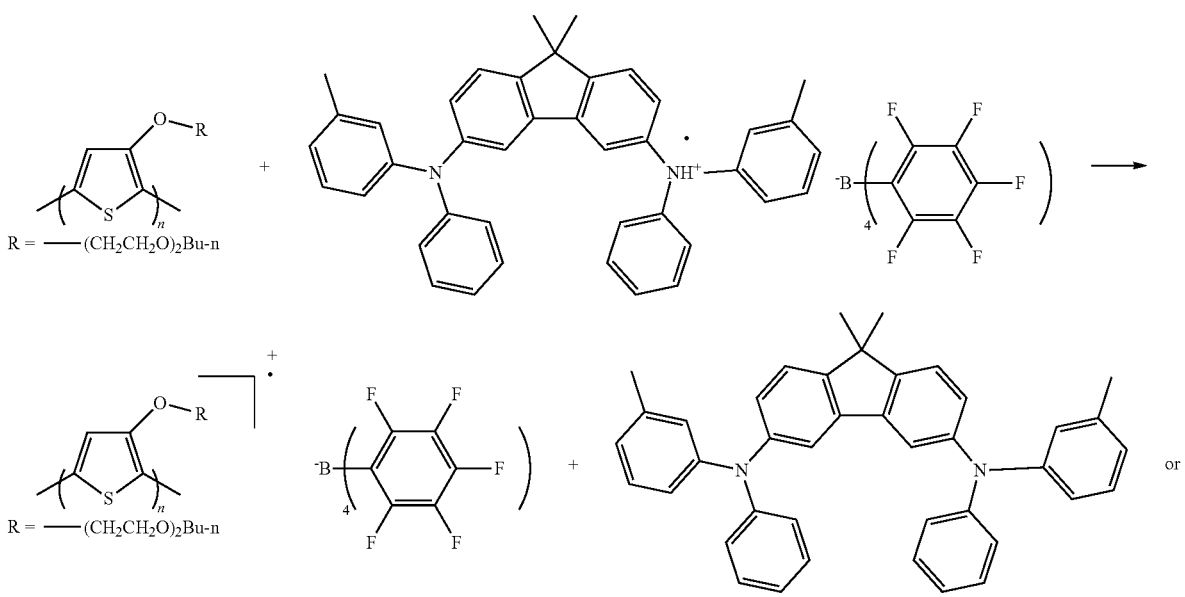

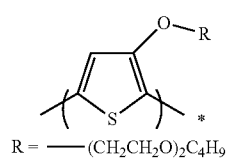
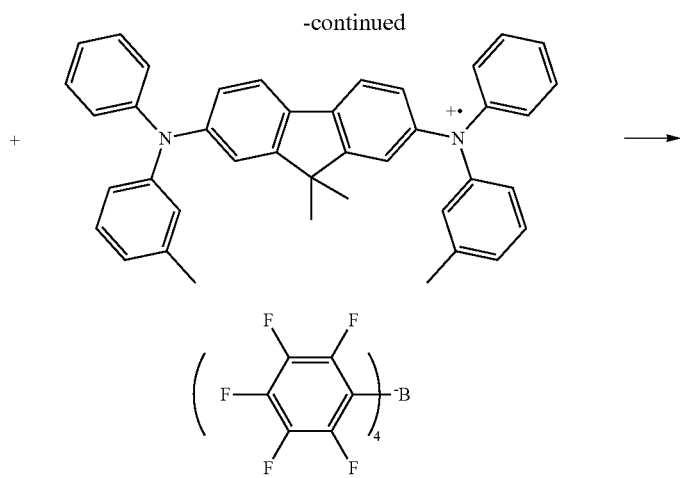
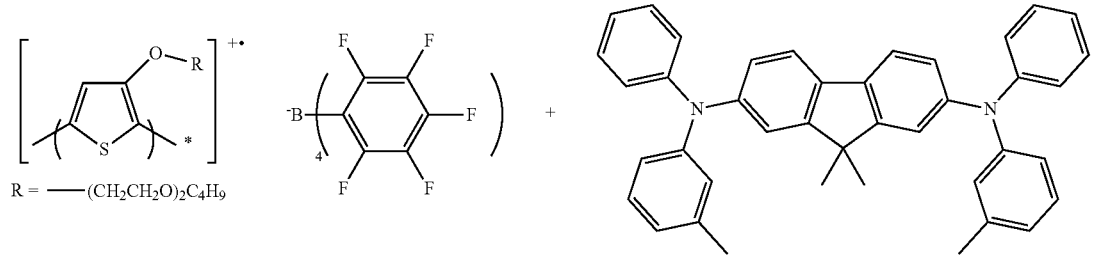
Another embodiment of the second reaction can be represented by:
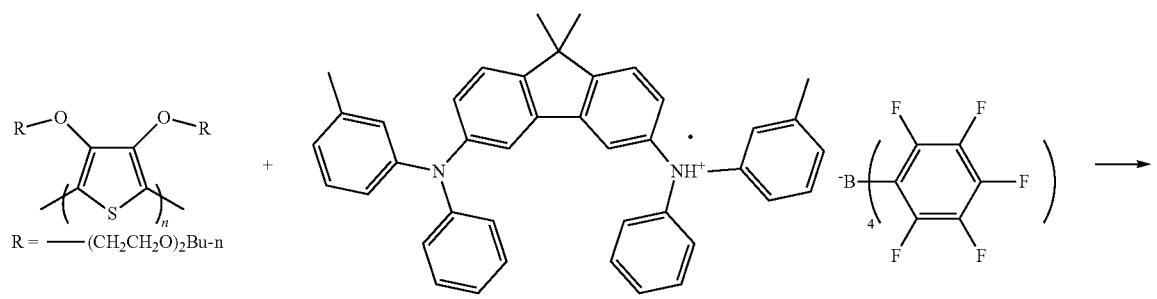
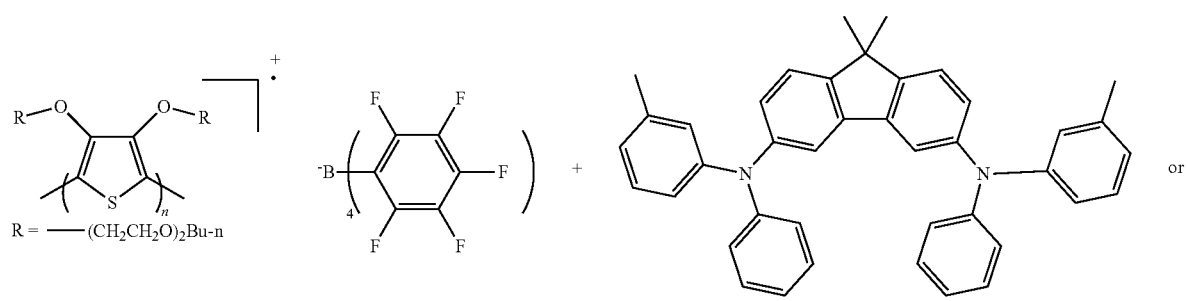

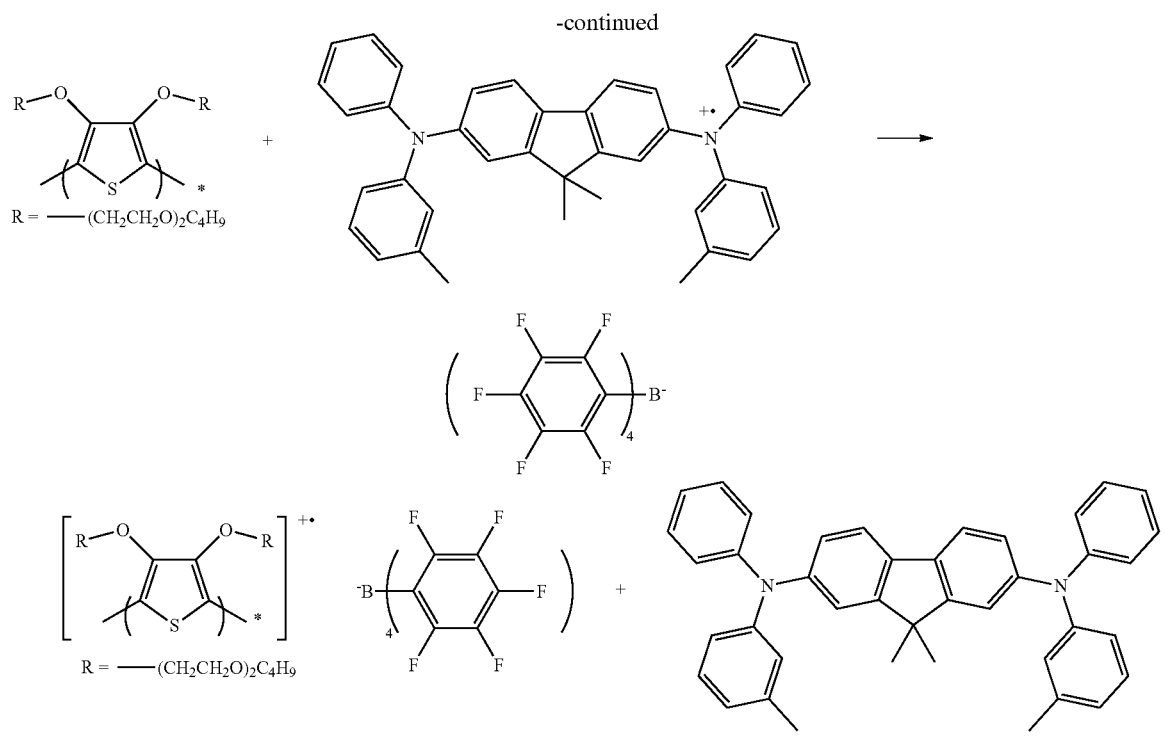
Another embodiment of the second reaction can be represented by:
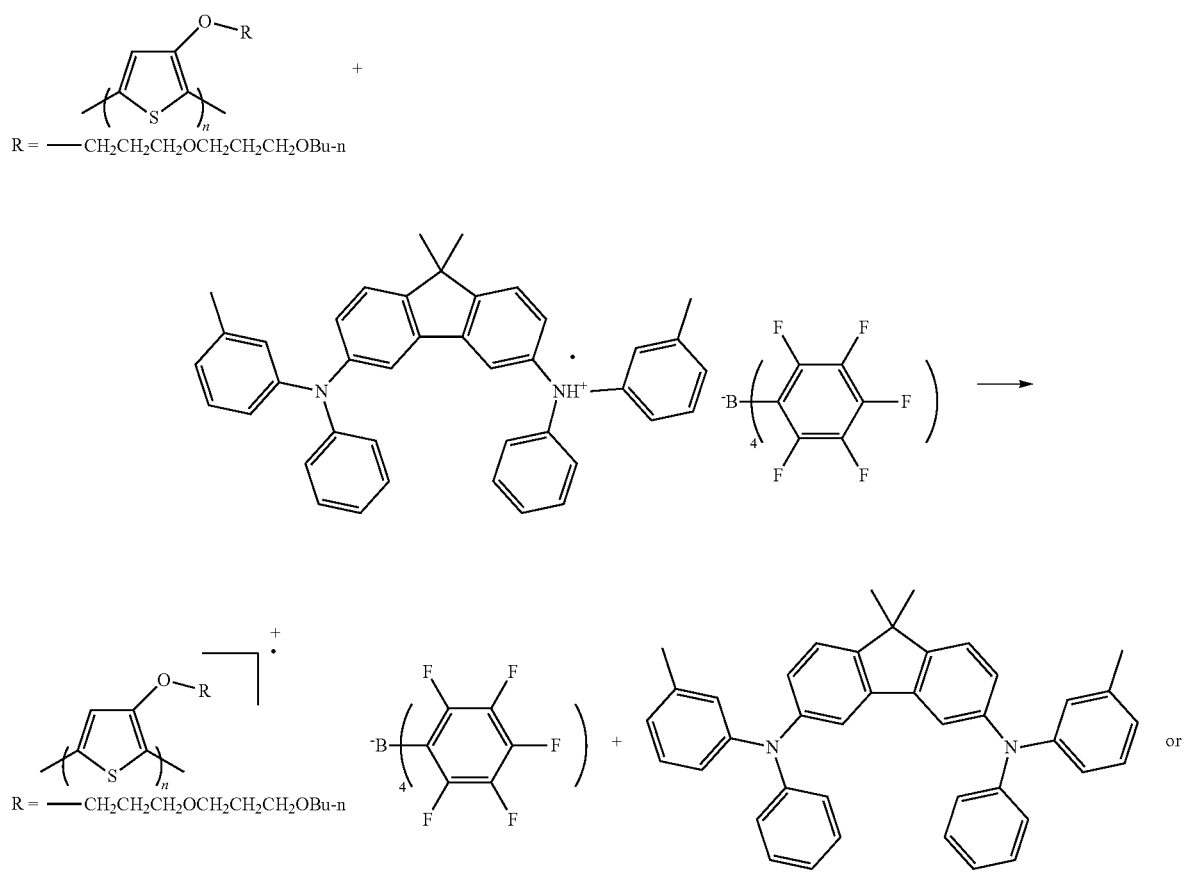

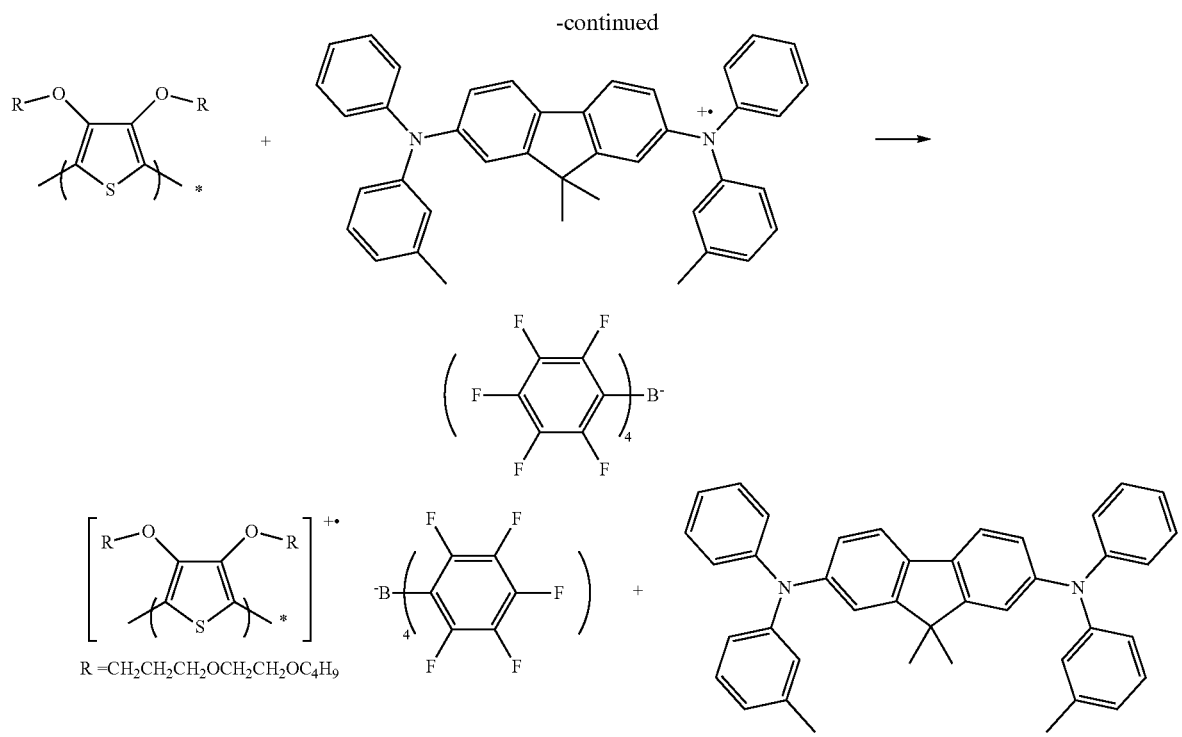

Products of the second doping reaction can be dried and formed into a powder.

Devices (and Methods of Using)

The devices described herein can be made by methods known in the art including, for example, solution processing. Inks can be applied and solvents removed by methods known in the art. Methods known in the art can be used to fabricate organic electronic devices including, for example, OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in, for example, U.S. Pat. Nos. 5,247,190 and 5,401,827 (Cambridge Display Technologies). See also Kraft et al., "Electroluminescent Conjugated Polymers—Seeing Polymers in a New Light," *Angew. Chem. Int. Ed.,* 1998, 37, 402-428, including device architecture, physical principles, solution processing, multilayering, blends, and materials synthesis and formulation, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g., A1Q3 and the like), and even Aldrich such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

(xv) polyfluorene polymers and co-polymers with polyfluorene units

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis (2-methyl-8-hydroxyquinolinato) aluminum; (v) bis(hydroxybenzoquinolinato) beryllium ($BeQ.sub.2$); (vi) bis (diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., *Conjugated Polymers*, Kluwer Academic Press, Dordrecht (1991).

Examples of HIL in devices include:

1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV:

3) Channel material in transistors

4) Channel material in circuits comprising a combination of transistors such as logic gates 5) Electrode material in transistors 6) Gate layer in a capacitor 7) Chemical sensor where modification of doping level is achieved due to association of the species to be sensed with the conductive polymer.

A variety of photoactive layers can be used in OPV devices. Photovoltaic devices can be prepared with photoactive layers comprising fullerene derivatives mixed with for example conducting polymers as described in for example U.S. Pat. No. 5,454,880 (Univ. Cal.); U.S. Pat. Nos. 6,812,399; and 6,933,436. See also, for example, Wienk et al., *Applied Physics Letters*, 88, 153511 (2006); Campos et al., *Solar Energy Materials & Solar Cells*, 90 (2006) 3531-3546. Also, photoactive layers may comprise blends of conducting polymers, blends of conducting polymers and semiconducting nanoparticles, and bilayers of small molecules such as pthalocyanines, fullerenes, and porphyrins.

Common electrode materials and substrates, as well as encapsulating materials can be used.

In one embodiment, the cathode comprises Au, Ca, Al, Ag, or combinations thereof. In one embodiment, the anode comprises indium tin oxide. In one embodiment, the light emission layer comprises at least one organic compound.

Interfacial modification layers and optical spacer layers can be used.

Electron transport layers can be used.

A method of making a device typically comprises the steps of providing a substrate; layering a transparent conductor on the substrate; providing an HIL or HTL ink composition comprising a conjugated polymer doped with a dopant in a solvent as described herein; layering the composition on the transparent conductor to form a hole injection layer or hole transport layer; layering an active layer on the hole injection layer or hole transport layer; and layering a cathode on the active layer.

In another embodiment, a method of making a device comprises applying an HIL or HTL ink composition comprising a conjugated polymer doped with a doped hole injection material in a solvent as described herein as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode, as an electrode in metal-metal oxide dielectric capacitors, as an additive for improving conductivity of active components of lithium-ion batteries (for example, lithium cobalt oxide, lithium iron phosphate etc.) seed-layers for printed circuits, IR absorbers to control heat flow e.g., windows.

Properties of Composition and Devices/Thermal Stability

Thermal stability is an important parameter and can be measured by one or more thermal analysis methods such as, for example, thermal gravimetric analysis (TGA).

Thermal stability of the film layer and devices comprising the film layers is important. Some dopants such as silver salt dopants, for example, silver tetrakis(pentafluorophenyl)borate (AgTPFB), can provide increased thermal stability. Lithium salts are not desired because lithium provides decreased or no doping of conjugated polymers. The reduction potential of a lithium salt is much lower than that of a silver salt. Thus, in the present embodiments, a silver salt is preferred, for example AgTPFB.

The stability of a silver salt may depend on processing methods. For example, AgTPFB is preferably prepared by a metathesis of lithium tetrakis(pentafluorophenyl)-borate (LiTPFB) and silver nitrate by dissolving in acetonitrile followed by precipitation in water. Without being limited to a particular theory, in such a metathesis reaction, the acetonitrile may complex to the silver thereby improving its photolytic stability.

In one aspect, stability may be considered as photolytic stability or stability against discoloration. The stable AgTPFB prepared by a metathesis of the LiTPFB and dissolving in acetonitrile may be obtained as a white powder that does not change color in ambient conditions. On the other hand, unstable AgTPFB prepared without acetonitrile begins browning within 24 hours and continues to do so.

Accordingly, for silver salt dopants of the embodiments, the amount of lithium can be reduced to levels below detection limits.

The composition comprising the conjugated polymer, oxidized first compound (e.g., oxidized hole transport material) and solvent can be cast and annealed as a film on a substrate optionally containing an electrode or additional layers used to improve electronic properties of the final device. The films may be intractable to an organic solvent, which can be the solvent in the ink for subsequently coated or deposited layers during fabrication of a device. The films may be intractable to toluene, which can be the solvent in the ink for subsequently coated or deposited layers during fabrication of a device.

In one embodiment, the HIL layer is thermally annealed. In one embodiment, the HIL layer is thermally annealed at temperature of about 25° C. to about 250° C. In one embodiment, the HIL layer is thermally annealed at temperature of about 25° C. to about 250° C. and at reduced pressures of $10^{-6}$ to 760 torr. In one embodiment, the HIL layer is thermally annealed at temperature of about 90° C. to about 170° C. for about 5 to about 15 minutes. In one embodiment, the HIL layer is heated to remove solvent.

Film formation can be carried out by methods known in the art including for example spin casting, dip casting, dip coating, slot-dye coating, ink jet printing, gravure coating, doctor blading, and any other methods known in the art for fabrication of, for example, organic electronic devices.

Kits

In additional embodiments, kits are provided. The kits can comprise one or more elements as described herein including one or more compositions, one or more containers, one or more packagings, and instructions for using the elements of the kit.

For example, one embodiment is a kit comprising:

at least one powder prepared by providing at least one first compound which has a neutral form and an oxidized form, wherein the molecular weight of the first compound is less than 1,000 g/mole; providing at least one ionic dopant comprising a cation and an anion, and combining the at least one first compound in a neutral form with the at least one ionic dopant comprising at least one cation and at least one anion in a first solvent system to provide a first doped reaction product, wherein the combination produces a neutral form of the cation, and wherein the first doped reaction product comprises an oxidized form of the first compound and the anion; and isolating the first doped reaction product in solid form, including removing the neutral form of the cation from the first doped reaction product;

at least one composition comprising at least one conjugated polymer, wherein the powder is adapted to dope the conjugated polymer.

In one embodiment, the kit can comprise an oxidized form of first compound and the conjugated polymer as components.

Instructions can be provided which show using the powder and the composition comprising doped conjugated polymer in combination.

HIL or HTL Compositions and Matrix Polymers

Additional embodiments are based on a matrix material. An additional embodiment provides a composition comprising an HIL or HTL ink comprising at least one solvent, at least one conjugated polymer which is optionally doped, and at least one copolymer which is different from the conjugated polymer and comprises:

(A) (i) at least one arylamine side group, or (ii) at least one fused aromatic side group, and (B) at least one aromatic side group comprising at least one hydroxyl substituent.

In one embodiment, the copolymer comprises fused aromatic side groups. For example, two, three, or four aromatic rings can be fused. Optionally, the fused aromatic side groups can be substituted with substituents known in the art. An example is naphthyl. In one embodiment, the copolymer comprises arylamine side groups. The arylamine group can comprise, for example, one, two, or three nitrogen atoms.

In one embodiment, the conjugated polymer is doped. In one embodiment, the conjugated polymer is doped in an amount of about 0.2 moles per repeat unit to about 0.5 moles per repeat unit, or about 0.3 moles per repeat unit to about 0.4 moles per repeat unit.

The copolymer can comprise a carbon backbone. The copolymer can be prepared by copolymerization of two or more monomers. Free radical copolymerization can be used. The copolymer can be represented as:

$$\{-[CH_2CHAr^1]_x-[CH_2CHAr^2]_y-\}_n$$

wherein $Ar^1$ is a side group such as an arylamine or fused aromatic side group; and $Ar^2$ is an aromatic side group comprising at least one hydroxyl substituent. The values for n can be, for example, about 10 to about 100,000, or about 20 to about 50,000, or about 30 to about 25,000. The molar ratio of x to y can be adapted for a particular application and ink formulation, but can be, for example, about 10:1 to 1:10, or about 5:1 to 1:5, or about 3:1 to 1:3. The $Ar^1$ group can be the fused aromatic group or the arylamine group. The $Ar^2$ group can be the group comprising an aromatic group with at least one hydroxyl moiety.

In one embodiment, the aromatic side group comprising the hydroxyl substituent is a para-hydroxyphenyl side group.

WORKING EXAMPLES

Additional embodiments are provided in the following non-limiting working examples. Note: "RM" is "reaction mixture."

I. Synthesis

Example 1

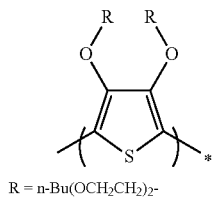

R = n-Bu(OCH$_2$CH$_2$)$_2$-

Poly(3,4-bis(2-(2-poly(3-(3-(2-butoxyethoxy)propoxy) thiophene-2,5-diyl) was synthesized per procedures reported in the US Patent Publication 2009/0256117 to Seshadri et al. (assignee: Plextronics).

Example 2

Synthesis of Butoxyethoxyethoxy Thiophene

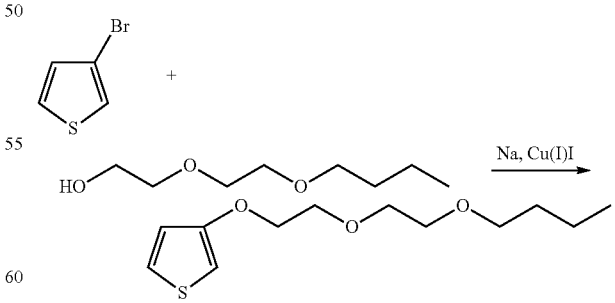

To an oven dried 1 L 3NRBF equipped with condenser, gas inlet and thermometer was charged 373 g of diethylene glycol butyl ether followed by 26.41 g of sodium metal. Stirred under nitrogen until all sodium dissolved. To this solution was added 125.2 g 3-bromothiophene followed by 14.6236 g Cu(I)I. The mixture was stirred at 100° C. for 2.5 hrs. Completion of reaction was confirmed via GC-MS. Vacuum distilled 150 g of diethylene glycol butyl ether off from RM. Diluted the pot residue with 500 mL hexane and filtered. The filtrate was washed with 400 mL×2 water followed by 250 mL×4 saturated NH₄Cl solution and the organic layer was then washed with 300 mL×3 water. Dried the organic layer over anhydrous MgSO₄, filtered and concentrated on a rotory evaporator to get 168 g of material. This was distilled under vacuum to get 137.4 g pure butoxyethoxyethoxy thiophene. Single peak on GC-MS with molecular ion peak at m/z=245.

Bromination of Butoxyethoxyethoxy Thiophene

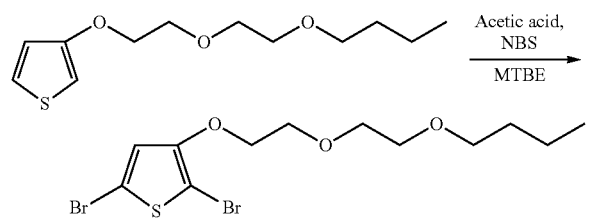

To an oven dried 500 ml 3NRBF equipped with thermometer and gas inlet charged 20.869 g of butoxyethoxyethoxy thiophene, 175 mL MTBE and 11.0 mL of glacial acetic acid. The mixture was stirred for 10 min and then cooled in ice bath to −1° C. and continued stirring for 30 min. 33.448 g of NBS was added to this mixture in four equal portions at 30 min intervals and keeping temp always between −1° C. and 5° C. 1.5 hrs after final NBS addition, completion of the reaction is confirmed via TLC and GC-MS. Poured RM into 200 mL water and stirred vigorously for 30 min. Washed this with 100 mL×3 water, 100 mL×2 saturated NaHCO₃ solution (until drain out is basic) followed by 100 mL×3 water (until drain out is neutral). Added 5 mL triethyl amine to organic layer and then dried over anhydrous MgSO₄, filtered and concentrated. Column purified the crude sample to get 25.1 g of dibromo butoxyethoxyethoxy thiophene. Single peak on GC-MS with molecular ion peak at m/z=323.

Polymerization

To an oven dried 1 L 3NRBF equipped with condenser, gas inlet and thermocouple charged 17.54 g of monomer and 353 g of THF followed by 1 mL dodecane. This mixture was stirred under nitrogen at room temp for 30 min. Instilled isopropyl magnesium chloride 2.0M in THF to the mixture, monitoring conversion via GC-MS, until 96.3% of the monomer was converted. Added 0.3242 g Ni(dppp)Cl₂ (30 dpn) to the mixture. Stirred under nitrogen at room temp for 1 hr and 0.4340 g Ni(dppp)Cl₂ was added. The mixture was refluxed for 24 hrs. At 30° C. the RM was quenched with 3.0 mL saturated NH₄Cl soln and stirred with 5.31 g of DMG. 162.5 g of THF was distilled off under nitrogen. The remainder was precipitated into 1250 mL water, stirred for 30 min and then poured into 1250 mL water, stirred for another 30 min. the polymer was then filtered and washed with 300 mL 1:1 MeOH-water mixture. Stirred the polymer in 250 mL MeOH at 30-35° C. for 30 min and poured into 250 mL water acidified with 5 mL con. HCl and continued for 30 more min., filtered and washed with 300 mL 1:1 MeOH-water. This step was repeated. This procedure was repeated for a third time but no HCl was added. A final wash was done with 150 mL water. The polymer was dried in vacuum oven at 60° C. overnight to get 8.8 g.

Different degrees of polymerization have been achieved by changing catalyst loading.

Gel Permeation Chromatography (GPC) was carried out on a PL-220 GPC using 2-Varian PL-Gel Mixed D columns and 1 Varian PL-Gel guard column at 80° C. using chlorobenzene as the eluting solvent unless specified. Sample concentration was 0.8 mg/mL; flow rate 0.8 mL/min; Injection 200 uL; standards polystyrene to 277,000 Da.

| GPC | | | | TGA | | DSC |
|---|---|---|---|---|---|---|
| | | | | 5% wt loss, ° C. | Tdeg onset, ° C. | |
| Mp | Mn | Mw | PDI | | | Tg/Tm, ° C. |
| 20,927 | 13,049 | 18,181 | 1.39 | 286 | 337 | No Tg or Tm observed until decomposition |

Example 3

Synthesis of 3-thiophenoxy-3-(1-propanol)

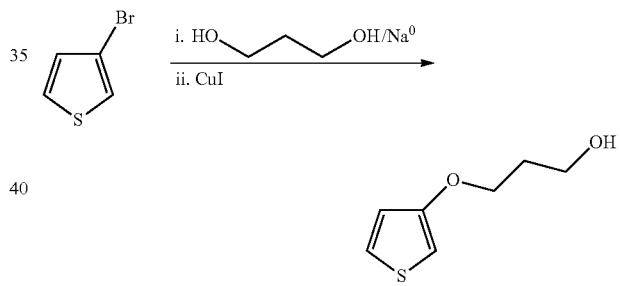

To an oven dried 1 L 3NRBF equipped with condenser, nitrogen inlet and thermometer adapter added 496.7 g of 1,3-propanediol followed by 15.076 g sodium metal. The reaction mixture was stirred under nitrogen until all sodium dissolved. At 65° C., added 71.79 g 3-bromothiophene followed by 8.386 g copper (I) iodide. Stirring continued at 120° C. for 2.5 hrs. GC-MS analysis of RM showed 98.8% completion. Allowed reaction mixture to cool down to 35° C. and then poured into 1 L ice-cold water with 10 g ammonium chloride. Neutralized the mixture using 1N HCl. Extracted the material from the mixture by washing it with 400 mL MTBE three times. The combined organic layers was washed with 200 mL saturated ammonium chloride solution four times followed by 200 mL DI water three times. The extract was dried over anhydrous MgSO₄, filtered and evaporated the solvent to get 56.2 g crude material. Dissolved about 50 g of the crude sample in warm hexane and chilled in freezer to reclaim the solids. Repeated the above process and dried the solids at room temperature under vacuum to get 46.68 g material. Single peak on GC-MS with molecular ion peak at m/z=158.

Synthesis of 3-butoxyethoxypropoxythiophene

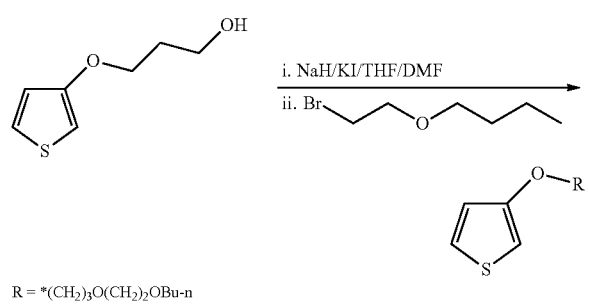

R = *(CH$_2$)$_3$O(CH$_2$)$_2$OBu-n

To a dry 250 mL 3NRBF equipped with a thermometer adapter and nitrogen inlet added 6.513 g sodium hydride powder inside a glove-box. 50 mL THF was added to the flask via a cannular needle and stirred under nitrogen at RT. To this suspension slowly added a solution of 28.596 g 3-thiophenoxy(1-propanol) dissolved in 12 mL DMF and 50 mL THF via a syringe over 1 hr. Following this 4.504 g potassium iodide was added and then 49.201 g 1-(2-bromoethoxy)butane. The conversion was monitored by GC-MS. After 44 hours, 42% of the alcohol was converted. Added 1.099 g NaH, upon which effervescence was noted. After an additional 1.5 hours of stirring the conversion of the alcohol to the final product increased to 49% and hence an additional 1.046 g of NaH was added and stirring continued for another 16 hours to obtain 67% conversion. At this time another 1.115 g NaH was added and the reaction continued for an additional 24 hours and poured into 200 ml saturated NH$_4$Cl soln. The aqueous layer was then extracted with 200 ml methyltert-butylether (MTBE) initially. After separating the organic layer, the aqueous layer was extracted four times with MTBE. The combined organic layer was then washed as follows in order: 100 ml saturated NH$_4$Cl soln; 100 ml water (aqueous layer pH>7); 100 ml Acidified water (5 ml 1N HCl)×3 (aqueous layer pH<acidic); and 100 ml de-ionized water x 4 (aqueous layer pH=neutral).

The organic layer was then dried over anhydrous MgSO4, filtered and concentrated to obtain 35.6 g deep amber colored liquid. The amber colored liquid was dissolved in 300 ml hexanes and cooled in a freezing compartment (~−10° C.) when amber colored solids separated out. The supernatant solution was decanted and concentrated to obtain 25.6 g light amber liquid. This was further purified by passing through a silica gel column to obtain 16.8 g of the final product as a yellow liquid. Single peak on GC-MS with molecular ion peak at m/z=259.

Bromination of 3-butoxyethoxypropoxythiophene

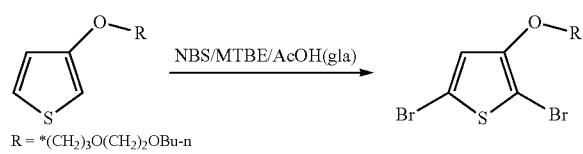

R = *(CH$_2$)$_3$O(CH$_2$)$_2$OBu-n

To a 500 mL 3NRBF equipped with a nitrogen inlet and a thermometer adapter added 16.8 g 3-(3-(2-butoxyethoxy)propoxy)thiophene, 150 mL MTBE and 8.5 mL glacial acetic acid. The RM was chilled in salt-ice bath and 25.643 g N-bromosuccinimide was added in four portions over 1.5 hrs while maintaining the reaction temperature between −3° C. and 0° C. 1 hr after completion of addition of NBS reaction completion was confirmed by GC-MS. The RM was poured into 200 mL de-ionized water and stirred vigorously for 30 min. The solvent mixture was transferred to a separatory funnel and after separating the aqueous layer, the organic layer was washed thrice with 100 mL DI water portions, twice with 100 mL saturated sodium bicarbonate solution (till pH>7) and thrice with 100 mL water (till pH is neutral). The organic layer was then dried over anhydrous MgSO$_4$ filtered and concentrated on a rotary evaporator. The compound was purified via passing through a silica gel column to obtain 16.78 g of the dibromide (62.8% yield). The structure of the product confirmed via $^1$H-NMR.

Polymerization of 2,5-dibromo-3-(3-(2-butoxyethoxy)propoxy)thiophene

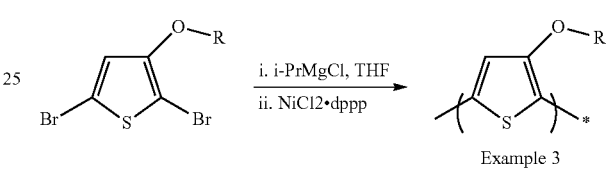

R = *(CH$_2$)$_3$O(CH$_2$)$_2$OBu-n

Example 3

A 1 L 3NRBF equipped with a thermocouple, condenser and gas inlet was flame dried and nitrogen purged. To this added 14.391 g of 2,5-dibromo-3-(3-(2-butoxyethoxy)propoxy)thiophene, 302 g THF and 0.5 mL dodecane. Added isopropylmagnesium chloride solution (2.0M in THF) and then chilled in an ice-bath. To this chilled reaction mixture added 0.299 g NiCl$_2$.dppp and reaction continued in the ice-bath for 30 min and then the ice-bath was removed. Upon attaining room temperature added 0.295 g of NiCl$_2$.dppp and refluxed RM for 24 hours. Allowed the reaction mixture to cool below 30° C. and then added 5 mL saturated ammonium chloride solution and stirred for 20 min. Then added 10.054 g dimethylglyoxime and continued stirring for 1 hr. About 140 g THF was distilled out at atmospheric pressure and precipitated the polymer into 1750 mL methanol (chromasolv grade from Aldrich) with vigorous stirring. 1.5 L of de-ionized water was then added and the suspended polymer was further stirred for 30 min. The polymer was then filtered and washed with 200 mL 1:1 (v/v) methanol-water mixture. The polymer was then suspended in 300 mL methanol and heated to 40-50° C. for 30 min, 300 mL de-ionized water was added and stirring with heat was continued for 30 more minutes. The polymer was then filtered and washed with 200 mL 1:1 methanol-water. This methanol-water treatment was repeated two more times and the polymer was finally dried in vacuum oven at 60° C. to obtain 7.6 g polymer.

GPC was done using the following parameters:

Gel Permeation Chromatography (GPC) was carried out on a PL-220 GPC using 2-Varian PL-Gel Mixed D columns and 1 Varian PL-Gel guard column at 80° C. using chlorobenzene as the eluting solvent unless specified. Sample concentration was 0.8 mg/mL; flow rate 0.8 mL/min; Injection 200 uL; standards of polystyrene to 277,000 Da.

Note: Polymerization methods are described in, for example, U.S. Pat. Nos. 7,569,159; 7,888,427; and 8,017, 241. Poly((3-methoxyethoxyethoxy)thiophene-2,5-diyl) can be made by methods described therein.

Example 4 (Vinyl Naphthalene-Vinyl Pyridine Copolymer)

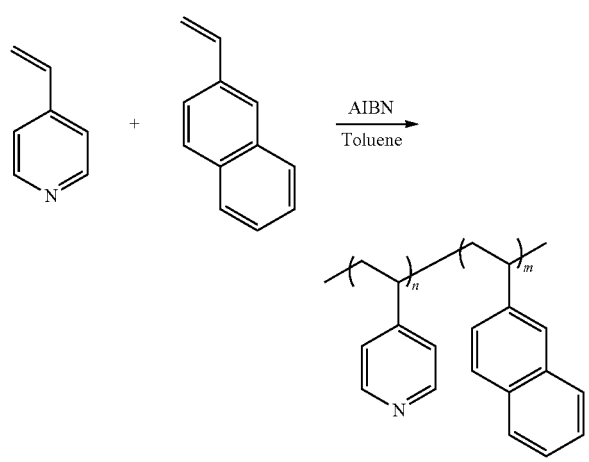

Procedure 1

To a flame dried 250 ml 2NRBF equipped with a condenser and a nitrogen inlet added 2.507 g of 2-vinyl naphthalene, 5.123 g of 4-vinylpyridine and 70 mL toluene. The reaction mixture (RM) was stirred till all solids dissolved and 0.162 g of AIBN was added to the pot. Nitrogen was bubbled through the RM for 2 hrs and the temperature was raised to reflux. Continue refluxing the reaction mixture for 16 hrs. The polymer was precipitated by pouring into 700 mL hexanes. After stirring the slurry for an additional 30 min, the polymer was filtered, washed with 150 mL hexanes and suction dried on the funnel. The polymer was then purified by re-dissolving in 70 mL of THF and precipitating again in 700 mL hexanes. The suspended polymer was further stirred for 30 min and then filtered and washed with 200 mL hexanes. After vacuum drying in oven at room temperature overnight obtained 3.518 g (46% yield) of off-white polymer. Mn=6155; Mw=14931; PDI=2.42. TGA-5% wt loss 337° C.; onset temp. 361° C.

Procedure 2

To a flame dried 100 ml two necked round bottom flask added 1.501 g 2-vinyl naphthalene followed by 50 mL of anhydrous THF. Upon dissolution of the vinylnaphthalene added 3.059 g of 4-vinyl pyridine. Cool RM to −78° C. using dry ice-isopropanol bath. To this solution added 0.21 mL of 2.5 M n-BuLi solution in hexane and continue stirring the RM overnight under nitrogen. The polymer was then precipitated into 500 mL hexanes. After suspending the polymer in the hexanes for an hour, filtered and washed with 100 mL hexanes. Polymer was subsequently suction dried on the funnel and re-precipitated from 50 mL THF in 500 mL hexanes. The precipitated polymer was stirred in the hexanes for 1 hr, filtered and washed with 100 mL before vacuum drying overnight. Obtained 0.482 g off-white solids (11% yield). GPC was obtained as previously mentioned. Mn=2669, Mw=3956 and PDI=1.48. TGA-5% wt loss 306° C.; onset temp. 364° C.

Procedure 3

To a dry 250 mL 2NRBF added 6.970 g 4-vinylpyridine (purchased from Aldrich and passed through a 1 cm tall silica gel bed to remove the inhibitor), 2.87 g inhibitor free 2-vinylnaphthalene, 0.357 g AIBN and 100 mL dimethylsulfoxide. The reactor contents were then thoroughly bubbled with nitrogen for 2.5 hrs and then started heating to 80-85° C. The reaction was continued at this temperature overnight (18 hrs). The RM was then concentrated on a rotary evaporator to remove the solvent. To the gummy liquid 100 mL THF was added and poured into 1 L hexanes with vigorous stirring. The polymer precipitated as a gummy paste. The gummy paste was dissolved in 60 mL chloroform and again precipitated into 1.2 L hexanes. The polymer was then filtered, washed with 100 mL hexanes and suction dried on the funnel. The polymer was once more precipitated into 700 mL hexanes from a 50 mL chloroform solution, filtered, washed with 100 mL hexanes and suction dried on the funnel. The polymer was then subsequently dried in a vacuum oven at 75° C. for 48 hours to obtain 8.3 g off-white powder.

Example 5 (4-triisopropyloxystyrene)

Synthesis of 4-bromotriisopropylsilyloxybenzene

To a nitrogen purged 10 L reactor added 6.5 L of dry diethyl ether and 500 g 4-bromophenol. Upon dissolution of the bromophenol added 484 g of diazabicycloundecene (DBU) was added and stirred for 30 min. To this stirred solution 621 g of triisopropylsilyl chloride was added over 1 h and further stirred for another hour at RT. GC-MS indicated completion of etherification of the phenol and hence washed twice with 3 L de-ionized water, twice with 1.5 L sodium hydroxide solution (0.5 N) ad twice with 1.5 L de-ionized water in that order. The ethereal layer was dried over anhydrous MgSO4, filtered and concentrated on a rotary evaporator. The 4-bromotriisopropylsilyloxybenzene was then distilled under reduced pressure. Yield, 880 g (92.6%). Single peak on GC-MS with molecular ion peak at m/z=328.

Synthesis of 4-triisopropylsilyloxybenzenecarboxaldehyde

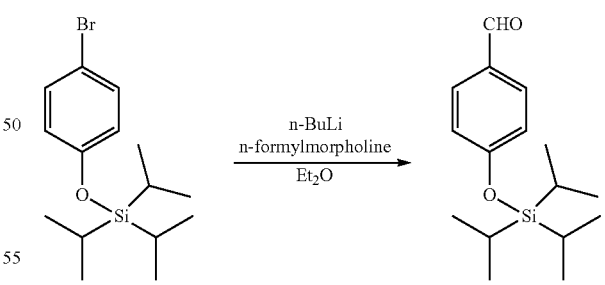

To an oven dried 1 L 2NRBF equipped with thermometer adapter charged 76.246 g of (4-bromophenoxy)triisopropylsilane followed by 600 mL anhydrous diethyl ether. The reaction mixture was chilled in a dry ice-acetone bath to −70° C. and 97.5 mL of 2.5 M n-butyllithium solution in hexane over 1 hr was added. The reaction mixture was allowed to warm to room temperature and after stirring for 3 hrs, chilled back to 0° C. Then 29.521 g n-formymorpholine was added dropwise over 11 min. The mixture was stirred under nitrogen overnight at room temperature.

The mixture was then added to 500 mL saturated brine solution and extracted into 500 mL MTBE. The organic layer was then washed thrice with 300 mL de-ionized water, dried over anhydrous MgSO$_4$, filtered and concentrated on a rotary evaporator. The crude sample was then purified via silica gel column chromatography to obtain 48 g of clear colorless liquid. The structure of the product confirmed via $^1$H-NMR.

Synthesis of 4-triisopropylsilyloxystyrene

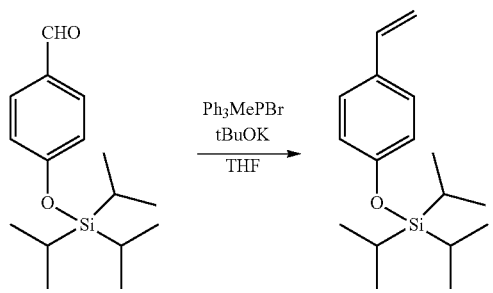 [SMILES: CC(C)[Si](Oc1ccc(C=O)cc1)(C(C)C)C(C)C ; C=Cc1ccc(O[Si](C(C)C)(C(C)C)C(C)C)cc1 ; "THF"]

To an oven dried 1 L 2NRBF equipped with addition funnel and gas adapter, charged 250 mL THF, 13.7127 g potassium tert-butoxide and 32.0772 g methyltriphenylphosphonium bromide. The mixture was stirred for 30 min. Made 4-triisopropylsilyloxybenzenecarboxaldehyde soln by dissolving 20.1593 g of the material in 150 mL THF. The reactor was covered with aluminum foil to exclude light. The aldehyde soln was instilled to reactor via addition funnel. The mixture was stirred overnight. The solvent was evaporated on a rotary evaporator. Dissolved the material back in 400 mL MTBE and washed with 300 mL×3 water. The organic layer was dried over anhydrous MgSO$_4$ and then concentrated. Column purified the crude sample to get 15.7358 g of 4-triisopropylsilyloxystryrene. The structure of the product confirmed via $^1$H-NMR.

Example 6

Arylamination

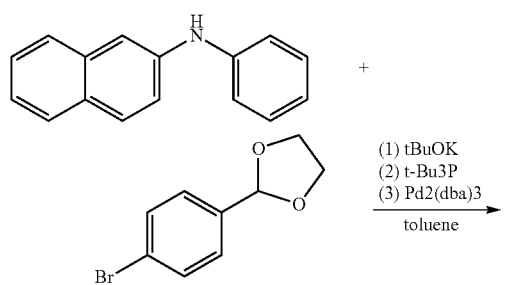

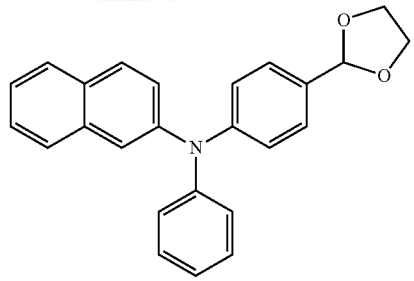

To a dry 500 ml 3NRBF equipped with a condenser, gas inlet and a thermocouple adapter added 17.779 g N-phenyl-2-napthyl amine, 18.412 g potassium tert-butoxide, 20.606 g of 2-(4-bromophenyl)-1,3-dioxane and 270 mL toluene to reactor. The RM was purged with nitrogen for 40 min and then injected 12 mL 1.0 M tri(tert-butylphosphine) in toluene. Further 3.711 g of Pd$_2$(dba)$_3$ catalyst was added in one portion and the RM heated to 95-100° C. for 18 hours under a nitrogen atmosphere. The RM was then filtered through 3 cm thick celite bed, poured into water and extracted into MTBE. The organic layer was concentrated and purified via column chromatography to get 26.8 g of the final product (90% yield, Product X). $^1$H-NMR (DMF, Bruker 300 MHz NMR) 3.95-4.19 ppm (5H), 5.72-5.75 (1H), 7.04-7.19 (6H), 7.25-7.32 (1H), 7.33-7.53 (8H), 7.71-7.79 (1H), 7.85-7.94 (2H), 7.98-8.08 (1H)

Synthesis of 4-(naphthalene-2-yl(phenyl)amino)benzaldehyde

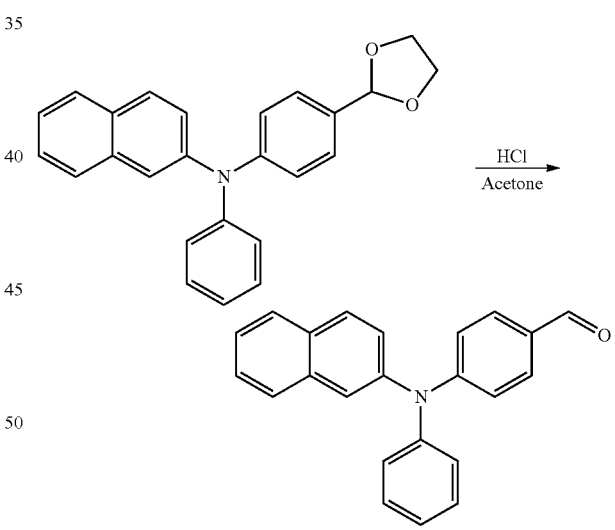

18.10 g of Compound X, from previous example, was taken in a 2 L 3NRBF equipped with a dropping funnel and 900 mL acetone was added to dissolve the compound. 300 mL 2.0 M HCl was then added through the dropping funnel over 20 min. Hydrolysis of the acetal was completed in 1 hr and confirmed by absence of starting material via TLC. After evaporating all the acetone, obtained solids suspended in an aqueous layer. The supernatant aqueous layer was slowly decanted. The solids were then dissolved in 300 ml ethyl acetate, washed subsequently with water, saturated sodium bicarbonate solution and water in that order. Subsequently, the organic layer was dried over anhydrous MgSO$_4$, filtered and concentrated to dryness. The compound was further purified via a silica gel column chromatography using hexane and ethylacetate mixtures to obtain 11.75 g (74%) of the product.

Synthesis of N-phenyl-N-(4-vinylphenyl)naphthalen-1-amine

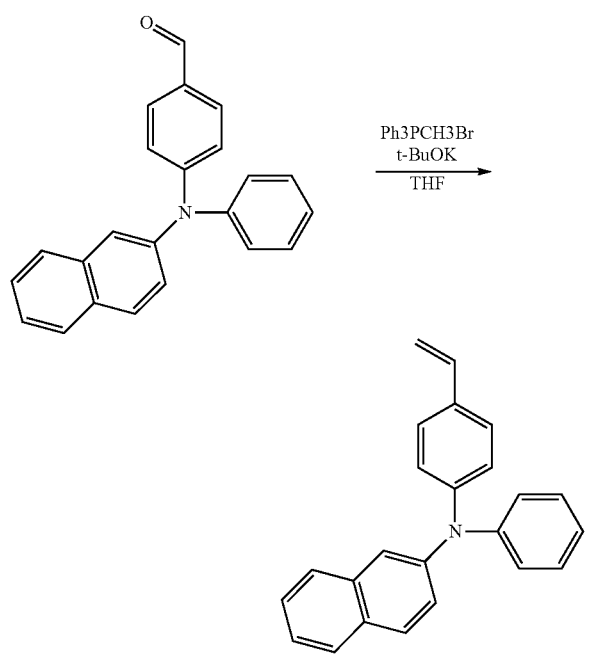

To an oven dried (165° C., overnight), nitrogen purged 1 L 3NRBF equipped with a gas inlet, addition funnel added 14.912 g methyltriphenylphosphonium bromide and 6.241 g potassium tert-butoxide inside a glove-box followed by 250 mL anhydrous THF. Stirred the RM under nitrogen and while stirring added 10.04 g 4-(naphthalene-2-yl(phenyl) amino)benzaldehyde dissolved in 100 mL anhydrous THF. Reaction was completed in 2.5 hours after the aldehyde addition and was confirmed by the absence of the aldehyde via TLC. After evaporating off the THF from the RM on a rotary evaporator, it was dissolved in MTBE and washed with water. The organic layer was then dried over anhydrous MgSO$_4$, filtered and evaporated to obtain the crude solids. The compound was finally purified by passing through a silica gel column to get 4 g of the product.

Copolymerization

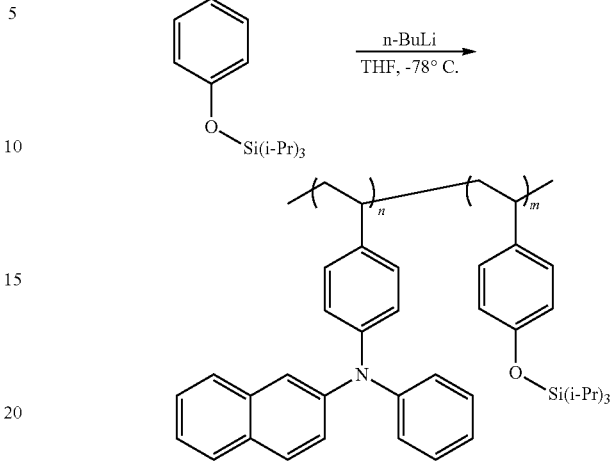

To a flame dried 2NRBF under nitrogen added 1.458 g N-phenyl-N-(4-vinylphenyl)naphthalen-1-amine followed by THF (100 mL). After dissolution of the monomer, 4-triisopropylsilyloxystyrene was added and chilled the RM in an IPA-dry ice bath for 1 hour to lower the temperature to −78° C. 0.9 mL of 2.5 M butyl lithium in hexane was added to the RM. The RM turns blue indicating the formation of the anion on the N-phenyl-N-(4-vinylphenyl)naphthalen-1-amine monomer. Continue stirring the RM in the dry ice bath overnight and precipitate the polymer into 900 ml methanol (chromasolv grade from Aldrich). After an additional 30 min stirring, filtered and washed the polymer with 200 ml MeOH. Dried the polymer overnight in a vacuum oven and dissolved in 50 mL THF followed by precipitation into 700 ml methanol. Further stirred the polymer suspended in the methanolic solution for 30 min, filtered and washed with 200 ml MeOH. Polymer was then finally dried in a vacuum oven at 50° C. to get 5.931 g (91% yield). The product's structure was confirmed by $^1$NMR analysis.

Hydrolysis of poly(N-phenyl-N-(4-vinylphenyl) naphthalen-1-amine-co-4-triisopropylsilyloxystyrene)

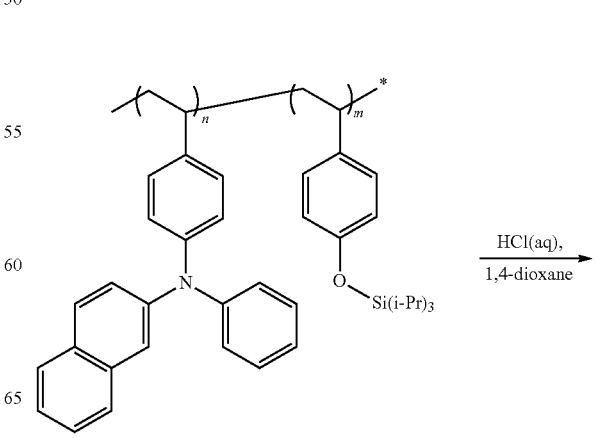

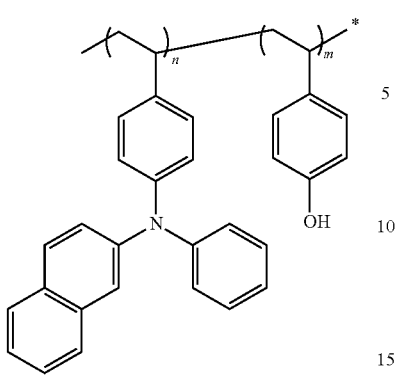

Added 3.808 g of the poly(N-phenyl-N-(4-vinylphenyl) naphthalen-1-amine-co-4-triisopropylsilyloxy styrene) into a clean dry 250 mL 2NRBF equipped with a condenser, gas inlet and stopper. Following this added 38 mL 1,4-dioxane to dissolve the polymer followed by 6.5 mL 11 N hydrochloric acid and refluxed for 24 hrs. Precipitated the polymer into 450 mL de-ionized water at room temperature and continued stirring for 45 min. The polymer was then filtered, washed with water till filtrate is neutral and then dried in oven at 50° C. overnight. The polymer was then dissolved back in 38 mL 1,4-dioxane and re-precipitated into 450 mL water. After stirring the suspended polymer for an additional 30 min in the aqueous layer, filtered and washed with 1 L water and dried in oven at 50° C. The polymer was once again re-precipitated into 250 mL hexanes (chromasolv) from a 20 mL solution in THF. After stirring the suspended polymer in the hexane layer for 30 min, the polymer was filtered, washed with 100 mL hexane and dried in oven at 50° C. The above precipitation step from THF in hexane was repeated once more before finally drying the polymer overnight at 50° C. in a vacuum oven. Obtained 1.605 g (69.5% yield) product. TGA-5% wt loss 352° C.; degradation onset temp. 410° C. DSC-Tg 141° C. The product's structure was further characterized by $^1$H NMR analysis.

Example 7

Synthesis of vinyltriphenylamine

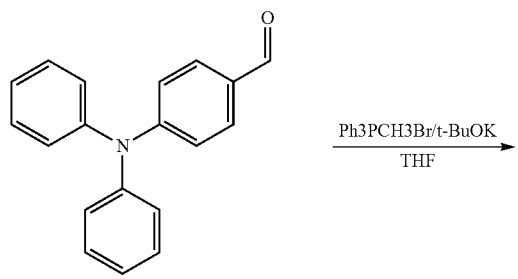

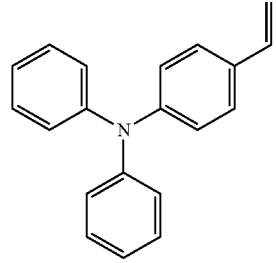

Into a clean flame dried 500 ml 3NRBF equipped with an addition funnel and nitrogen inlet added 26.466 g methyltriphenylphosphonium bromide, 11.084 g potassium tert-butoxide inside a glove-box. Then 130 mL of THF was cannulated into the flask. The RM was stirred under nitrogen for 1 hr and then 14.995 g 4-(diphenylamino)benzaldehyde dissolved in 100 mL anhydrous THF was added dropwise through the additional funnel. After continued stirring at room temperature for 1 hour, the reaction completion was confirmed by the absence of the starting aldehyde via TLC. After evaporating off the THF from the RM on a rotary evaporator, it was dissolved in MTBE and washed with water. The organic layer was then dried over anhydrous $MgSO_4$, filtered and evaporated to obtain the crude solids. The compound was finally purified by passing through a silica gel column to get 12.6 g of the product (84.6% yield). $^1$H-NMR (Acetone, Bruker 300 MHz NMR) 5.09-5.19 ppm (1H), 5.63-5.75 (1H), 6.71-6.78 (1H), 6.92-7.13 (8H), 7.20-7.43 (6H).

Synthesis of poly(4-vinyltriphenylamine-co-4-triisopropylsilyloxystyrene)

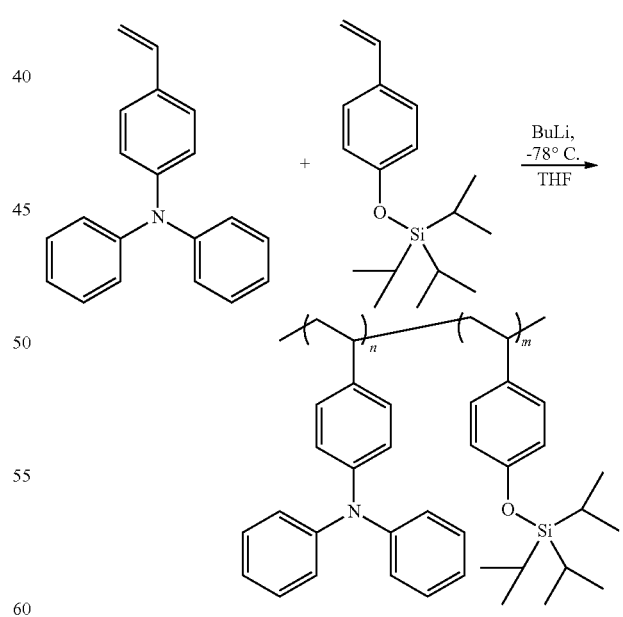

To a flame dried 250 mL 2NRBF under nitrogen added 3.543 g of 4-vinyltriphenylamine and 120 mL anhydrous THF (120 mL). Upon dissolution of the monomer added 11.995 g of 4-triisopropylsilyloxy styrene and stirred for 10 min. The RM was then cooled in an isopropanol-dry ice bath to −78° C. over 1 hour and 0.5 mL of 2.5 M n-butyl lithium in hexane was added in one portion. The RM turned into an orange color indicating the anion transfer to the monomer. The reaction was continued overnight in the dry ice bath conditions and polymer precipitated into 1.3 L methanol. The polymer was suspended in the vigorously stirred methanol for an additional 30 min, filtered and washed with 600 mL methanol. Then the polymer was dried in a vacuum oven at 50° C. overnight to obtain 15.04 g of polymer (96.8% yield). Mn=48,859; Mw=53,176; PDI=1.09. The product's structure was further confirmed by $^1$H NMR analysis.

Hydrolysis of poly(4-vinyltriphenylamine-co-4-triisopropylsilyloxystyrene)

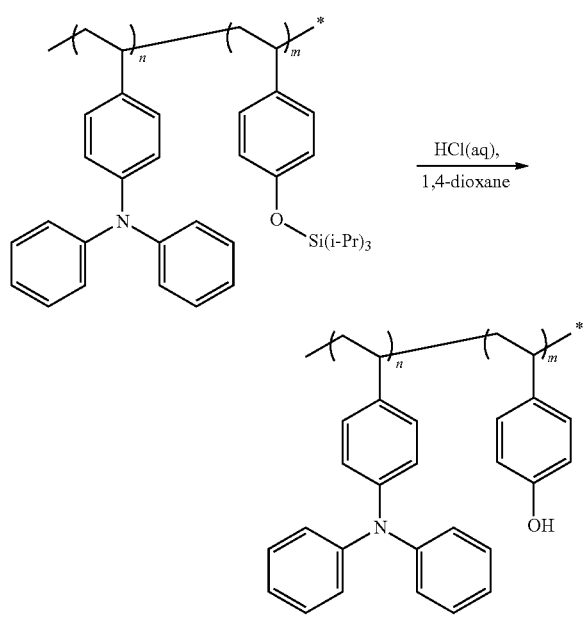

Hydrolysis of the triisopropylsilyloxystyrene was accomplished by refluxing a solution of 12.024 g poly(4-vinyltriphenylamine-co-4-triisopropylsilyloxystyrene) in 120 mL 1,4-dioxane with 20 mL 11N hydrochloric acid for 24 hrs. The polymer was then precipitated into 1500 mL de-ionized water, stirred for another 30 min and then filtered. The polymer was then washed with de-ionized water until the filtrate was neutral and then dried in a vacuum oven at 50° C. The polymer was then dissolved again in 100 mL 1,4-dioxane and precipitated into 1200 mL water. After further stirring for 30 min, the polymer was filtered, washed with 1200 ml water and then dried in vacuo in an oven at 50° C. The polymer was once more purified by re-precipitating a solution of the polymer in 70 mL THF into 900 mL Hexane. After stirring for an additional 30 min the stirring was stopped and the supernatant solvent decanted slowly. The polymeric solids were further suspended in 600 mL hexane, filtered and washed with 200 ml hexane before drying in a vacuum oven at 50° C.: The above THF-hexane re-precipitation process was repeated once more and after a final drying in the oven obtained 6.62 g product. TGA-5% wt loss 324° C.; onset temp. 333° C.; DSC-TG 121° C. and 147° C. The product's structure was further confirmed by $^1$H NMR analysis.

Example 8

Synthesis of poly(acetazystyrene-co-vinylnaphthalene)

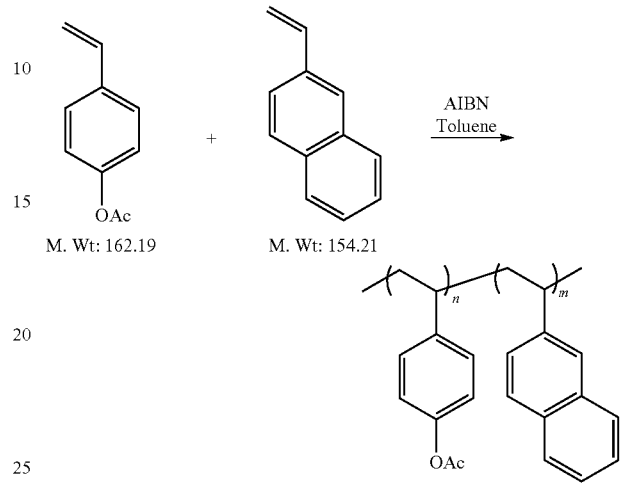

To a dry 500 mL 2NRBF equipped with a reflux condenser and nitrogen inlet, added inhibitor free 15.03 g p-acetoxystyrene, 9.50 g inhibitor free 2-vinylnaphthalene, 0.379 g AIBN and 250 mL toluene. The flask and the contents were purged with nitrogen for 2 hours by bubbling the gas through the solution. The RM was then heated to reflux overnight. The polymer was then precipitated into 2.5 L hexanes. Polymer was then filtered, washed with hexanes and air-dried on the funnel for 48 hrs. The polymer was re-dissolved in 82 g THF and precipitated again in 1 L hexanes. Finally, the polymer was filtered, washed with 500 mL hexanes, suction dried on the funnel to obtain 14 g of white fluffy solids.

Synthesis of poly(hydroxystyrene-co-vinylnaphthalene)

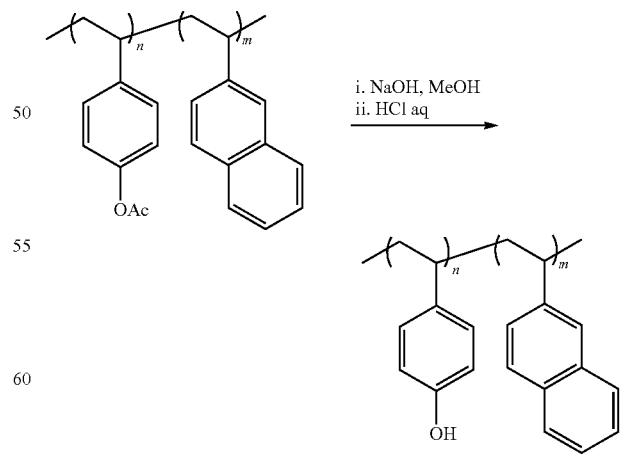

14 g of the above polymer was suspended in 112 g of methanol (Chromasolv grade from Aldrich) and 29 mL de-ionized water. To the above mixture added 5.23 g of sodium hydroxide and started heating the RM to reflux. The reaction was refluxed for about 25 hours and then filtered through 1.0 micron glass filter. The polymer was subsequently precipitated in 1.5 L de-ionized water acidified using 15 mL concentrated hydrochloric acid. The swollen polymer particle was then filtered and washed with 500 mL de-ionized water. Polymer was then dried at 70° C. under vacuum overnight. After drying the polymer was again re-dissolved in 100 mL chromasolv grade acetone, filtered through 0.2 um PTGE syringe filter and precipitated into 1.4 L de-ionized water. The polymer was then suction dried on the funnel and later in a vacuum oven at 70° C. $^1$H-NMR indicated completion of hydrolysis of the acetate. $^1$H-NMR (DMSO-d6); 9 ppm (s, br, —OH), 6-8 ppm (m, br, Ar—H), 1.5-2.3 ppm (s, br, CH—CH$_2$) Based on the peak areas for —OH (~9 ppm, br) and —CH$_2$CH— (~1-2 ppm br), the ratio of the naphthalene to phenol monomers in the polymer was calculated to be 40/60. GPC (in NMP with 1 mM LiBr) was done on a Varian PL-220 GPC using 2-Varian PL-Gel Mixed D columns, 1 Varian PL-Gel guard column at 80° C. at a flow rate of 0.8 mL/min against polystyrene standards. Mn=13,308; Mw=50,277; PDI=3.78.

II. General Procedure for the Preparation of Doped Arylamines

In different examples, a stock solution (0.5-5%) of the hole transporting material (HTM) and silver (tetrakispentafluorophenylborate) was prepared in tetrahydropyran. Silver powder (5-8 um) was added to the stock solution containing the hole transporter and the solution was vigorously stirred so that the silver powder was well suspended in the solution. To this well stirred solution 1 molar equivalent of the dopant stock solution was added drop-wise. The solution was further continued to stir about 16 hrs and then filtered through a series of 2.0 um and 0.7 um glass syringe filter. The solution was further allowed to stand still for an additional 48 hrs before filtering through a series of 2.0 µm and 0.7 µm glass syringe filter. The solution is then placed in a round bottom flask and concentrated to dryness on a rotary evaporator at 40° C. The dry powder is further dried at 4-5 torr for 24 hrs. Alternatively, the tetrahydropyran can also be replaced with methylene chloride.

| HIL # | HTM | Solvent | % total solids | Ag, ppm* |
|---|---|---|---|---|
| 1 | DMFL-TPD | Tetrahydropyran | 5.0 | 9,200 |
| 1 | DMFL-TPD | Tetrahydropyran | 1.5 | 5,600 |
| 1 | DMFL-TPD | Tetrahydropyran | 0.5 | 2,349 |
| 1 | DMFL-TPD | Methylene chloride | 0.5 | 28 |
| 2 | AMB | Tetrahydropyran | 0.5 | 222 |

*Measured by Neutron activation analysis

Example 9 (HIL 1)

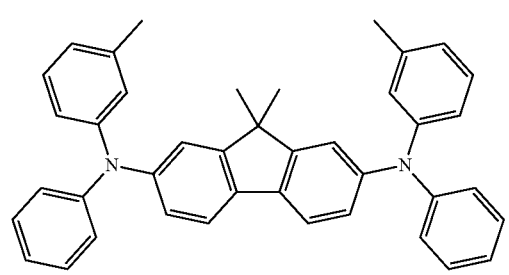

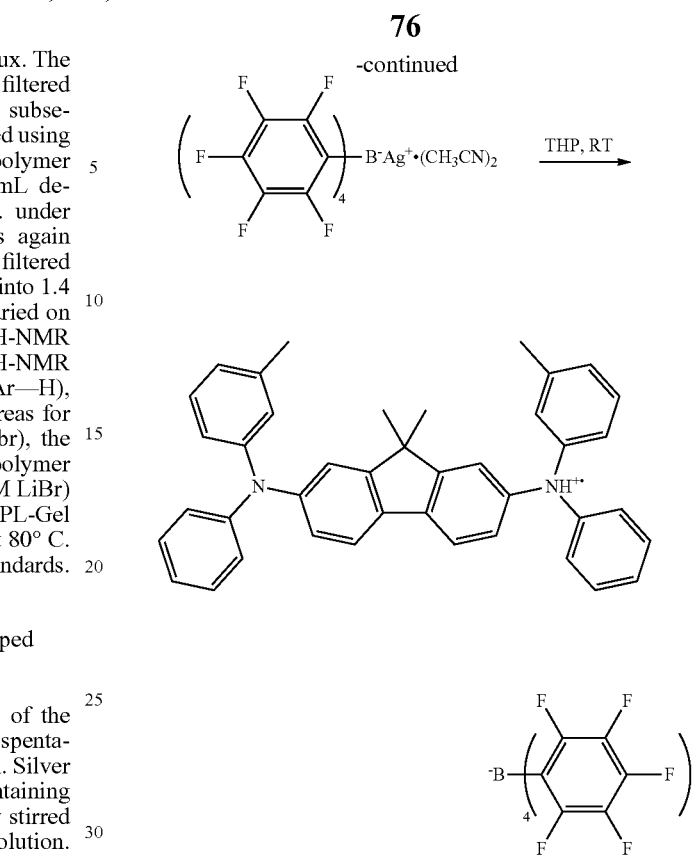

1 eq of 9,9-dimethyl-N2,N7-diphenyl-N2,N7-di-m-tolyl-9H-fluorene-2,7-diamine (DMFL-TPD) was reacted with 1 eq of silver (tetrakispentafluorophenylborate) and purified as per the general procedure.

Example 10 (HIL 2)

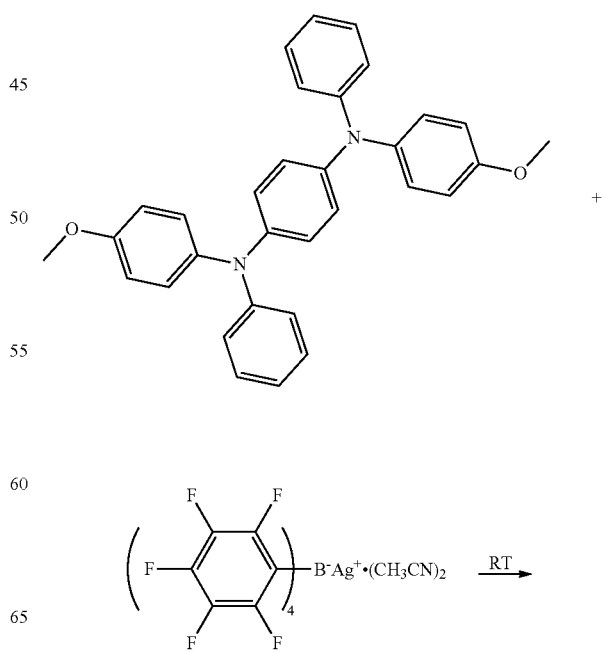

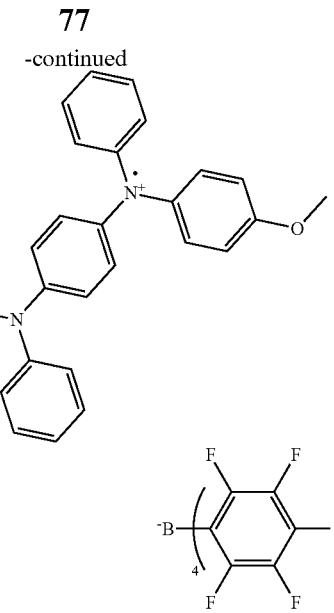

1 eq of N¹,N⁴-bis(4-methoxyphenyl)-N¹,N⁴-diphenylbenzene-1,4-diamine (AMB) was reacted with 1 eq of silver (tetrakispentafluorophenylborate) and purified as per the general procedure above.

Example 11 (HIL 3)

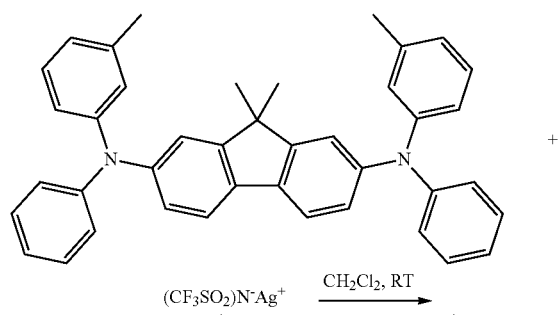

1 eq of 9,9-dimethyl-N2,N7-diphenyl-N2,N7-di-m-tolyl-9H-fluorene-2,7-diamine was reacted with 1 eq of silver bis(trifluoromethanesulfonyl)imide and purified as per the general procedure.

Example 12 (General Procedure for Doping Polythiophenes Using Example 9 or 10)

Stock solutions of the polythiophene and the dopant were prepared in the solvent system of choice. A slight heat was applied, if needed, to the polythiophene solution to accelerate the dissolution of the polymer. The appropriate amount of the dopant stock solution targeting a specific doping level was then added to the polythiophene solution dropwise while the polythiophene solution was agitated on a stir-plate.

Example 13 (General Procedure for Formulating the HIL Inks Along with the Matrix Material)

A stock solution of the matrix material was prepared in the solvent system of choice. To a stirred solution of the doped polythiophene solution as described in Example 12, a calculated amount of the matrix material solution was added dropwise to obtain the various blends described in Table 1.

Composition information for the various HIL ink formulations are provided in Table 1. Table 2 provides device data including use of compositions in Table 1. In Table 2, control devices are used including control HIL layers, including aqueous sulfonated polythiophene formulations as described in U.S. Pat. No. 8,017,241. HIL A is Plextronics AQ1100; HIL B is Plextronics AQ1200 (Plextronics, Pittsburgh, Pa.). A representative structure is:

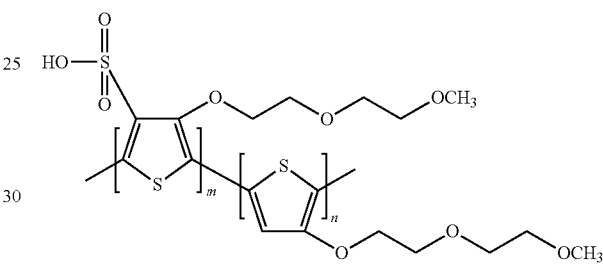

where m and n can be varied, such as in a molar ratio of 1:9 to 9:1.

Example 14

Figure 9:
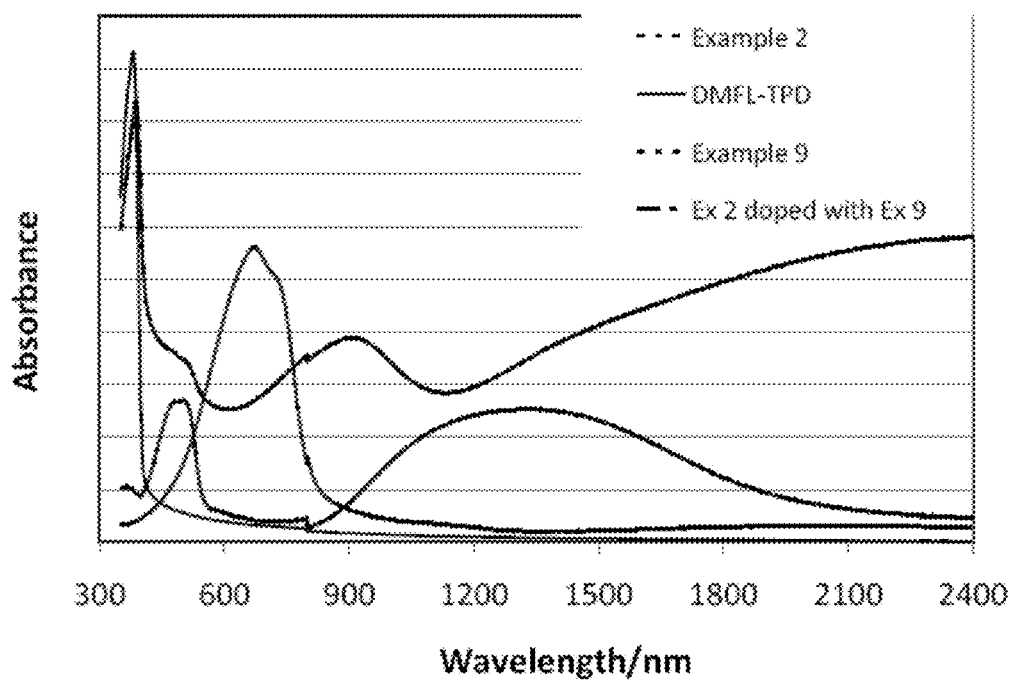
FIG. 9 shows spectroscopic UV-VIS absorption data of various Examples.

In another working example, spectroscopic UV-VIS absorption data are also provided. See FIG. 9.

Example 15

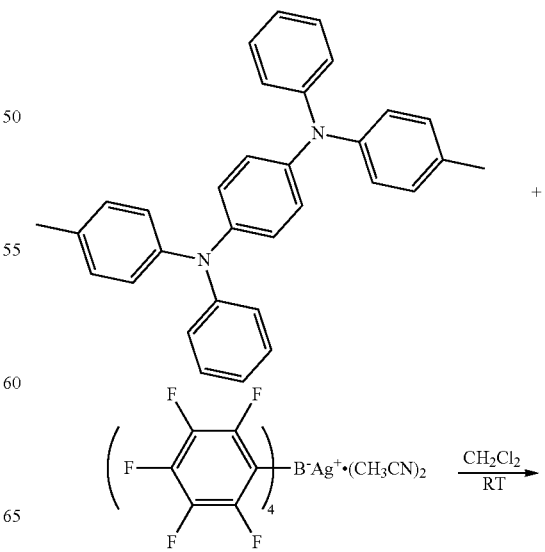

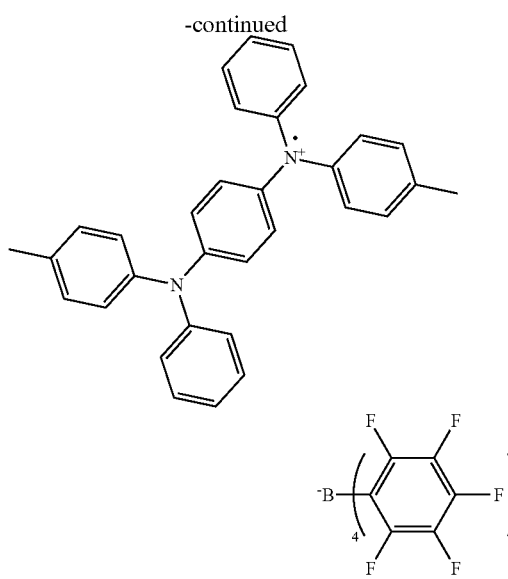

1 eq of N₁,N₄-diphenyl-N₁,N₄-di-p-tolylbenzene-1,4-diamine was reacted with 1 eq of silver (tetrakispentafluorophenylborate) and purified as per the general procedure above.

Example 16

Synthesis of Bis(5-methoxy(2-thienyl))thiophene

To oven dried nitrogen purged 1 L 3NRBF fitted with condenser, gas inlet and thermometer, transferred 7.17 g of (0.0628 mol) 2-methoxy thiophene followed by 561 g of anhydrous THF. Degassed the mixture at room temperature with nitrogen for approximately one hour. Chilled the mixture in dry-ice IPA bath to −78 r. Instilled 28.0 mL of 2.5M n-BuLi solution in hexanes over 1½ hours while maintaining temperature below −75° C. Added 10.25 g (0.0752 mol) zinc chloride to the mixture. After half an hour, removed the cold bath and allowed the mixture to warm up to 16° C. Added 6.38 g (0.0264 mol) 2,5-dibromothiophene. Instilled 0.26 g (1.3 mmol) tert-tributyl phosphene dissolved in 6 mL THF. Added 0.29 g (0.32 mmol) Pd₂(dba)₃ and refluxed the mixture overnight. At room temperature, filtered the reaction mixture through 3.5 cm high celite bed. Washed with 300 mL ethyl acetate. Evaporated the solvent on rotary evaporator. Further dried under vacuum on Schlenck line. Dissolved the solids in chloroform and stirred with activated charcoal. Filtered and precipitated into 1200 mL methanol. Dried the solids and loaded over a 15 cm×8 cm silica gel column packed with ethyl acetate. Eluted with ethyl acetate, evaporated the eluant and dried to get 4 g yellow powder. m.p. 133° C. ¹H-NMR (CDCl₃, ppm): 3.9 (s, 6H), 6.1 (d, 2H), 6.76 (d, 2H), 6.84 (s, 2H).

Example 17

Synthesis of Bis(5-methoxy(2-thienyl))-3,4-ethylenedioxythiophene

To oven dried nitrogen purged 500 mL 3NRBF fitted with condenser, gas inlet and thermometer, transferred 6.08 g of (0.0533 mol) 2-methoxy thiophene followed by 238 g of anhydrous THF. Degassed the mixture at room temperature with nitrogen for approximately 30 min. Chilled the mixture in dry-ice IPA bath to −75° C. Instilled 23.5 mL of 2.5M n-BuLi solution in hexanes over 35 min while maintaining temperature below −71° C. Added 8.71 g (0.0639 mol) zinc chloride to the mixture. After 45 min, removed the cold bath and allowed the mixture to warm up to 22° C. Added 6.71 g (0.0224 mol) 2,5-dibromo-3,4-ethylenedioxythiophene. Added 0.22 g (1.1 mmol) tert-tributyl phosphene dissolved in 6 mL THF. Added 0.24 g (0.26 mmol) Pd₂(dba)₃ and refluxed the mixture overnight. Allowed to cool down to room temperature and evaporated the solvent on rotary evaporator. Dissolved the liquid thus obtained in 500 mL ethyl acetate and stirred with 5 scoops of activated charcoal. Filtered through a celite-silicagel combination bed (each 5 cm high). Concentrated the colored filtrate on rotary evaporator. Purified via column chromatography to get 4.14 g dry yellow powder. m.p. 101° C. (by DSC). ¹H-NMR (CDCl₃, ppm): ¹H-NMR (CDCl₃, ppm): 3.92 (s, 6H), 4.4 (s, 4H), 6.23 (d, 2H), 6.84 (s, 2H).

Example 18

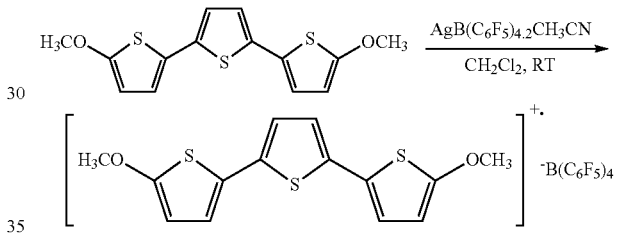

1 eq of bis(5-methoxy(2-thienyl))thiophene was reacted with 1 eq of silver tetrakis (pentafluorophenyl)borate acetonitrile complex and purified as per the general procedure. Product was confirmed by the loss of neutral terthiophene peak in the UV region.

Example 19

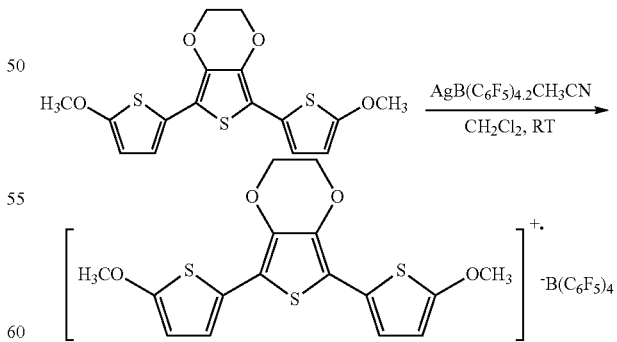

1 eq of bis(5-methoxy(2-thienyl))-3,4-ethylenedioxythiophene was reacted with 1 eq of silver tetrakis (pentafluorophenyl)borate acetonitrile complex and purified as per the general procedure. Product was confirmed by the loss of neutral terthiophene peak in the UV region.

TABLE 1

| HIL # | Components | Weight % | WF, eV by AC2 | Resistivity ohm.cm |
|---|---|---|---|---|
| 2 | Poly(3-(2-(2-butoxyethoxy)ethoxy)thiophene-2,5-diyl) | 0.43 | 5.22 | 4,017 |
| | Ex. 10 | 0.82 | | |
| | poly(p-hexyloxystyrene-co-p-hydroxystyrene) (27/73) | 1.25 | | |
| | Toluene | 27.62 | | |
| | Xylene | 55.25 | | |
| | 3-Methoxypropionitrile | 14.63 | | |
| 5 | Poly(3-(2-(2-butoxyethoxy)ethoxy)thiophene-2,5-diyl) | 0.22 | 5.34 | 9,049 |
| | Ex. 10 | 0.41 | | |
| | poly(p-hexyloxystyrene-co-p-hydroxystyrene) (27/73) | 1.88 | | |
| | Toluene | 21.52 | | |
| | Xylene | 43.37 | | |
| | 3-Methoxypropionitrile | 32.60 | | |
| 6 | Poly(3-(2-(2-butoxyethoxy)ethoxy)thiophene-2,5-diyl) | 0.43 | 5.21 | 2,265 |
| | Ex. 10 | 0.82 | | |
| | poly(p-hexyloxystyrene-co-p-hydroxystyrene) (27/73) | 1.25 | | |
| | Toluene | 21.52 | | |
| | Xylene | 43.37 | | |
| | 3-Methoxypropionitrile | 32.61 | | |
| 7 | Poly(3-(2-(2-butoxyethoxy)ethoxy)thiophene-2,5-diyl) | 0.26 | 5.17 | 5,150 |
| | Ex. 10 | 0.37 | | |
| | poly(p-hexyloxystyrene-co-p-hydroxystyrene) (27/73) | 1.88 | | |
| | Toluene | 21.52 | | |
| | Xylene | 43.37 | | |
| | 3-Methoxypropionitrile | 32.61 | | |
| 8 | Poly(3-(2-(2-butoxyethoxy)ethoxy)thiophene-2,5-diyl) | 0.52 | 5.19 | 1,746 |
| | Ex. 10 | 0.73 | | |
| | poly(p-hexyloxystyrene-co-p-hydroxystyrene) (27/73) | 1.25 | | |
| | Toluene | 21.52 | | |
| | Xylene | 43.37 | | |
| | 3-Methoxypropionitrile | 32.61 | | |
| 9 | Poly(3-(2-(2-butoxyethoxy)ethoxy)thiophene-2,5-diyl) | 0.52 | 5.14 | 1,760 |
| | Ex. 10 | 0.98 | | |
| | poly(p-hydroxystyrene-co-2-vinylnaphthalene) (60/40) | 1.50 | | |
| | Toluene | 21.41 | | |
| | Xylene | 43.15 | | |
| | 3-Methoxypropionitrile | 32.44 | | |
| 12 | Poly(3-(2-(2-butoxyethoxy)ethoxy)thiophene-2,5-diyl) | 0.49 | N/A | N/A |
| | Ex. 9 | 1.01 | | |
| | Xylene | 65.67 | | |
| | 3-Methoxypropionitrile | 32.83 | | |
| 15 | Poly(3-(2-(2-butoxyethoxy)ethoxy)thiophene-2,5-diyl) | 0.45 | 5.12 | 3,308 |
| | Ex. 9 | 0.92 | | |
| | poly(p-hexyloxystyrene-co-p-hydroxystyrene) (27/73) | 1.38 | | |
| | Xylene | 64.83 | | |
| | 3-Methoxypropionitrile | 32.42 | | |
| 21 | Poly(3-(2-(2-butoxyethoxy)ethoxy)thiophene-2,5-diyl) | 0.19 | N/A | N/A |
| | Ex. 9 | 0.38 | | |
| | 9,9-dimethyl-N2,N7-diphenyl-N2,N7-di-m-tolyl-9H-fluorene-2,7-diamine | 1.69 | | |
| | Toluene | 21.58 | | |
| | Xylene | 43.48 | | |
| | 3-Methoxypropionitrile | 32.68 | | |
| 23 | Poly(3-(2-(2-butoxyethoxy)ethoxy)thiophene-2,5-diyl) | 0.21 | 5.10 | 487 |
| | Ex. 9 | 0.42 | | |
| | poly(p-hexyloxystyrene-co-p-hydroxystyrene) (27/73) | 1.88 | | |
| | Toluene | 20.17 | | |
| | Xylene | 43.71 | | |
| | 3-Methoxypropionitrile | 33.62 | | |
| 25 | Poly(3-(2-(2-butoxyethoxy)ethoxy)thiophene-2,5-diyl) | 0.21 | 5.25 | 12,031 |
| | Ex. 9 | 0.42 | | |
| | poly(p-hydroxystyrene-co-2-vinylnaphthalene) (73/27) | 1.88 | | |
| | Toluene | 21.54 | | |
| | Xylene | 43.37 | | |
| | 3-Methoxypropionitrile | 32.61 | | |
| 26 | Poly(3-(2-(2-butoxyethoxy)ethoxy)thiophene-2,5-diyl) | 0.41 | 5.24 | 7,370 |
| | Ex. 9 | 0.84 | | |
| | poly(p-hydroxystyrene-co-2-vinylnaphthalene) (73/27) | 1.25 | | |
| | Toluene | 21.52 | | |
| | Xylene | 43.37 | | |
| | 3-Methoxypropionitrile | 32.61 | | |
| 32 | Poly(3-(2-(2-butoxyethoxy)ethoxy)thiophene-2,5-diyl) | 0.25 | 5.34 | 25,955 |
| | Ex. 9 | 0.50 | | |
| | poly(p-hydroxystyrene-co-2-vinylnaphthalene) (60/40) | 2.25 | | |
| | Toluene | 21.41 | | |
| | Xylene | 43.15 | | |
| | 3-Methoxypropionitrile | 32.44 | | |

TABLE 1-continued

| HIL # | Components | Weight % | WF, eV by AC2 | Resistivity ohm.cm |
|---|---|---|---|---|
| 33 | Poly(3-(2-(2-butoxyethoxy)ethoxy)thiophene-2,5-diyl) | 0.25 | 5.60 | >10$^6$ |
|  | Ex. 9 | 0.50 |  |  |
|  | poly(p-hydroxystyrene-co-N-phenyl-N-(4-vinylphenyl)naphthalen-1-amine) | 2.25 |  |  |
|  | Toluene | 21.41 |  |  |
|  | Xylene | 43.15 |  |  |
|  | 3-Methoxypropionitrile | 32.44 |  |  |
| 35 | Poly(3-(2-(2-butoxyethoxy)ethoxy)thiophene-2,5-diyl) | 0.25 | 5.58 | 132,672 |
|  | Ex. 9 | 0.50 |  |  |
|  | poly(p-hydroxystyrene-co-4-vinyltriphenylamine) | 2.25 |  |  |
|  | Toluene | 21.41 |  |  |
|  | Xylene | 43.15 |  |  |
|  | 3-Methoxypropionitrile | 32.44 |  |  |
| 41 | Poly(3-(2-(2-butoxyethoxy)ethoxy)thiophene-2,5-diyl) | 0.25 | 5.34 | 21,979 |
|  | Ex. 9 | 0.50 |  |  |
|  | poly(p-hydroxystyrene-co-2-vinylnaphthalene) (60/40) | 2.25 |  |  |
|  | Toluene | 21.41 |  |  |
|  | Xylene | 21.58 |  |  |
|  | Tetralin | 21.58 |  |  |
|  | 3-Methoxypropionitrile | 32.44 |  |  |
| 44 | poly(3-(3-(2-butoxyethoxy)propoxy)thiophene-2,5-diyl) | 0.51 | N/A | N/A |
|  | Ex. 9 | 0.99 |  |  |
|  | poly(p-hydroxystyrene-co-4-vinyltriphenylamine) | 0.53 |  |  |
|  | poly(p-hydroxystyrene-co-2-vinylnaphthalene) (60/40) | 0.98 |  |  |
|  | Toluene | 21.63 |  |  |
|  | Xylene | 42.60 |  |  |
|  | 3-Methoxypropionitrile | 32.76 |  |  |
| 46 | poly(3-(3-(2-butoxyethoxy)propoxy)thiophene-2,5-diyl) | 0.51 | 5.24 | 1,205 |
|  | Ex. 9 | 0.99 |  |  |
|  | Xylene | 65.67 |  |  |
|  | 3-Methoxypropionitrile | 32.83 |  |  |
| 47 | poly(3-(3-(2-butoxyethoxy)propoxy)thiophene-2,5-diyl) | 0.26 | 5.31 | 5,585 |
|  | Ex. 9 | 0.49 |  |  |
|  | poly(p-hydroxystyrene-co-2-vinylnaphthalene) 40 | 2.25 |  |  |
|  | Toluene | 21.41 |  |  |
|  | Xylene | 43.15 |  |  |
|  | 3-Methoxypropionitrile | 32.44 |  |  |
| 48 | poly(3-(3-(2-butoxyethoxy)propoxy)thiophene-2,5-diyl) | 0.43 | 5.33 | 1,323 |
|  | Ex. 9 | 0.82 |  |  |
|  | poly(p-hydroxystyrene-co-2-vinylnaphthalene) 40 | 1.25 |  |  |
|  | Toluene | 21.52 |  |  |
|  | Xylene | 43.37 |  |  |
|  | 3-Methoxypropionitrile | 32.61 |  |  |
| 50 | poly(3,4-bis(2-(2-butoxyethoxy)ethoxy)thiophene-2,5-diyl) | 0.56 | 5.44 | 549,150 |
|  | Ex. 9 | 0.69 |  |  |
|  | poly(p-hexyloxystyrene-co-p-hydroxystyrene) (27/73) | 1.25 |  |  |
|  | Toluene | 27.62 |  |  |
|  | Xylene | 55.25 |  |  |
|  | 3-Methoxypropionitrile | 14.63 |  |  |
| 51 | poly(3,4-bis(2-(2-butoxyethoxy)ethoxy)thiophene-2,5-diyl) | 0.67 | N/A | 13,892 |
|  | Ex. 9 | 0.83 |  |  |
|  | Tetralin | 65.67 |  |  |
|  | 3-Methoxypropionitrile | 32.83 |  |  |
| 56 | poly(3,4-bis(2-(2-butoxyethoxy)ethoxy)thiophene-2,5-diyl) | 0.67 | 5.3 | <10$^6$ |
|  | Ex. 9 | 0.83 |  |  |
|  | Anisole | 59.10 |  |  |
|  | 3-Methoxypropionitrile | 39.40 |  |  |
| 59 | poly(3,4-bis(2-(2-butoxyethoxy)ethoxy)thiophene-2,5-diyl) | 0.43 | 5.3 | 4,920 |
|  | Ex. 9 | 0.82 |  |  |
|  | poly(p-hexyloxystyrene-co-p-hydroxystyrene) (27/73) | 1.25 |  |  |
|  | Toluene | 21.52 |  |  |
|  | Xylene | 43.37 |  |  |
|  | 3-Methoxypropionitrile | 32.61 |  |  |
| 61 | Poly(3-(2-(2-(2-ethoxyethoxy)ethoxy)ethoxy)thiophene-2,5-diyl) | 0.51 | 5.2 | 72 |
|  | Ex. 9 | 0.99 |  |  |
|  | Tetrahydropyran | 65.67 |  |  |
|  | 3-Methoxypropionitrile | 32.83 |  |  |

TABLE 1-continued

| HIL # | Components | Weight % | WF, eV by AC2 | Resistivity ohm.cm |
|---|---|---|---|---|
| 65 | Poly(3-(2-(2-butoxyethoxy)ethoxy)thiophene-2,5-diyl) | 0.49 | 4.9 | 12,969 |
| | Ex. 9 | 1.01 | | |
| | poly(2-vinylnaphthalene-co-4-vinylpyridine) | 1.50 | | |
| | Toluene | 21.41 | | |
| | Xylene | 43.15 | | |
| | 3-Methoxypropionitrile | 32.44 | | |
| 67 | Poly(3-(2-(2-butoxyethoxy)ethoxy)thiophene-2,5-diyl) | 0.49 | 5.1 | 31,306 |
| | Ex. 10 | 1.01 | | |
| | poly(2-vinylnaphthalene-co-4-vinylpyridine) | 1.50 | | |
| | Toluene | 21.41 | | |
| | Xylene | 43.15 | | |
| | 3-Methoxypropionitrile | 32.44 | | |
| 68 | poly(3-(3-(2-butoxyethoxy)propoxy)thiophene-2,5-diyl) | 0.51 | 5.4 | N/A |
| | Ex. 9 | 0.99 | | |
| | poly(p-hydroxystyrene-co-2-vinylnaphthalene) (60/40) | 1.50 | | |
| | Toluene | 21.63 | | |
| | Xylene | 42.60 | | |
| | 3-Methoxypropionitrile | 32.77 | | |
| 69 | poly(3-(2-(2-methoxyethoxy)ethoxyoxy)thiophene-2,5-diyl) | 0.58 | 5.30 | 22 |
| | Ex. 9 | 1.42 | | |
| | γ-Butyrolactone | 65.33 | | |
| | 3-Methoxypropionitrile | 32.67 | | |
| 70 | poly(3-(2-(2-methoxyethoxy)ethoxyoxy)thiophene-2,5-diyl) | 0.58 | 5.30 | 38 |
| | Ex.9 | 1.42 | | |
| | γ-Butyrolactone | 65.33 | | |
| | N-Methylpyrrolidinone | 32.67 | | |
| 71 | poly(3-(2-(2-butoxyethoxy)ethoxyoxy)thiophene-2,5-diyl) | 0.53 | | |
| | Ex 13 | 0.97 | | |
| | Poly(4-vinylphenol) | 1.50 | | |
| | Methyl benzoate | 64.67 | | |
| | 3-Methoxypropionitrile | 32.33 | | |
| 72 | poly(3-(2-(2-butoxyethoxy)ethoxyoxy)thiophene-2,5-diyl) | 0.26 | | |
| | Ex. 13 | 0.49 | | |
| | Poly(4-vinylphenol) | 2.25 | | |
| | Methyl benzoate | 64.67 | | |
| | 3-Methoxypropionitrile | 32.33 | | |
| 73 | poly(3-(2-(2-butoxyethoxy)ethoxyoxy)thiophene-2,5-diyl) | 0.42 | | |
| | Ex. 13 | 0.78 | | |
| | Poly(4-vinylphenol) | 1.80 | | |
| | Methyl benzoate | 64.67 | | |
| | 3-Methoxypropionitrile | 32.33 | | |
| 74 | poly(3-(2-(2-butoxyethoxy)ethoxyoxy)thiophene-2,5-diyl) | 0.50 | | |
| | Ex 13 | 0.70 | | |
| | Poly(4-vinylphenol) | 1.80 | | |
| | Methyl benzoate | 64.67 | | |
| | 3-Methoxypropionitrile | 32.33 | | |
| 75 | poly(3,4-bis(2-(2-butoxyethoxy)ethoxy)thiophene-2,5-diyl | 1.42 | | |
| | Ex 13 | 1.58 | | |
| | Methyl benzoate | 64.67 | | |
| | 3-Methoxypropionitrile | 32.33 | | |
| 76 | poly(3,4-bis(2-(2-butoxyethoxy)ethoxy)thiophene-2,5-diyl | 0.36 | | |
| | Ex 13 | 0.84 | | |
| | Poly(4-vinylphenol) | 1.80 | | |
| | Methyl benzoate | 64.67 | | |
| | 3-Methoxypropionitile | 32.33 | | |
| 77 | poly(3,4-bis(2-(2-butoxyethoxy)ethoxy)thiophene-2,5-diyl | 0.32 | | |
| | Ex 13 | 0.88 | | |
| | Poly(4-vinylphenol) | 1.80 | | |
| | Methyl benzoate | 64.67 | | |
| | 3-Methoxypropionitrile | 32.33 | | |

TABLE 2

| Table I, HIL formula | Device type | Device Stack | HIL Thickness, nm | Inventive V at 10 mA/cm² | Inventive cd/A at 10 mA/cm² | Inventive lm/W at 10 mA/cm² | HIL | Control V at 10 mA/cm² | Control cd/A at 10 mA/cm² | Control lm/W at 10 mA/cm² |
|---|---|---|---|---|---|---|---|---|---|---|
| 15 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 3.04 (±0.09) | 12.7 (±0.4) | 13.1 (±0.3) | 764 | 2.72 (±0.01) | 10.6 (±0.1) | 12.3 (±0.1) |
| 12 | HOD | ITO/HIL/NPB(150 nm)/Al(100 nm) | 25 | 2.02 (±0.01) | N/A | N/A | 691 | 1.91 (±0.03) | N/A | N/A |
| 56 | HOD | ITO/HIL/NPB(150 nm)/Al(100 nm) | 25 | 2.04 (±0.15) | N/A | N/A | 691 | 1.91 (±0.03) | N/A | N/A |
| 46 | HOD | ITO/HIL/NPB(150 nm)/Al(100 nm) | 25 | 2.03 (±0.02) | N/A | N/A | 691 | 1.91 (±0.03) | N/A | N/A |
| 12 | HOD | ITO/HIL/NPB(150 nm)/Al(100 nm) | 25 | 2.33 (±0.02) | N/A | N/A | 691 | 1.87 (±0.01) | N/A | N/A |
| 46 | HOD | ITO/HIL/NPB(150 nm)/Al(100 nm) | 25 | 2.10 (±0.01) | N/A | N/A | 691 | 1.87 (±0.01) | N/A | N/A |
| 61 | HOD | ITO/HIL/NPB(150 nm)/Al(100 nm) | 25 | 2.58 (±0.04) | N/A | N/A | 691 | 1.87 (±0.01) | N/A | N/A |
| 23 | HOD | ITO/HIL/NPB(150 nm)/Al(100 nm) | 100 | 3.50 (±0.04) | N/A | N/A | 691 | 2.04 (±0.01) | N/A | N/A |
| 25 | HOD | ITO/HIL/NPB(150 nm)/Al(100 nm) | 100 | 2.66 (±0.01) | N/A | N/A | 691 | 2.04 (±0.01) | N/A | N/A |
| 26 | HOD | ITO/HIL/NPB(150 nm)/Al(100 nm) | 100 | 2.54 (±0.05) | N/A | N/A | 691 | 2.04 (±0.01) | N/A | N/A |
| 59 | HOD | ITO/HIL/NPB(150 nm)/Al(100 nm) | 100 | 2.41 (±0.01) | N/A | N/A | 691 | 2.01 (±0.01) | N/A | N/A |
| 50 | HOD | ITO/HIL/NPB(150 nm)/Al(100 nm) | 100 | 2.68 (±0.04) | N/A | N/A | 691 | 1.90 (±0.01) | N/A | N/A |
| 47 | HOD | ITO/HIL/NPB(150 nm)/Al(100 nm) | 100 | 2.14 (±0.03) | N/A | N/A | 691 | 1.90 (±0.01) | N/A | N/A |
| 48 | HOD | ITO/HIL/NPB(150 nm)/Al(100 nm) | 100 | 2.09 (±0.01) | N/A | N/A | 691 | 1.90 (±0.01) | N/A | N/A |
| 49 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 2.87 (±0.02) | 11.2 (±0.2) |  | 764 | 2.72 (±0.01) | 9.8 (±2.0) | 11.4 (±2.4) |
| 50 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 2.78 (±0.02) | 11.0 (±0.5) |  | 764 | 2.72 (±0.01) | 9.8 (±2.0) | 11.4 (±2.4) |
| 1 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 3.55 (±0.07) | 11.5 (±0.2) |  | 764 | 2.72 (±0.01) | 9.8 (±2.0) | 11.4 (±2.4) |
| 2 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 3.71 (±0.03) | 11.8 (±.3) |  | 764 | 2.72 (±0.01) | 9.8 (±2.0) | 11.4 (±2.4) |
| 62 | HOD | ITO/HIL/NPB(150 nm)/Al(100 nm) | 100 | 4.92 (±0.15) | N/A | N/A | 691 | 1.92 (±0.01) | N/A | N/A |
| 63 | HOD | ITO/HIL/NPB(150 nm)/Al(100 nm) | 100 | 3.53 (±0.06) | N/A | N/A | 691 | 1.92 (±0.01) | N/A | N/A |
| 5 | HOD | ITO/HIL/NPB(150 nm)/Al(100 nm) | 100 | 6.31 (±0.06) | N/A | N/A | 691 | 1.92 (±0.01) | N/A | N/A |
| 6 | HOD | ITO/HIL/NPB(150 nm)/Al(100 nm) | 100 | 7.24 (±0.10) | N/A | N/A | 691 | 1.92 (±0.01) | N/A | N/A |
| 27 | HOD | ITO/HIL/NPB(150 nm)/Al(100 nm) | 100 | 4.38 (±0.06) | N/A | N/A | 691 | 3.55 (±0.01) | N/A | N/A |
| 28 | HOD | ITO/HIL/NPB(150 nm)/Al(100 nm) | 100 | 4.35 (±0.03) | N/A | N/A | 691 | 3.55 (±0.01) | N/A | N/A |
| 7 | HOD | ITO/HIL/NPB(150 nm)/Al(100 nm) | 100 | 10.89 (±0.18) | N/A | N/A | 691 | 3.55 (±0.01) | N/A | N/A |
| 8 | HOD | ITO/HIL/NPB(150 nm)/Al(100 nm) | 100 | 10.44 (±0.08) | N/A | N/A | 691 | 3.55 (±0.01) | N/A | N/A |
| 62 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 4.71 (±0.01) | 10.6 (±0.1) | 7.0 (±0.1) | 764 | 3.92 (±0.03) | 10.7 (±0.6) | 8.6 (±0.5) |
| 63 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 3.23 (±0.02) | 10.4 (±0.2) | 10.1 (±0.2) | 764 | 3.92 (±0.03) | 10.7 (±0.6) | 8.6 (±0.5) |
| 5 | PHOLED | ITO/HIL/NPB(30 nm)/NPB—IrPhQ(20%)(20 nm)/BAlQ(10 nm)/Bphen-CsCO3(10%)(45 nm)/Al(100 nm) | 100 | 3.83 (±0.02) | 12.2 (±0.1) | 10.0 (±0.1) | 764 | 3.92 (±0.03) | 10.7 (±0.6) | 8.6 (±0.5) |

TABLE 2-continued

| Table I, HIL formula | Device type | Device Stack | HIL Thickness, nm | Inventive | | | HIL | Control performance | | |
|---|---|---|---|---|---|---|---|---|---|---|
| | | | | V at 10 mA/cm² | cd/A at 10 mA/cm² | lm/W at 10 mA/cm² | | V at 10 mA/cm² | cd/A at 10 mA/cm² | lm/W at 10 mA/cm² |
| 6 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 3.88 (±0.04) | 12.1 (±0.2) | 9.8 (±0.2) | 764 | 3.92 (±0.03) | 10.7 (±0.6) | 8.6 (±0.5) |
| 29 | HOD | ITO/HIL/NPB(150 nm)/Al(100 nm) | 100 | 2.42 (±0.02) | N/A | N/A | 691 | 1.90 (±0.01) | N/A | N/A |
| 32 | HOD | ITO/HIL/NPB(150 nm)/Al(100 nm) | 100 | 2.50 (±0.01) | N/A | N/A | 691 | 1.90 (±0.01) | N/A | N/A |
| 65 | HOD | ITO/HIL/NPB(150 nm)/Al(100 nm) | 100 | 21 | N/A | N/A | 691 | 1.84 (±0.01) | N/A | N/A |
| 67 | HOD | ITO/HIL/NPB(150 nm)/Al(100 nm) | 100 | 21 | N/A | N/A | 691 | 1.84 (±0.01) | N/A | N/A |
| 58 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 2.87 (±0.01) | 14.0 (±0.03) | 15.3 (±0.1) | 764 | 2.96 (±0.01) | 14.4 (±0.04) | 15.3 (±0.1) |
| 59 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 2.84 (±0.02) | 13.7 (±0.04) | 15.2 (±0.1) | 764 | 2.96 (±0.01) | 14.4 (±0.04) | 15.3 (±0.1) |
| 32 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 3.08 (±0.02) | 13.4 (±0.1) | 13.6 (±0.2) | 764 | 2.96 (±0.01) | 14.4 (±0.04) | 15.3 (±0.1) |
| 47 | HOD | ITO/HIL/NPB(150 nm)/Al(100 nm) | 100 | 2.10 (±0.02) | N/A | N/A | 691 | 2.04 (±0.02) | N/A | N/A |
| 48 | HOD | ITO/HIL/NPB(150 nm)/Al(100 nm) | 100 | 2.14 (±0.05) | N/A | N/A | 691 | 2.04 (±0.02) | N/A | N/A |
| 47 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 2.91 (±0.03) | 14.3 (±0.1) | 15.4 (±0.2) | 764 | 3.97 (±0.05) | 12.5 (±0.03) | 9.9 (±0.03) |
| 48 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 2.92 (±0.01) | 14.5 (±0.1) | 15.7 (±0.2) | 764 | 3.97 (±0.05) | 12.5 (±0.03) | 9.9 (±0.03) |
| 33 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 9.63 (±0.02) | 13.8 (±0.2) | 4.5 (±0.05) | 764 | 3.57 (±0.02) | 15.3 (±0.2) | 13.4 (±0.1) |
| 35 | PHOLED | ITO/HIL/NPB(30 nm)/ NPB—IrPhQ(20%) (20 nm)/BAlQ(10 nm)/Bphen-CsCO3(10%)(45 nm)/Al(100 nm) | 100 | 7.46 (±0.08) | 11.2 (±0.1) | 4.7 (±0.05) | 764 | 3.57 (±0.02) | 15.3 (±0.2) | 13.4 (±0.1) |
| 41 | HOD | ITO/HIL/NPB(150 nm)/Al(100 nm) | 100 | 2.25 (±0.05) | N/A | N/A | 691 | 1.90 (±0.03) | N/A | N/A |
| 44 | HOD | ITO/HIL/NPB(150 nm)/Al(100 nm) | 100 | 6.43 (±0.05) | N/A | N/A | 691 | 1.95 (±0.01) | N/A | N/A |
| 68 | HOD | ITO/HIL/NPB(150 nm)/Al(100 nm) | 100 | 2.27 (±0.01) | N/A | N/A | 691 | 1.95 (±0.01) | N/A | N/A |
| 71 | HOD | ITO/HIL/NPB(150 nm)/Al(100 nm) | 100 | 2.29 (±0.17) | N/A | N/A | 691 | 1.85 (±0.01) | N/A | N/A |
| 72 | HOD | ITO/HIL/NPB(150 nm)/Al(100 nm) | 100 | 2.85 (±0.91) | N/A | N/A | 691 | 2.04 (±0.01) | N/A | N/A |
| 73 | HOD | ITO/HIL/NPB(150 nm)/Al(100 nm) | 100 | 2.46 (±0.33) | N/A | N/A | 691 | 1.95 (±0.01) | N/A | N/A |
| 74 | HOD | ITO/HIL/NPB(150 nm)/Al(100 nm) | 100 | 2.74 (±0.10) | N/A | N/A | 691 | 1.87 (±0.01) | N/A | N/A |
| 75 | HOD | ITO/HIL/NPB(150 nm)/Al(100 nm) | 100 | 2.27 (±0.26) | N/A | N/A | 691 | 1.97 (±0.02) | N/A | N/A |
| 76 | HOD | ITO/HIL/NPB(150 nm)/Al(100 nm) | 100 | 2.29 (±0.02) | N/A | N/A | 691 | 1.97 (±0.02) | N/A | N/A |
| 77 | HOD | ITO/HIL/NPB(150 nm)/Al(100 nm) | 100 | 2.30 (±0.03) | N/A | N/A | 691 | 1.97 (±0.02) | N/A | N/A |
| 71 | HOD | ITO/HIL/NPB(150 nm)/Al(100 nm) | 100 | 2.29 (±0.17) | N/A | N/A | 691 | 1.85 (±0.01) | N/A | N/A |

ADDITIONAL EMBODIMENTS

The OLED devices described herein, including the hole injection layers, can be used in conjunction with hole transport layers as described in, for example, US Patent Publication No. 2012/0001127, published Jan. 5, 2012, At least one additional advantage for at least one embodiment is that the hole injection material and the hole injection layer can be acid-free.

At least one additional advantage for at least one embodiment is that the solvent system can be substantially free of or free of water. For example, the amount of water can be less than 5 wt. % with respect to the solvent carrier, or less than 1 wt. % with respect to the solvent carrier.

In one embodiment ("Embodiment NQ"), the following materials were used to formulate a hole injection layer. The conjugated polymer was:

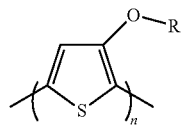

wherein R is —$(CH_2CH_2O)_2C_4H_9''$;
and the dopant and matrix material were respectively:

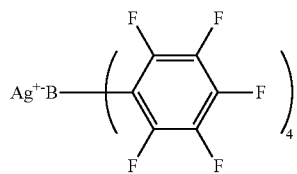

In addition, the hole transporting material was:

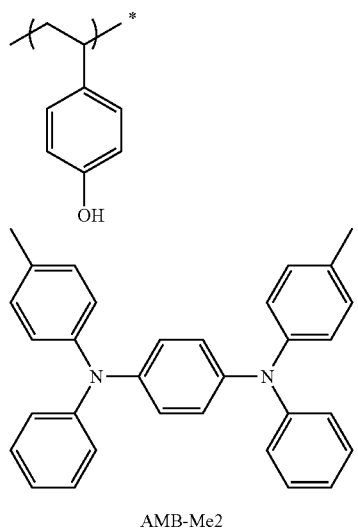

AMB-Me2

Finally, the solvent system was 2:1 methylbenzoate:3-methoxy proprionitrile, and the total solids was 3 wt. %.

A representative embodiment for an OLED stack was:

| Cathode |
| --- |
| Electron Transport Layer (ETL) |
| Hole Blocking Layer (HBL) |
| Emissive Layer (EML) |
| Hole Transport Layer (HTL) |
| Hole Injection Layer (HIL, e.g., as described herein) |
| Anode (e.g., ITO) |

In one embodiment, the design rules for the HIL layer included: (1) non acidic components, no water or protic solvents, (2) high transparency, (3) planarization.

Additional characteristics for the HIL layer are shown below:

| Key Characteristics | Values |
| --- | --- |
| Transmittance | >95% for 100 nm film thickness |
| Work Function (PhotoElectron Spectroscopy in AirPESA) | −5.4.eV |
| Resistivity | >10,000 ohm cm |
| Refractive index | ~1.54-1.66 |
| Viscosity | 2-5 cP |
| Drying temperature | 170-200° |
| Contact angle (toluene on HIL film) | <10° |
| Solvent resistance | Aromatic hydrocarbons (e.g. toluene, xylene, etc) |
| Application methods | Spin coating, slot-die coating, ink-jet printing |

The following device structure for a "hole only device" (HOD) can be used for evaluating the hole injection and transport.

| Au |
| --- |
| NPB (1500 nm) |
| HIL |
| ITO |

FIG. 1 illustrates that for optimum peak radiance, simulations show that HIL thickness can vary between 20 nm and 75 nm. The flexibility of the design is an advantage. For the simulation, the peak wavelength was 610 nm for red, 550 nm for green, and 460 nm for blue. The simulation was carried out with use of actual optical constants.

Figure 2:
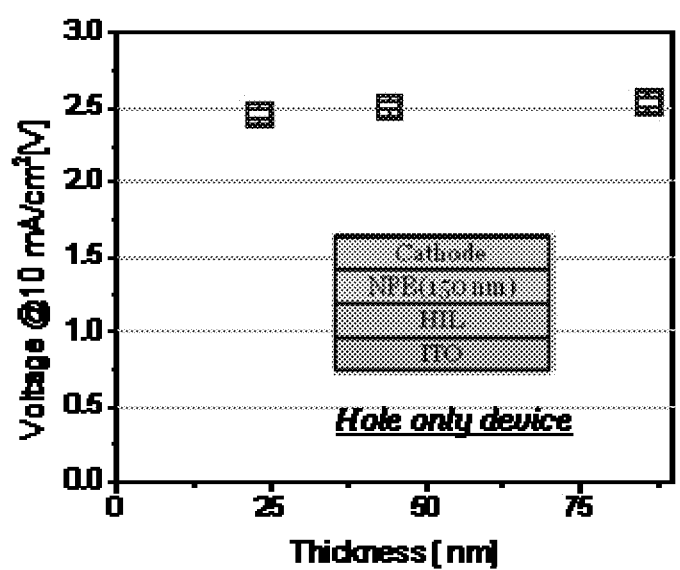
FIG. 2 shows that for these film thicknesses (e.g., 20 nm to 100 nm), there is no trade off on voltage performance as demonstrated in a hole only device.

FIG. 2 shows that for these film thicknesses (e.g., 20 nm to 100 nm), there is no tradeoff on voltage performance as demonstrated in a hole only device.

Figure 3:
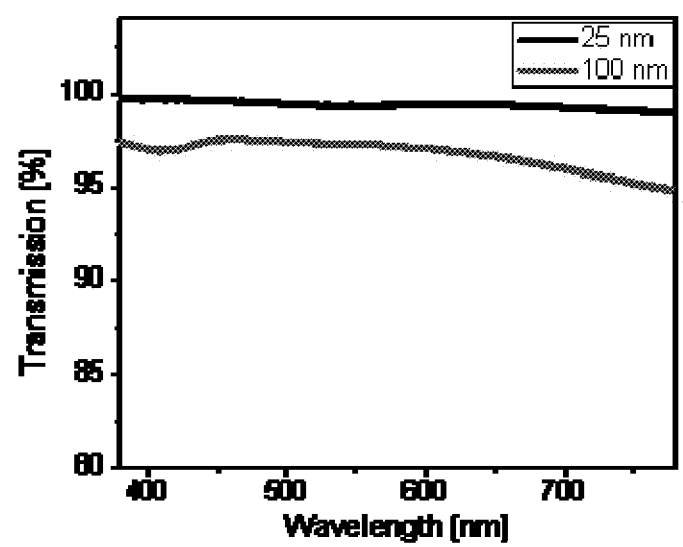
FIG. 3 shows that these films maintain greater than 95% optical transmission across desired film thicknesses (25 nm and 100 nm).

FIG. 3 shows that these films maintain greater than 95% optical transmission across desired film thicknesses (25 nm and 100 nm).

Figure 4:
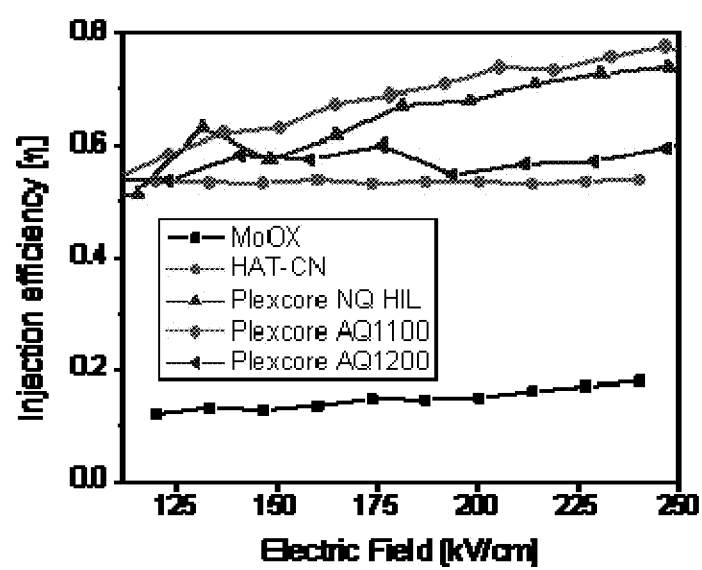
FIG. 4 illustrates that using dark injection measurement technique, the HIL shows higher hole injection efficiency compared to vapor deposited HAT-CN and MoOx HILs.

FIG. 4 illustrates that using dark injection measurement technique, the HIL shows higher hole injection efficiency compared to vapor deposited HAT-CN and MoOx HILs. See, Small et al., "Origin of Enhanced Hole Injection in Inverted Organic Devices with Electron Accepting Interlayer," *Advanced Functional Materials,* 2012, 1-6. Injection efficiency was measured as ratio of current density from DI transient and current density calculated from Child's law. Mobility is calculated from dark injection time ($t_{DI}$). Using dark injection measurement, the NQ (non-aqueous) embodiment showed higher hole injection efficiency compared to vapor deposited HAT-CN and MoOx HIL.

Figure 5:
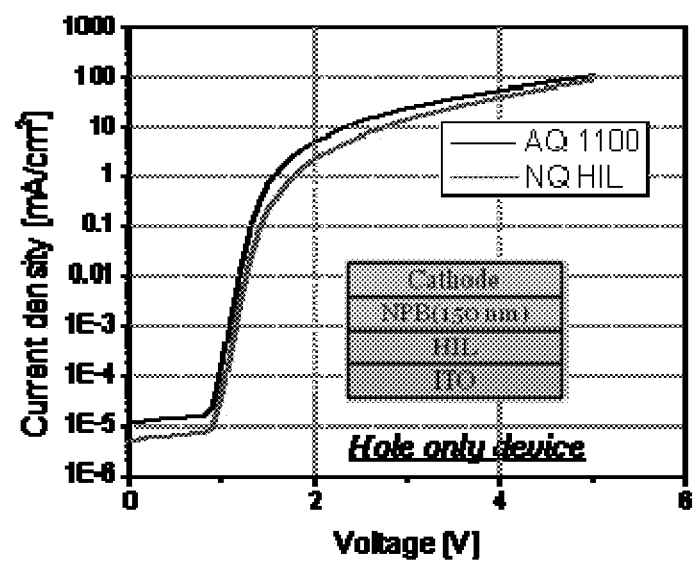
FIG. 5 showed good hole injection in a hole only device.

FIG. 5 showed good hole injection in a hole only device.

Figure 6:
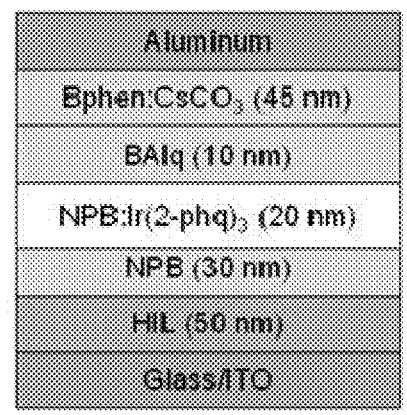
FIG. 6 shows an OLED stack used for the data shown in FIGS. 7 and 8. The figures show the coating delivers on par voltage, efficiency, and lifetime performance in an orange phosphorescent OLED test device and decreases dV/dt.
Figure 7:
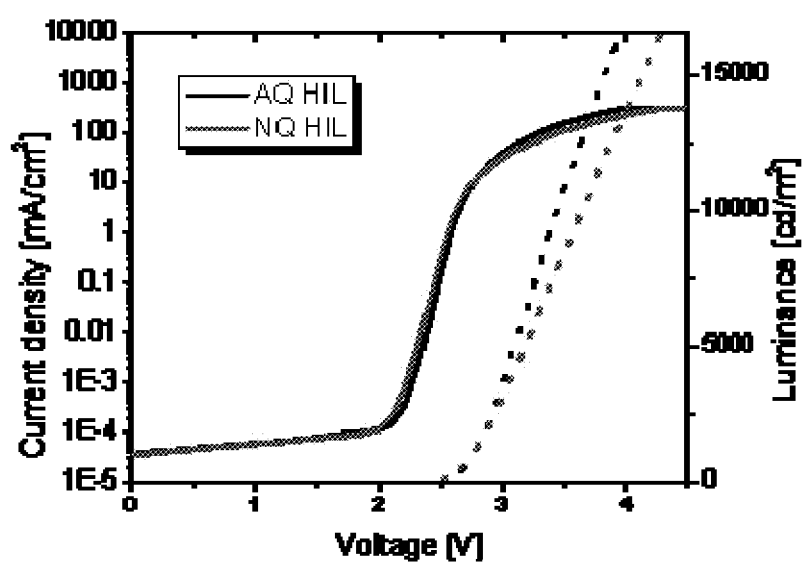
FIGS. 7 and 8 show non-aqueous (NQ) and aqueous (AQ) HIL performance data of the stack shown in FIG. 6.
Figure 8:
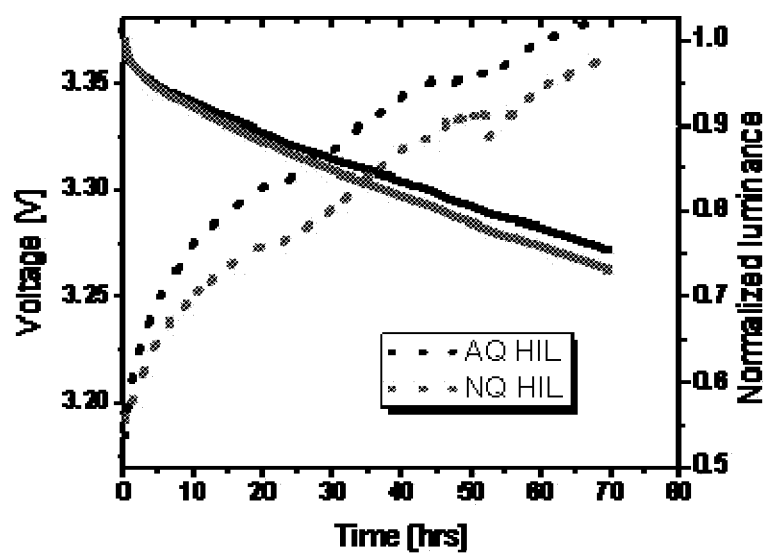

FIG. 6 shows an OLED stack used for the data shown in FIGS. 7 and 8. The figures show the coating delivers on par voltage, efficiency, and lifetime performance in an orange phosphorescent OLED test device and decreases dV/dt.

What is claimed is:

1. A method comprising:
providing a hole transporting compound, wherein the hole transporting compound is an arylamine compound, which has a neutral form and an oxidized form, wherein the molecular weight of the hole transporting compound is less than 1,000 g/mole;
providing at least one ionic dopant comprising a cation and an anion,
combining the hole transport compound in a neutral form with the at least one ionic dopant comprising at least one cation and at least one anion in a first solvent system to provide the first doped reaction product, wherein the combination produces a neutral form of the cation, and wherein the first doped reaction product comprises the oxidized form of the hole transporting compound and the anion;
isolating the first doped reaction product in solid form, including removing the neutral form of the cation from the first doped reaction product;
providing at least one conjugated polymer which has a neutral form and an oxidized form,
combining the first doped reaction product with the at least one conjugated polymer in neutral form in a second solvent system to form a second doped reaction product comprising an oxidized form of the conjugated polymer and the anion; wherein doping produces a neutral form of the hole transporting compound.

2. The method of claim 1, wherein the first doped reaction product is in solid form.

3. The method of claim 1, wherein the anion is an arylborate anion.

4. The method of claim 1, wherein the anion is represented by at least one of:

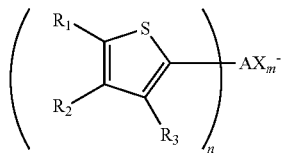

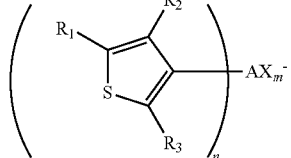

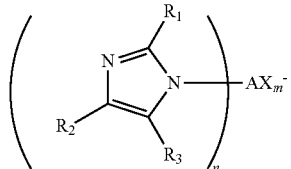

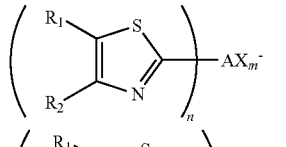

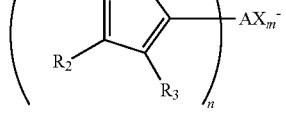

-continued

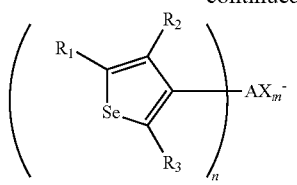

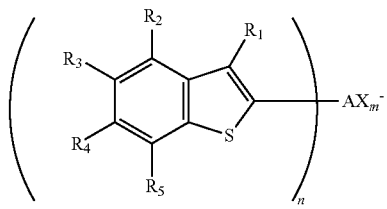

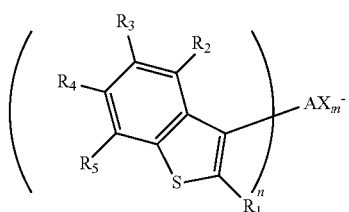

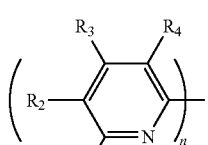

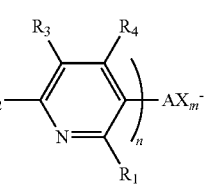

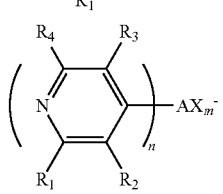

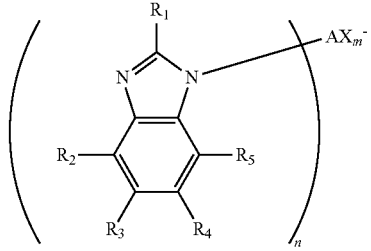

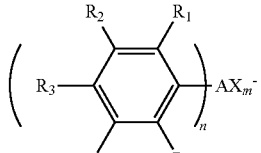

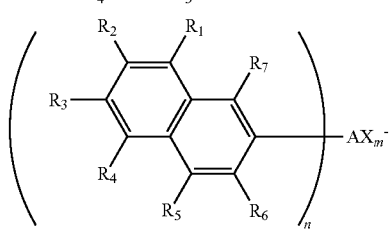

-continued

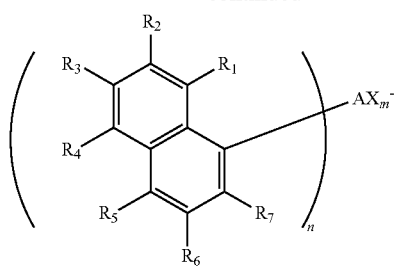
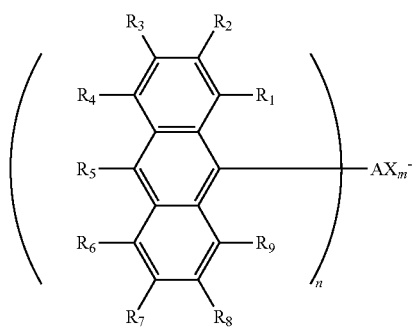
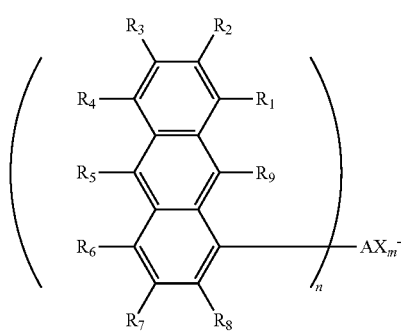
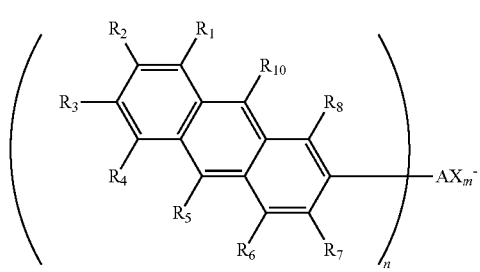
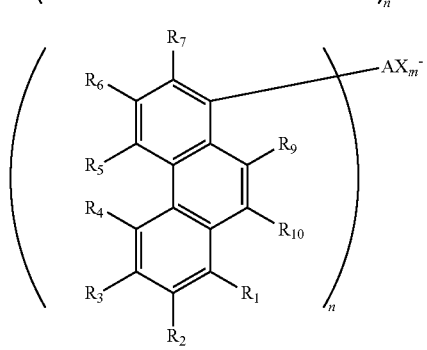

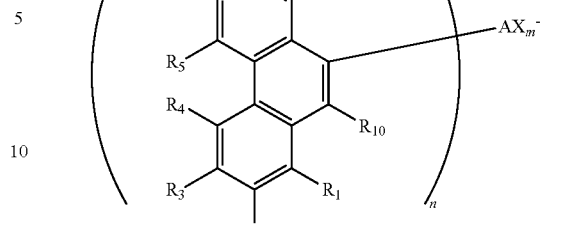
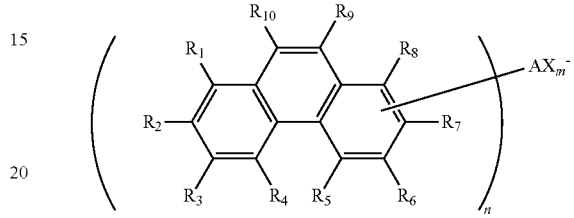
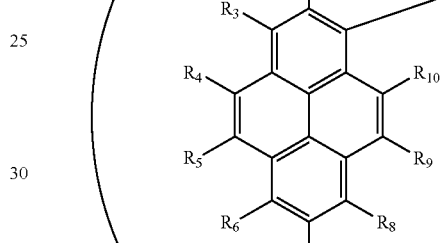
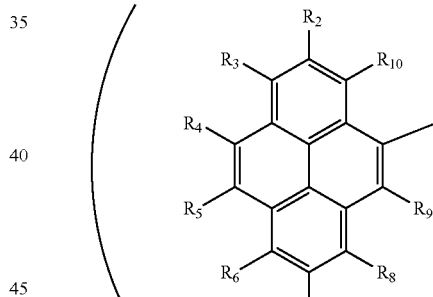
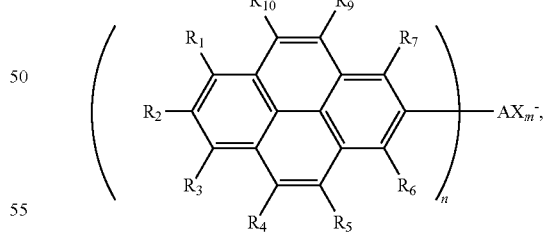

wherein independently, each of $R_1$ to $R_{10}$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, antimony, $SO_3$ or $CO_2$; X is F, Cl, Br, I or CN; n is 0 to 6; and m is ≤6−n.

5. The method of claim 1, wherein the conjugated polymer is a polythiophene.

6. The method of claim 1, wherein the conjugated polymer comprises a regioregular polythiophene.

7. The method of claim 1, wherein the hole transporting compound is 9,9-dimethyl-N2,N7-diphenyl-N2,N7-di-m-tolyl-9H-fluorene-2,7-diamine or $N^1,N^4$-bis(4-methoxyphenyl)-$N^1,N^4$-diphenylbenzene-1,4-diamine.

8. The method of claim 1, wherein the hole transporting compound has a hole mobility of at least about 0.001 cm$^2$/Vs.

9. The method of claim 1, wherein the hole transporting compound has a molecular weight of less than 750 g/mole.

10. The method of claim 1, wherein the hole transporting compound has work function of at least −4.7 eV.

11. The method of claim 1, wherein the hole transporting compound has a work function which is larger than the work function of the conjugated polymer.

12. The method of claim 1, wherein the cation of the ionic dopant is an oxidized species of V, Cr, Mn, Fe, Co, Ni, Cu, Nb, Mo, Tc, Ru, Rh, Pd, Ag, Ta, W, Re, Os, Ir, Pt, or Au; and the anion of the ionic dopant is represented by at least one of the following structures:

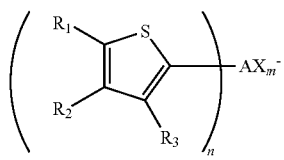
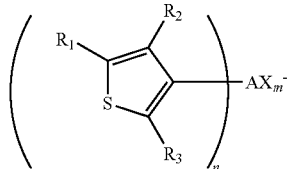
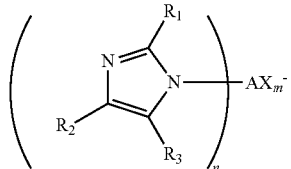
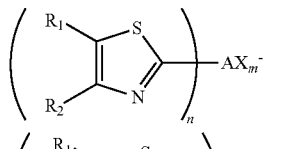
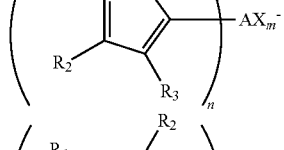
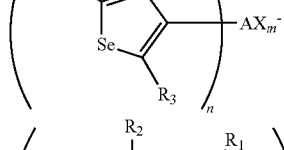
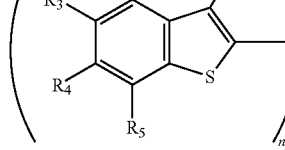

-continued

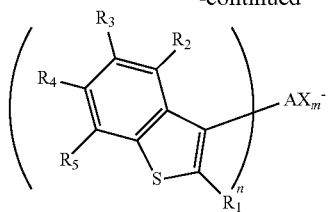
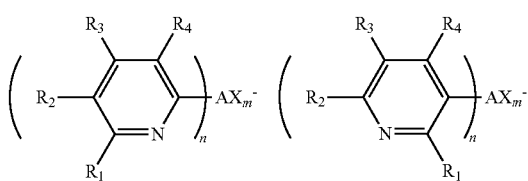
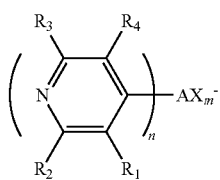
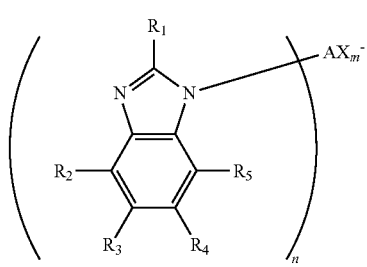
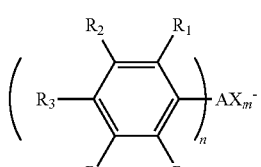
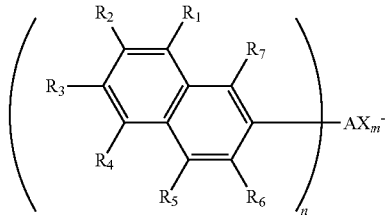
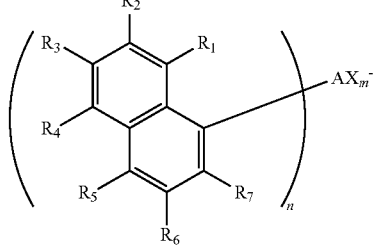

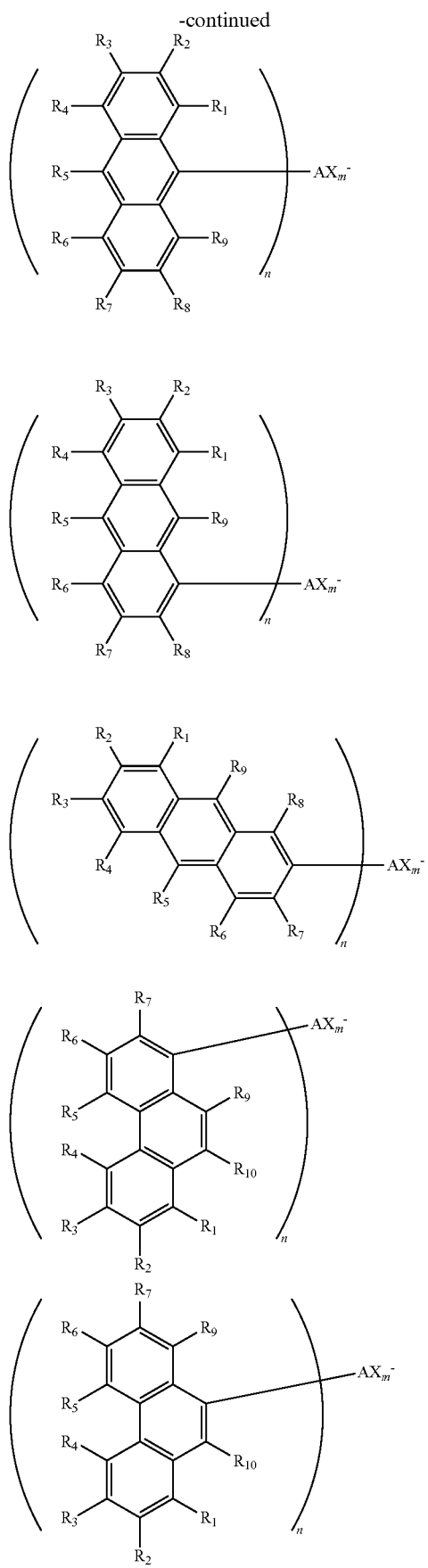
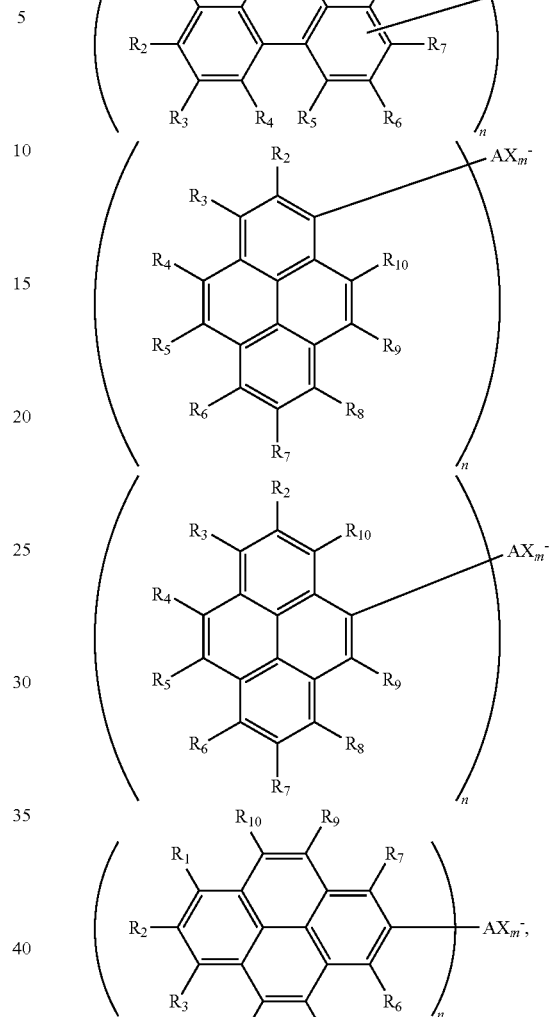

wherein independently, each of $R_1$ to $R_{10}$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, antimony, $SO_3$ or $CO_2$; X is F, Cl, Br, I or CN; n is 0 to 6; and m is ≤6−n.

13. The method of claim 1, wherein the cation is silver.

14. The method of claim 1, wherein the cation is silver and the anion is an arylborate anion.

15. The method of claim 1, wherein the ionic dopant is silver tetrakis(pentafluorophenyl) borate, silver tetrakis(2-(1,3,4,5,6,7-heptafluoro)naphthyl)borate, or a combination thereof.

16. The method of claim 1, wherein the combining of the hole transport compound in neutral form with the at least one cation and at least one anion in a first solvent is carried out at a temperature of less than about 50° C.

17. The method of claim 1, wherein the first solvent system comprises at least 90 wt. % organic solvent.

18. The method of claim 1, wherein the removing the neutral form of the cation comprises removing zero valent metal from the first solution with use of silver powder after forming the first doped reaction product.

19. The method of claim 1, wherein the isolating the first doped reaction product in solid form is carried out with use of halogenated solvent.

20. The method of claim 1, wherein the isolated first doped reaction product has a work function larger, more negative than −4.7 eV.

21. The method of claim 1, wherein the difference in work function between the conjugated polymer and the isolated first doped reaction product is at least 0.3 eV.

22. The method of claim 1, wherein the conjugated polymer comprises at least one polythiophene comprising an alkoxy substituent at either the 3-position, the 4-position or both.

23. The method of claim 1, wherein the conjugated polymer has a number average molecular weight of at least 5,000 g/mole.

24. The method of claim 1, wherein the second solvent system comprises at least one aromatic hydrocarbon solvent and at least one nitrile solvent.

25. The method of claim 1, wherein an ink is formulated from the second doped reaction product, and the ink further comprises at least one matrix material.

26. The method of claim 1, wherein an ink is formulated from the second doped reaction product, and the ink further comprises at least one matrix material comprising at least one copolymer which comprises arylamine side groups and para-hydroxyphenyl side groups.

27. The method of claim 1, wherein an ink is formulated from the second doped reaction product, and the ink further comprises at least one matrix material comprising at least one copolymer which comprises fused aromatic side groups and para-hydroxyphenyl side groups.

28. The method of claim 1, wherein the cation is silver, and wherein the amount of silver in the first doped reaction product is less than 500 ppm.

29. The method of claim 1, wherein the ionic dopant is a silver arylborate dopant and the conjugated polymer is a polythiophene.

30. The method of claim 1, wherein, the ionic dopant is a silver arylborate dopant, and the conjugated polymer is a poly(alkoxythiophene), and wherein the work function of the isolated first doped reaction product is larger, more negative than the work function of the conjugated polymer.

31. A method, comprising:
providing at least one hole transporting compound which has a neutral form and an oxidized form, wherein the hole transporting compound is an arylamine compound,
providing at least one ionic dopant comprising a cation and an anion,
combining the at least one hole transporting compound in a neutral form with the at least one ionic dopant comprising at least one cation and at least one anion in a first solvent system to provide a first doped reaction product, wherein the combination produces a neutral form of the cation, and wherein the first doped reaction product comprises an oxidized form of the hole transporting compound and the anion;
isolating the first doped reaction product in solid form, including removing the neutral form of the cation from the first doped reaction product;
providing at least one conjugated polymer comprising a poly(alkoxythiophene) which has a neutral form and an oxidized form,
combining the isolated first doped reaction product with the at least one conjugated polymer in neutral form in a second solvent system to form a second doped reaction product comprising an oxidized form of the conjugated polymer and the anion; wherein doping produces a neutral form of the hole transporting compound, and
wherein a first work function of the hole transport compound is more negative than the work function of the conjugated polymer.

32. The method of claim 31, wherein the first work function and the second work function are different by at least 1 eV.

33. The method of claim 31, wherein the hole transporting compound does not comprise alkoxy substituents.

34. The method of claim 31, wherein the anion is an arylborate anion.

35. The method of claim 31, wherein the cation is silver.

* * * * *